(12) United States Patent
Suh et al.

(10) Patent No.: US 8,080,149 B2
(45) Date of Patent: *Dec. 20, 2011

(54) MATERIAL AND DEVICE PROPERTIES MODIFICATION BY ELECTROCHEMICAL CHARGE INJECTION IN THE ABSENCE OF CONTACTING ELECTROLYTE FOR EITHER LOCAL SPATIAL OR FINAL STATES

(75) Inventors: Dong-Seok Suh, Seoul (KR); Ray Henry Baughman, Dallas, TX (US); Anvar Abdulahadovic Zakhidov, Richardson, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 1468 days.

This patent is subject to a terminal disclaimer.

(21) Appl. No.: 11/580,401

(22) Filed: Oct. 13, 2006

(65) Prior Publication Data
US 2010/0300893 A1    Dec. 2, 2010

Related U.S. Application Data

(62) Division of application No. 10/591,730, filed as application No. PCT/US2005/007084 on Mar. 4, 2005.

(60) Provisional application No. 60/550,289, filed on Mar. 5, 2004.

(51) Int. Cl.
G02B 6/26 (2006.01)

(52) U.S. Cl. ...................................... 205/688

(58) Field of Classification Search ............... 205/688, 205/701
See application file for complete search history.

(56) References Cited

U.S. PATENT DOCUMENTS

| 4,585,652 | A | 4/1986 | Miller et al. |
|---|---|---|---|
| 5,079,674 | A | 1/1992 | Malaspina |
| 5,429,893 | A | 7/1995 | Thomas |
| 5,518,836 | A | 5/1996 | McCullough |
| 5,705,259 | A | 1/1998 | Mrotek et al. |
| 6,261,469 | B1 | 7/2001 | Zakhidov et al. |

(Continued)

FOREIGN PATENT DOCUMENTS
WO    WO 2004/009884    1/2004

OTHER PUBLICATIONS

United States International Searching Authority; International Search Report; Apr. 11, 2006; US.

(Continued)

*Primary Examiner* — Arun S Phasge
(74) *Attorney, Agent, or Firm* — Ross Spencer Garsson; Matheson Keys Garsson & Kordzik

(57) ABSTRACT

In some embodiments, the present invention is directed to processes for the combination of injecting charge in a material electrochemically via non-faradaic (double-layer) charging, and retaining this charge and associated desirable properties changes when the electrolyte is removed. The present invention is also directed to compositions and applications using material property changes that are induced electrochemically by double-layer charging and retained during subsequent electrolyte removal. In some embodiments, the present invention provides reversible processes for electrochemically injecting charge into material that is not in direct contact with an electrolyte. Additionally, in some embodiments, the present invention is directed to devices and other material applications that use properties changes resulting from reversible electrochemical charge injection in the absence of an electrolyte.

6 Claims, 29 Drawing Sheets

U.S. PATENT DOCUMENTS

| | | | |
|---|---|---|---|
| 6,493,210 B2 | 12/2002 | Nonaka et al. | |
| 6,555,945 B1 | 4/2003 | Baughman et al. | |
| 6,795,293 B2 | 9/2004 | Timonov et al. | |
| 7,061,749 B2 | 6/2006 | Liu et al. | |
| 7,167,355 B2 | 1/2007 | Chen | |
| 7,541,715 B2 | 6/2009 | Chiang et al. | |
| 7,897,030 B2 * | 3/2011 | Suh et al. | 205/688 |
| 2003/0011965 A1 | 1/2003 | Shiue et al. | |
| 2003/0116753 A1 | 6/2003 | Norley et al. | |
| 2003/0211637 A1 | 11/2003 | Schoeniger et al. | |

OTHER PUBLICATIONS

Arepalli, et al; "Carbon-Nanotube-Based Electro-chemical Double-Layer Capacitor Technologies for Spaceflight Applications"; JOM, Dec. 2005; pp. 26-31.

Frackowiak, E., et al; "Carbon Materials for the Electrochemical Storage of Energy in Capacitors"; Carbon; Jul. 2000; pp. 937-950.

Hughes, M., et al,; Electrochemical Capacitance of a Nanoporous Composite of Carbon Nanotubes and Polypyrrole; Chemical Materials, vol. 14, Feb. 2002; pp. 1610-1613.

Khomenko, V., et al; Dermination of the Specific Capacitance of Conducting Polymer/Nanotubes Composite Electrodes using Different Cell Configurations; Electrochemica Acta, vol. 50, Dec. 2004; pp. 2499-2506.

Lewis, T.D.; "Interfaces are the Dominant Feature of Dielectrics at the Nanometric Level"; IEEE Transactions on Dielectrics and Electrical Insulation, vol. 11, No. 5; Oct. 2004; pp. 739-753.

Sung, et al.; "Fabrication of all-solid-state Electrochem-ical Microcapacitors"; Journal of Power Sources, vol. 133; Apr. 2004; pp. 312-319.

Alberti, G. et al, "Solid State Protonic Conductors, Present Main Applications and Future Prospects"; Solid State Ionics, vol. 145, pp. 3-16; Dec. 1, 2001; Elsevier Science; NL.

Alberti, G. et al., "Polymeric Proton Conducting Membranes for Medium Temperature Fuel Cells (110-160° C.)"; J of Membrane Sci; vol. 185, pp. 73-81; Apr. 15, 2001; Elsevier Science; NL.

An, K.H. et al., "Electrochemical Properties of High-Power Supercapacitors Using Single-Walled Carbon Na-notube Electrodes" Advanced Functional Materials; vol. 11, pp. 387-392; May 1, 2001; John Wiley & Sons, Inc.; US.

Antonucci, P.L. et al., "Investigation of a direct methanol fuel cell based on a composites Nafion®-silica electgrolyte for high temperature operation;"; Solid State Ionics vol. 125, no month 1999; pp. 431-437; Elsevier Science B.V.; Amsterdam, The Netherlands.

Asamitsu, A; et al., "Current switching of resistive states in magnetroesistive manganites"; Nature vol. 388, No. 6637; Jul. 3, 1997, pp. 50-52; Nature Publishing Group; Macmillan Publishers Ltd.; US.

Bachilo, S.M. et al; "Narrow (n.m)—Distribution of Single-Walled Carbon Nanotubes Grown Using a Solid Suported Catalyst" J|A|C|S Communications; vol. 125, pp. 11186-11187; Aug. 21, 2003; Journal of the American Chemical Society , US.

Barisci, J.N. et al., "Increased Actuation Rate of Electromechanical Carbon Nanotube Actuators Using Potential Pulses with Resistance Compensation"; Journal of Smart Materials and Structures, vol. 12, Jun. 25, 2003; pp. 549-555, Institute of Physics Publishing; US.

Baughman, R.H. "Muscles Made from Metals"; Science 300, Apr. 11, 2003; pp. 268-269; American Association for the Advancement of Science, Washington, DC; US.

Baughman, R.H. et al, "Carbon Nanotubes—The Route Towards Applications"; Science 297, Aug. 2, 2002; pp. 787-792; American Association for the Advancement of Science, Washington, DC; US.

Baughman, R.H., "Carbon Nanotube Actuators"; Science 284, May 21, 1999; pp. 1340-1344; American Association for the Advancement of Science, Wash-ington, DC; US.

Baughman, R.H., "Conducting Polymer Artificial Muscles"; Synthetic Metals 78, no month, 1996, pp. 339-353; Elsevier Science B.V.; Amsterdam, The Netherlands.

Bower, C. et al., "Plasma-induced alignment of carbon nanotubes"; Applied Physics Letters, vol. 77, No. 6; Aug. 7, 2000; pp. 830-832; American Institute of Physics; US.

Bozkurt, A. et al., Proton-conducting polymer elec-trolytes based on phosphoric acid; Solid Sate Ionics 125, no month, 1999; pp. 225-233; Elsevier Science B.V.; Amsterdam, The Netherlands.

Burgmayer, et al., "Ion Gate Electrodes, Polypyrrole as a Switchable Ion Conductor Membrane"; Journal of Physical Chemistry, vol. 88, Jun. 1984; pp. 2515-2521; American Chemical Society; US.

Campbell, J.K. et al., "Electrochemistry Using Single Carbon Nanotubes"; J. Am. Chem. Soc.; vol. 121(15); Apr. 2, 1999; pp. 3779-3780; American Chemical Society.

Cassell, A.M. et al., "Combinatorial chips for optimiz-ing the growth and integration of carbon nanofiber based devices"; Nanotechnology B15, Nov. 10, 2003; pp. 9-15; Institute of Physics Publishing; IOP Publishing Ltd.; UK.

Cassell, A.M. et al., "Combinatorial Optimization of Heterogeneous Catalysts Used in the Growth of Carbon Nanotubes"; Langmuir 17; Nov. 18, 2000; pp. 260-264; American Chemical Society.

Che, G. et al., "Carbon Nanotube Membranes for Elec-trochemical Energy Storage and Production"; Nature 393; May 28, 1998, pp. 346-349; Nature Publishing Group, Macmillan Publishers Ltd; US.

Choi, Y.S. et al, "An under-gate triode structure field emission display with carbon nanotube emitters"; Di-amond and Related Materials 10; pp. 1705-1708; no month, 2001; Elsevier Science B.V.; Amsterdam, The Netherlands.

Collins, P. et al., "Engineering Carbon Nanotubes and Nanotube Circuits Using Electrical Breakdown"; Science 292, pp. 706-709; Apr. 27, 2001; American Association for the Advancement of Science, Washington, DC; US.

Dai, Hongjie; "Carbon Nanotubes: Synthesis, Integra-tion, and Properties" Accounts Chemical Research 35, pp. 1035-1044; Aug. 7, 2002; American Chemical Society, US.

Duan, et al, "General Synthesis of Compound Semicon-ductor Nanowires"; Advanced Materials vol. 12, No. 4; pp. 298-302; no month, 2000WILEY-VCH Verlag Gmbh; DE.

Duesberg, G.S. et al., "Growth of Isolated Carbon Nanotubes with Lithographically Defined Diameter and Location"; Nano Letters vol. 3, No. 2; pp. 257-259; Jan. 25, 2003; American Chemical Society, US.

Ekimov, E.A. et al., :Superconductivity in Diamond; Nature, vol. 428,, pp. 542-545; Apr. 1, 2004; Nature Pub-lishing Group; Macmillan Publishers Ltd.; US.

Erlebacker, J. et al., "Evolution of nanoporosity in Dealloying"; Nature, vol. 410, pp. 450-453; Mar. 22, 2001; Nature Publishing Group; Macmillan Publishing Ltd.; US.

Fan, S. et al., :Self-Oriented Regular Arrays of Carbon Nanotubes and Their Field Emission Properties; Science, vol. 283, pp. 512-514 ; Jan. 22, 1999; American As-sociation for the Advancement of Science; US.

Fiebig, M., et al., "Visualization of the Local Insulator-Metal Transition in Pr0.7Ca0.3MnO3"; Science, vol. 280 pp. 1925-1928; Jun. 19, 1998; American Association for the Advancement of Science; US.

Gangloff, L., et al., "Self-Aligned, Gated Arrays of Individual Nanotube and Nanowire Emitters"; Nano Letters, vol. 4, pp. 1575-1579; Jul. 29, 2004; American Chemical Society; US.

Gates et al., "A Solution-Phase Approach to the Syn-thesis of Uniform Nanowires of Crystalline Selenium with Lateral Dimensions in the Range of 10-30 nm"; J. Am. Chem. Soc. 122, pp. 12582-12583; Dec. 1, 2000; American Chemical Society; US.

Gofer, Y. et al., "An all-polymer charge storage device"; Applied Physics Letters 71, pp. 1582-1584; Sep. 15, 1997; American Institute of Physics; US.

Goldberger, J. et al.; "Single-crystal gallium nitride nanotubes"; Nature vol. 422, pp. 599-602; Apr. 10, 2003; Nature Publishing Group; Macmillan Publishers Ltd.; US.

Gu, G. et al., "V[sub]2O[sub]5 nanofibre sheet actuators"; Nature Materials vol. 2, pp. 316-319; Apr. 20, 2003; Nature Publishing Group; Macmillan Publishers Ltd.; US.

Haddon, R.C. et al., "Purification and Separation of Carbon Nanotubes"; MRS Bulletin vol. 29, pp. 252-259; Apr. 2004; Material Research Society; US.

Hafner, J.H. et al., "Growth of nanotubes for probe microscopy tips"; Nature vol. 398, pp. 761-762; Apr. 29, 1999; Nature Publishing Group; Macmillan Publishers Ltd.; US.

Hafner, J.H. et al., "High-Yield Assembly of Individual Single-Walled Carbon Nanotube Tips for Scanning Probe Microscopies"; Journal of Physical Chem. vol. 105, No. 4, pp. 743-746; Feb. 1, 2001, American Chemical Society; US.

Hsiou, Y.F. et al., "Controlled placement and electrical contact properties of individual multiwalled carbon nanotubes on patterned silicon chips"; Applied Physics Letters vol. 84, No. 6; pp. 984-986; American Institute of Physics; US.

Huang, M.H. et al., "Room-Temperature Ultraviolet Nanowire Nanolasers"; Science 292, pp. 1897-1899; Jun. 8, 2001; American Association for the Advancement of Science; US.

Huang, S. et al., "Growth of Millimeter-Long and Ho-rizontally Aligned Single-Walled Carbon Nanotubes on Flat Substrates"; J. Am. Chem. Soc. vol. 125, pp. 5636; Apr. 22, 2003; American Chemical Society; US.

Javey, A. et al., "Carbon Nanotube Transistor Arrays for Multistage Complimentary Logic and Ring Oscilla-tors"; Nano Letters, vol. 2 No. 9; pp. 929-932; Jul. 31, 2002; American Chemical Society; US.

Jörissan, L. et al., "New Membranes for direct metha-nol fuel cells"; J. Power Sources vol. 105, pp. 267-273; Elsevier Science B.V.; NL.

Kameoka, J. et al. "A scanning tip electrospinning source for deposition of oriented nanofibres"; Nanotech-nology 14, pp. 1124-1129; Sep. 5, 2003; Institute of Physics Publishing; UK.

Kim, P. et al., "Thermal Transport Measurements of In-dividual Multiwalled Nanotubes"; Phys. Rev. Letters vol. 87, No. 21; pp. 215502-1 to 215502-4; Nov. 19, 2001; The American Physical Society; US.

Kiryukhin, V., et al., "An X-ray-induced insulator-metal transition in a magnetoresistive manganite"; Nature vol. 386, pp. 813-815; Apr. 24, 1997; Nature Publishing Group; Macmillan Publishers Ltd.; US.

Krüger, M, "Electrochemical carbon nanotube field-effect transistor"; Applied Physics Letters vol. 78, No. 9; pp. 1291-1293; Feb. 26, 2001; American Institute of Physics; US.

Krupke, R. et al., "Simultaneous Deposition of Metallic Bundles of Single-walled Carbon Nanotubes Using Acdielectrohoreses"; Nano Letters vol. 3, No. 8 pp. 1019-1023; Jul. 9, 2003; American Chemical Society; US.

Li, B. et al.; "Raman spectral study of silicon nanowires"; Physical Review B; vol. 59, No. 3; pp. 645-1648; Jan. 15, 1999; the American Physical Society; US.

Li, J. et al., "Novel Three-Dimensional Electrodes: Elec-trochemical Properties of Carbon Nanotube Ensembles" J. Phys. Chem. B. 106,; pp. 9299-9305; Aug. 16, 2002; American Chemical Society; US.

Li, W. et al.; "Preparation and Characterization of Multi-walled Carbon Nanotube-Supported Platinum for Ca-thode Catalysts of Direct Methanol Fuel Cells"; J. Phys. Chem. B 107; pp. 6292-6299; Jun. 6, 2003; American Chemical Society; US.

Li, Y. et al.; "Bismuth Nanotubes: A Rational Low-Temperature Synthetic Route"; J. Am. Chem. Soc. 123; pp. 9904-9905; Sep. 14, 2001; American Chemical Society; US.

Lin, C.L. et al., "Protoinduced hole-doping effect in $(Y[sub]0.5)Ba[sub]2Cu[sub]3O[sub]^8$ films"; Applied Physics Letters 71, pp. 3284-3286; Dec. 1, 1997; American Institute of Physics; US.

Brabec, C. et al, editors: "Organic Photovoltaics: Con-cepts and Realization"; Springer Series in Materials Science vol. 60, no month, 2003; Springer-Verlag; DE.

Delzeit, L., et al., "Growth of multiwall carbon nano-tubes in an inductively coupled plasma reactor"; J. Appl. Letters, vol. 91, No. 9; May 1, 2001; pp. 6027-6033; American Institute of Physics; US.

Ding, E.G. et al., "Nanofabrication of Organic/Inorganic Hybrids of $TiO_2$ with Substituted Phthalocyanine or Polythiophene"; (abstract only); Journal of Nanoscience and Nanotechnology 1; No. 2; pp. 207-213; Jun. 2001; American Scientific Publishers; US.

Han, J.H., "Growth characteristics of carbon nanotubes using platinum catalyst by plasma enhanced chemical vapor deposition"; (abstract only); Diamond and Related Materials, vol. 12, pp. 878-883; Jul. 2003; Elsevier Science B.V.; NL.

Kinaret, J.M., et al.; "A carbon-nanotube-based nano-relay"; Applied Physics Letters; vol. 82, No. 8; Feb. 24, 2003; pp. 1287-1289; American Institute of Physics; US.

Liu, J. et al., "Recent Advances in Methods of Forming Carbon Nanotubes"; MRS Bulletin 29, pp. 244-250; Apr. 2004; Material Research Society; US.

Mannhart, J. et al; "Large electric field effects in $YBa_2Cu_3O_7$-code 67 films containing weak links"; Applied Physics Letters 62, pp. 630-633; Feb. 8, 1993; Amer-ican Institute of Physics; US.

Liu, S.Q. et. al.; "Electric-pulse-induced reversible resis-tance change effect in magnetoresistive films"; Appl. Phys. Lett. vol. 76, No. 19; pp. 2749-2251; May 8, 2000; American Institute of Physics, US.

Loo, C.L. et al.; "Nanoschell-enables Photonics-Based Imaging and Therapy of Cancer"; Technology in Cancer Research & Treatment vol. 3, No. 1, pp. 33-40; Feb. 2004; Adenine Press; US.

Mannhart, J. et al; "Large electric field effects in $YBa_2Cu_3O_7$- code 67 films containing weak links"; Applied Physics Letters 62, pp. 630-633; Feb. 8, 1993; Amer-ican Institute of Physics; US.

Mayer, B.T. et al.; "Sonochemical Synthesis of Trígon-al Selenium Nanowires"; Chemistry of Materials 15; pp. 3852-3858; Aug. 19, 2003; American Chemical Socie-ty; US.

Mickelson, et al.; "Packing C60 in Boron Nitride Na-notubes"; Science 300, pp. 467-469; Apr. 18, 2003; American Association for the Advancement of Science, Washington, DC; US.

Millis, A.J., "Lattice effects in magnetoresistive man-ganese perovskites"; Nature vol. 392, pp. 147-151; Mar. 12, 1998; Nature Publishing Group; Macmillan Publishers Ltd.; US.

Misewich, J.A. et al.; "Electrically Induced Optical Emission from a Carbon Nanotube FET"; Science vol. 300, pp. 783-786; May 2, 2003; American Association for the Advancement of Science, Washington, DC; US.

Miyano, K., et al.; "Photoinduced Insulator-to-Metal Transition in a Perovskite Manganite"; Phys. Rev. Let-ters, vol. 78, No. 22; pp. 4257-4260; Jun. 2, 1997; Amer-ican Physical Society; US.

Mohanan, J.L., et al; "Porous Semiconductor Chalco-genide Aerogels"; Science vol. 307, 397-399; Jan. 21, 2005; American Asso-ciation for the Advancement of Science, Washington, DC; US.

Morimoto, Y. et al; "Pressure effects on charge-ordering transitions in Perovskite manganites": Physical Review B, vol. 55, No. 12; Mar. 15, 1997; The American Physical Society; US.

Moratti; S.; "The Chemistry of Uses of polyphenyle-nevinylenes"; ; Handbook of Conducting Polymers; 2nd Ed., Chapter 13; pp. 343-361; Marcel Dekker, New York, 1998.

Niu, C. et al.; "High power electrochemical capacitors based on carbon nanotube electrodes"; Appl. Phys. Let-ters, vol. 70; pp. 1480-1482; Mar. 17, 1997; American Institute of Physics; US.

Norby, T. "Solid-state protonic conductors: principles, properties, progress and prospects"; Solid Sate Ionics 125, pp. 1-11; no month, 1999; Elsevier Science B.V.; Amsterdam, The Netherlands.

Rajesh, B. et al; "Pt-WO3 supported on carbon nano-tubes as possible anodes for direct methanol fuel cells"; Fuel 81, pp. 2177-2190; Jul. 9, 2002; Elsevier Science B.V.; Amsterdam, The Netherlands.

Reneker, D.H. et al.; "Nanometre diameter fibres of polymer, produced by electrospinning"; Nanotechnology 7, pp. 216-223; no month, 1996; IOP Publishing; UK.

Rinzler, A.G. et al.; "Large-scale purification of single-wall carbon nanotubes: process, product, and charac-terization"; Appl. Phys. A 67, pp. 29-37; no month, 1998; Springer-Verlag; DE.

Sakai, J. et. al.; "Switching effect perpendicular to the plane of Pr0.5Ca0.5MnO3-y thin films"; J. Appl. Phys. vol. 90, No. 3; pp. 1410-1413; Aug. 1, 2001; American In-stitute of Physics; US.

Saliger, et al.; "High surface area carbon aerogels for supercapaci-tors"; Journal of Non-Crystalline Solids 225, pp. 81-85; no month 1998; Elsevier Science B.V.; Ams-terdam, The Netherlands.

Schinohara, H. et al.; "Electrically Stimulated Re-lease of Neurotransmitter from a Conducting Polymer Thin Film on the Model of a Synapse": Chemistry Let-ters, pp. 179-182; no month, 1985: The Chemical Society of Japan: JP.

Schlüter; A.; "Synthesis of Poly(para-phenylene)s"; Handbook of Conducting Polymers; 2nd Ed.; Chapter 8; pp. 209-224; Marcel Dekker, New York, 1998.

Shirakawa, H; "Synthesis of Polyacetylene"; Hand-book of Conduct-ing Polymers; 2nd Ed., Chapter 7; pp. 198-207; Marcel Dekker, New York, 1998.

Sloan, J. et al.; "Crystallisation inside fullerene related structures"; J. Materials Chemistry 7, pp. 1089-1095; no month, 1997; Royal Soci-ety of Chemistry, London, GB.

Soundarrajan. P. et al; "Surface modification of aligned carbon nanotube arrays for electrochemical sens-ing applications"; in J. Vac. Sci. Technology A 21, pp. 1198-1201; Jul./Aug. 2003; American Vacuum Society; US.

Stroll, M. et al.,; "Electrochemical and Raman mea-surements on single-walled carbon nanotubes"; Chemical Physics Letters 375; pp. 625-631; no month, 2003; Elsevier Science B.V.; Amsterdam, The Netherlands.

Sun, X. et al.; "Composite electrodes made of Pt nano-particles deposited on carbon nanotubes grown on fuel cell backings"; Chemical Physics Letters 379; pp. 99-104; no month, 2003; Elsevier Science B.V.; Amsterdam, The Netherlands.

Tomioka, Y. et al.; "Magnetic-field-induced metal-insulator phenomena in PrI-xCaxMnO3 with controlled charge-ordering instability"; Phys. Rev. B vol. 83, No. 4; pp. R1689-R1692; Jan. 15, 1996; American Physical Society; US.

Tsiakaris, P.E., et al., "The oxidation of ethanol over Pt catalyst-electrodes deposited on Zro[sub]2"; abstract only; Solid State Ionics 152-153, 721-726 (2002) Elsevier Science B.V.; Amsterdam, The Netherlands.

Velev, O.D. et al.; "A class of porous metallic nano-structures"; Nature vol. 401, p. 548; Oct. 7, 1999; Nature Publishing Group; Macmillan Publishers Ltd.; US.

Vrbanić, D. et al; "Air-stable Monodispersed Mo6S3I6 nanowires"; Nanotechnology 15, pp. 635-638; no month, 2004; Institute of Physics Publishing; US.

Walters, D.A. et al; "Elastic strain of freely suspended single-wall carbon nanotube ropes"; Applied Physics Letters vol. 74 No. 25; pp. 3803-3805; Jun. 21, 1999; American Institute of Physics; US.

Wang, C. et al.; "Proton Exchange Membrane Fuel Cells with Carbon Nanotube Based Electrodes"; Nano Letters vol. 4, No. 2; pp. 345-348; Dec. 30, 1993; American Chemical Society; US.

Wang, J et al.; "Morphological Effectson the Electrical and Electrochemical Properties of Carbon Aerogels"; Journal of the Electrochemical Society 148, pp. D75-D77; no month, 2001; The Electrochemical Society, Inc.; US.

Weissmuller, J. et al. in Science 300, pp. 312-315; Apr. 11, 2003; American Association for the Advance-ment of Science, Washington, DC; US.

Wu, Y. et al.; "Single Crystalline Nanowires of Lead Can Be synthesized through Thermal Decomposition of Lead Acetate in Ethylene Glycol"; Nano Letters vol. 3, No. 8; pp. 1163-1166; Jun. 26, 2003; American Chemical Society; US.

Wu, Y. et al.; "Superconducting MgB2 Nanowires"; Ad-vanced Materials 13, No. 19; pp. 1487-1489; Oct. 2, 2001; Wiley-VCH, Verlag GmbH & Co. KgaA, Wein-heim, Germany.

Xi, X. et al.; "Electric field effect in high Tc supercon-ducting ultrathin YBa2Cu3O7-x films"; Applied Physics Letters 59 (26); pp. 3470-3472; Dec. 23, 1991; American Institute of Physics; US.

Xu, L. et al; "Synthesis and Magnetic Behavior of Peri-odic Nickel Sphere Arrays"; Advanced Materials 15, pp. 1562-1564; Sep. 2003; Wiley-VCH, Verlag GmbH & Co. KgaA; DE.

Xu, L. et al.; "Metal Sphere Photonic Crystals by Nano-molding"; J. Am. Chem. Soc. 123, pp. 763-764; Jan. 9, 2001; American Chemical Society; US.

Yu, G. et al.; "Polymer Photovoltaic Cells, enhanced Efficiencies via a Network on Internal Donor-Acceptor Heterojunctions"; Science 270, pp. 1789-1791; Dec. 15, 1995; American Association for the Advancement of Science, Washington, DC; US.

Yu, J.-S. et al.; "Fabrication of Ordered Uniform Porous Carbon Networks and Their Applications to a Catalyst Supporter"; J. Am. Chem. Society 124, pp. 9382-9383; Jul. 19, 2002; American Chemical Society; US.

Zakhidov, A. et al.; "Carbon Structures with Three-Dimensional Periodicity at Optical Wavelengths"; Science 282: pp. 897-901: Oct. 30, 1998; American Association for the Advancement of Science, Washing-ton, DC; US.

Zhang, S.S. et al.; "A Novel Electrolyte Solvent for Rechargeable Lithium and Lithium-Ion Batteries"; J. Electrochemical Society, vol. 143, No. 12; pp. 4047-4053; Dec. 1996; The Electrochemical Society, Inc.; US.

Zhang, Y. et al., "Electric-field-directed growth of aligned single-walled carbon nanotubes"; Applied Physics Letters 79, 3155-3157; Nov. 5, 2001; American Institute of Physics; US.

* cited by examiner

MATERIAL AND DEVICE PROPERTIES MODIFICATION BY ELECTROCHEMICAL CHARGE INJECTION IN THE ABSENCE OF CONTACTING ELECTROLYTE FOR EITHER LOCAL SPATIAL OR FINAL STATES

CROSS REFERENCE TO RELATED APPLICATIONS

This application is a divisional of U.S. application Ser. No. 10/591,730 filed Feb. 26,2007, which entered the U.S. National Phase on Sep. 1, 2006, by inventors, D. Suh, R. Baughman and A. Zakhidor, which is a 371 US National Phase of PCT/US2005/007084 filed on 4 Mar. 2005, which claims priority to U.S. Provisional Application Ser. No. 60/550,289 filed on 05 Mar. 2004.

This application is also related to co-divisional U.S. application Ser. Nos. 11/580,400, 11/580,361, 11/580,362, 11/580,397, and 11/580,674, all filed concurrently on Oct. 13, 2006, by the same inventors. These applications are incorporated herein by reference.

This invention was made with partial Government support under Contract No. MDA972-02-C-0044 awarded by the Defense Advanced Research Projects Agency. The Government has certain rights in this invention.

FIELD OF THE INVENTION

This invention relates to tuning the electronic, magnetic, and optical properties of materials and devices by non-faradaic electrochemical charge injection, wherein such tuned properties are developed either in the presence or absence of contacting electrolyte, and necessarily maintained in the absence of directly contacting electrolyte.

BACKGROUND OF THE INVENTION

It is well known that charge injection can change the magnetic, electronic and optical properties of materials. Prior-art methods for changing these material properties by charge injection either (1) involve electrostatic gate-based charge injection across a dielectric (so charge injection is limited by dielectric breakdown), (2) use an electrolyte that contacts the transformed material (thereby limiting device applicability), or (3) use dopant intercalation (thereby limiting applicable materials and providing problematic structural changes). These three methods are called dielectric-based charge injection, non-faradaic electrochemical charge injection, and faradaic electrochemical charge injection, respectively.

Dielectric-based charge injection is used for field effect transistor (FET) devices that are critical for both today's electronic circuits and those proposed for the future. In these FET transistor devices, current is carried through a semiconductor channel between source and drain electrodes. The current through this semiconductor (channel) is controlled by charge injection into the semiconductor channel by application of a voltage between the source electrode and the gate electrode, which is separated from the semiconductor channel by a dielectric. This charge injection is that of an ordinary dielectric capacitor, so the amount of charge injection that can be achieved is limited by the breakdown strength of the dielectric. While enormously useful for submicroscopic electronic devices, this dielectric-based charge injection is unsuitable for macroscopic charge injection in materials having macroscopic external dimensions. X. Xi et al., (Applied Physics Letters 59 3470 (1991)) have demonstrated dielectric-based switching of the superconducting transition temperature ($T_c$) of films of $YBa_2Cu_3O_{7-x}$ over a 2 K range. The achieved resistance modulation in the normal state can be as much as 20% in the normal state and 1500% near $T_c$. Using a similar method of dielectric-based charge injection in the oxygen deficient $YBa_2Cu_3O_{7-x}$ superconductor, J. Mannhart et al. (Applied Physics Letters 62, 630 (1993)) demonstrated that $T_c$ can be changed by up to 10 K. However, the dielectric-based method of $T_c$ switching used by Xi et al. and by J. Mannhart at al. is not applicable for a macroscopically thick superconducting material. In addition, J. A. Misewich et al. (Science 300, 783-786 (2003)) have used dielectric-based charge injection to make an electrically driven light source from a single nanotube. Also, Y. S. Choi et al. (Diamond and Related Materials 10, 1705-1708 (2001)) have used under-gate dielectric-based charge injection to modulate electron emission for field emission displays, but find disadvantage in this application as a result of field-induced electron beam spreading and restrictions on the anode voltage.

Non-faradaic electrochemical charge injection uses nano-structured materials having very high surface area and is applicable for materials ranging from nanoscale materials to bulk materials. However, unless the material is a metal or metal oxide catalyst, the electrolyte is a ceramic held at high temperatures (P. E. Tsiakaris, et al., Solid State Ionics 152-153, 721-726 (2002)) prior-art technologies teach that this charge injection can only be accomplished by developing and maintaining contact of the electrolyte with regions of the material where charge injection is desired, which for macroscopic nanoporous materials includes internal surfaces. In other words, the prior art teaches that non-faradaic electrochemical charge injection into non-catalytic materials generally requires maintained contact of that material with the electrolyte. This non-faradaic electrochemical charge injection has been used to provide electrochemical electromechanical actuators (artificial muscles, see R. H. Baughman et al., Science 284, 1340 (1999), R. H. Baughman et al., U.S. Pat. No. 6,555,945) and liquid-ion-gated FETs (field-effect transistors, see M. Krüger, Applied Physics Letters 78, 1291-1293 (2001)). However, the maintained contact between the electrode (including both internal and external surfaces) and the electrolyte limits applicability of prior-art methods of non-faradaic electrochemical charge injection. For example, the surrounding electrolyte for the above described liquid-ion-gated FETs limits their applicability for gas state sensing—since a sensed gas must first dissolve in the electrolyte before it can be detected, which decreases both device response rate and sensitivity and limits detection capabilities to gases that can significantly dissolve in the electrolyte. In addition, non-faradaic electrochemical charge injection provides the basis for supercapacitors having much larger charge storage capabilities than ordinary dielectric supercapacitors. In the prior art (K. H. An et al., Adv. Funct. Mater. 11, 387 (2001) and C. Niu et al., Appl. Phys. Lett. 70, 1480 (1997)) these supercapacitors are kept in the charged state as a result of maintained contact between the nanostructured electrodes and the electrolyte. Since the electrolyte provides mechanisms for self-discharge, long term energy storage in such a supercapacitor is not possible. Also, the possibility of charging non-faradaic supercapacitors, removing the electrolyte, and then storing energy in the dry-state supercapacitors has heretofore not been conceived.

Faradaic electrochemical charge injection involves the intercalation of ions into a solid electronically conducting electrode material. This method is limited to the types of materials that can incorporate dopant by a reversible process, preferably at room temperature. For example, elemental metals and metal alloys cannot undergo charge injection by this method. Similarly, this method of charge injection is not useable for non-porous materials having three-dimensional covalent bonding. Also, substantial dopant intercalation fundamentally changes the structure of the material and can introduce gross structural defects. As a consequence, de-doping does not completely return the material to the original state. Nevertheless, the faradaic electrochemical method of charge injection has great value, as indicated by the year 2000 award of a Nobel prize for the discovery that dopant intercalation (either chemically or electrochemically) into semiconducting conjugated polymers can convert these semiconductors into metallic conductors. Faradaic electrochemical doping (for conducting polymers and other materials) is used for both primary and rechargeable batteries (Y. Gofer et al., Applied Physics Letters 71, 1582-1584 (1997)), conducting polymer actuators (R. H. Baughman, Synthetic Metals 78, 339 (1996)), electrochromic displays (W. Lu et al., Synthetic Metals 135-136, 139-140 (2003)), the control of membrane ion permeability (P. Burgmayer and R. W. Murray, J. Phys. Chem. 88, 2515-2521 (1984)), the release of drugs and other biochemically active agents (H. Shinohara et al., Chemistry Letters, 179-182 (1985), L. L. Miller et al., U.S. Pat. No. 4,585,652), and electrochemical light emitting displays (G. Yu et al., Science 270, 1789-1791 (1995)). For such devices, dramatic structural changes are typically associated with dopant intercalation, and these charges are not fully reversed on de-intercalation—which limits cycle life. The required dopant insertion and de-insertion processes (called intercalation and de-intercalation) result in slow device response, short cycle life, hysteresis (leading to low energy conversion efficiencies), and a device response that depends on both rate and device history.

The embodiments of the present invention eliminates key problems of these prior-art technologies, by showing that non-faradaic electrochemical charge injection can be maintained, and even developed, at room temperature for regions of the electrode that are not in direct physical contact with the electrolyte. The present discoveries enable materials and device applications that would not be possible, or would be less advantageous, in the presence of locally contacting electrolyte.

BRIEF DESCRIPTION OF THE INVENTION

A first object of the invention is to provide processes for the combination of injecting charge in a material electrochemically via non-faradaic (double-layer) charging and retaining this charge and associated desirable properties changes when the electrolyte is removed.

A second object is to provide compositions and applications using material property changes that are induced electrochemically by double-layer charging and retained during subsequent electrolyte removal.

A third object is to provide reversible processes for electrochemically injecting charge into material that is not in direct contact with an electrolyte.

A fourth object is to provide devices and other material applications that use properties changes resulting from reversible electrochemical charge injection in the absence of an electrolyte. Examples of such application of charge injection and associated magnetic, optical, and electronic properties changes are for optically transparent electronic conductors; spintronic devices; information storage devices; nanostructured magnets; chemical and mechanical sensors; electromechanical actuators; the control of thermal and electrical energy transport; the tuning of surface energy and friction; the switching, phase shift, and attenuation of electromagnetic radiation; tuning magnetoresistive materials; and drug delivery.

Invention embodiments include processes for improving material properties by non-faradaic charge injection and retaining these switched properties in the absence of electrolyte that contacts charge-switched electrode regions.

More specifically, in some embodiments, the present invention provides for processes whose overall effect is to provide, retain and employ charge injection to substantially change the properties of a material A, material A being either a largely electrolyte-free porous material region, or a particle, the process comprising the steps of: (a) immersing material A into an electrolyte E; (b) providing an ion conducting and substantially electronically insulating continuous path between material A and a counter electrode material B; (c) applying a potential between material A and the counter electrode B for sufficient time that the desired charge is injected into material A; and (d) substantially removing the electrolyte E from contact with material A, wherein both material A and counter electrode B have an electronically conducting charged or uncharged state and material A has an achievable capacitance for non-faradaic charging of above about 0.1 F/g.

Compositions of matter resulting from the above processes are also provided in the invention embodiments. An example is a composition of matter containing non-faradaically injected charge and substantially no electrolyte that maintains, in a suitable environment, a potential that deviates from the potential of zero charge by at least 0.1 volt.

Devices that utilize non-faradaic charge injection in the absence of locally contacting electrolyte are also provided in invention embodiments. These devices, having a tunable response, comprise: (a) a nanostructured electrode component C of a first electrochemical electrode and an electrode component D of a second electrochemical electrode; (b) an ionically conducting material that is substantially electronically non-conducting that connects said first and said second electrochemical electrodes; and (c) a means of providing a voltage between said first and said second electrochemical electrodes, wherein the electrode component C is not in direct contact with an electrolyte, the electrode component C has an achievable capacitance of above about 0.1 F/g for substantially non-faradaic charging, and wherein properties changes of the electrode component C in response to injected charge are used to achieve device performance. In some embodiments it is advantageous if said first electrochemical electrode and said second electrochemical electrode are both porous electrodes having a capacitance of at least about 0.1 F/g, and wherein said ionically conducting material that is substantially electronically non-conducting at least partially penetrates both said first and said second electrochemical electrodes.

The foregoing has outlined rather broadly the features of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
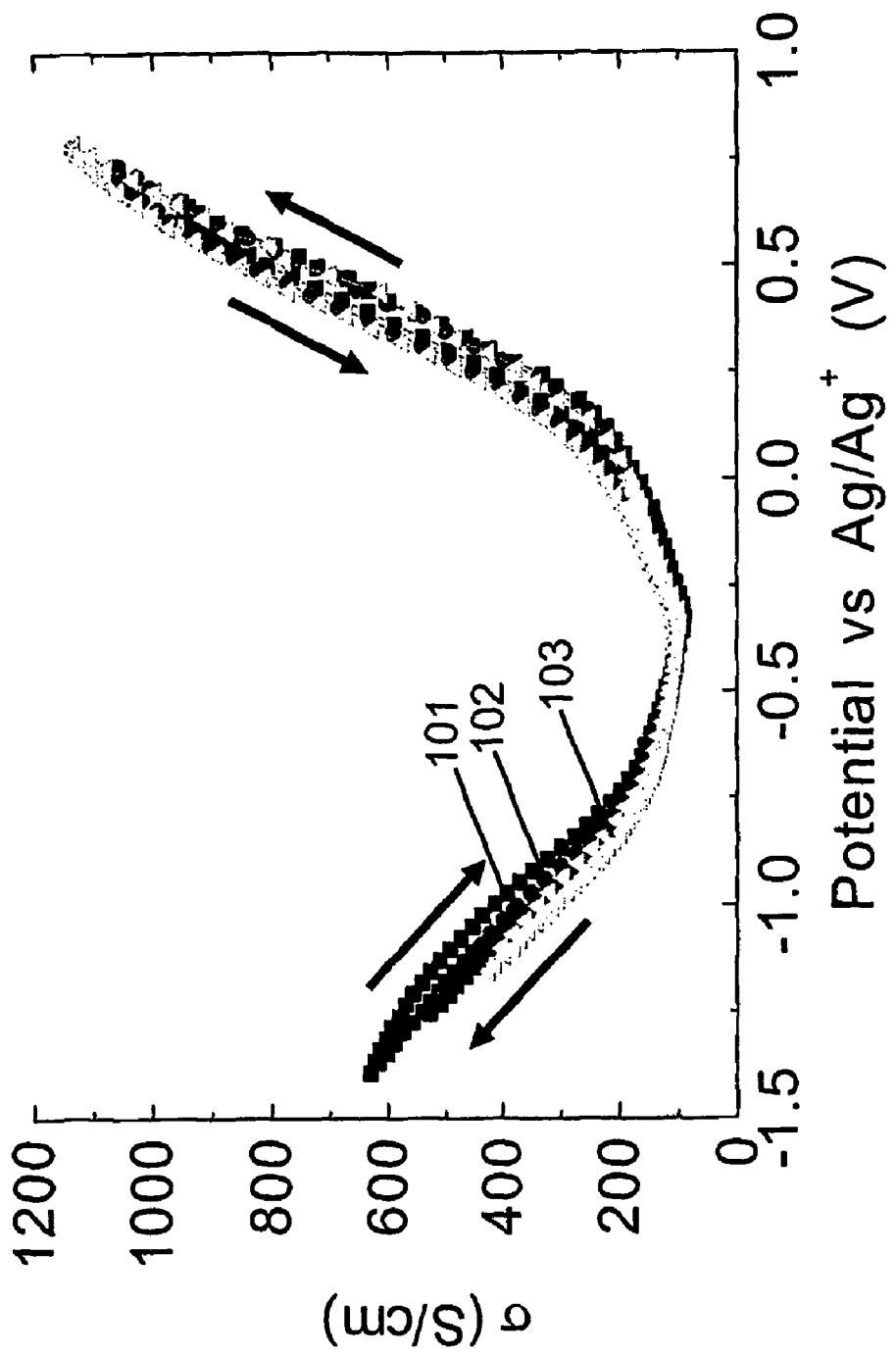
FIG. 1 shows the observed tunability of four-point electrical conductivity as a function of applied potential (versus Ag/Ag+) for a sheet of single-wall carbon nanotubes immersed in an organic electrolyte (0.1M tetrabutylammonium hexafluorophosphate in acetonitrile). The different curves are for three successive cycles of electrochemical potential change (using squares, circles, and triangles for successive cycles).

Invention embodiments are directed to processes, materials, and devices that utilize non-faradaically injected charge and associated changes in either magnetic, electronic, optical, or chemical properties, wherein the non-faradaically injected charge is retained in the absence of direct or maintained contact with the electrolyte.

Differentiation between faradaic and non-faradaic charging processes is important for understanding the advantages and novelty of these invention embodiments. Significant amounts of electronic charge can be injected (i.e., stored) in an electrode typically only if counter ions of opposite charge are available in close proximity to the electronic charge injected into the electrode. These counter ions can compensate the electrostatic repulsion of the electronic charges on the electrode, thereby enabling the electronic charge injection process to proceed to high levels. A faradaic process for an electrode material is one in which electronic charge injected into the electrode is predominately compensated by ions that are inserted (i.e., intercalated) into the volume of the charge-injected component of the electrode. A non-faradaic process is one in which compensation of electronic charge on the electrodes is by ions that do not enter the solid volume of the charge-injected component of the electrode. A well-known example of a non-faradaic process is one in which the counter ions (to the electronic charge on the electrodes) are located in the electrolyte (within the so-called charge double layer). Evidence of faradaic charging processes is provided by the existence of well-defined peaks in cyclic voltamograms (current-versus-potential plots at constant potential scan rates). In contrast, the current in a cyclic voltamogram depends only weakly on potential in a potential range where electrode charging is non-faradaic and the electrolyte is neither reduced nor oxidized. Correspondingly, for the purposes of this invention, the existence of potential range, where electrode potential increases substantially linearly with injected charge under some charging conditions, is sufficient (but not necessary) evidence for predominately non-faradaic charging in this potential range for these charging conditions. If ions corresponding to injected electronic charges are predominately located on or near the closest surface of an electrode material, including the internal surfaces arising from material porosity and the interior volume of hollow fibers, the charging process is herein defined as non-faradaic, independent of the shape of cyclic voltammetry curves. The pore size in a charge injected electrode structure can be at any size that is larger than that of the incorporated ions (together with possible solvating species), since this is the situation needed in order to avoid harmful dimensional charges as a result of the volume of the ion (together with possible solvating species). Charging by ion incorporation within a nanotube, such as a carbon nanotube or a carbon scroll is specifically designated as being non-faradaic for the purposes of this invention.

Prior-art understanding of non-faradaic charge injection is that the electrode capacitance (and therefore the non-faradaic charge injection capability) for an electrode is given by the following equation: $C_e = A_e C_s$. In this equation, $C_s$ is the capacitance per unit surface area of the conducting component of the electrode when this surface area is in contact with electrolyte. $A_e$ is the total surface area of the electronically conducting component of an electrode that is in contact with a suitably thick layer of electrolyte. This electrode surface area includes all electrolyte-coated internal and external surface area of the electronically conducting component of the electrode. Ignoring the potential dependence of $C_s$, the amount of injected electrode charge is $q_e = (V - V_o) C_e$, where $V_o$ is the potential at which there is zero electronic charge injected in the electrode and V is the potential applied to the electrode, measured with respect to the same reference electrode as $V_o$. Applicants have discovered that these equations are not generally valid when only part of a nanostructured electrode is in contact with the electrolyte. The processes that lead to violation of these equations are the basis for certain embodiments of this invention.

More specifically, Applicants have discovered that dopant ions (together in some instances with solvating species from the electrolyte) can migrate at room temperature from the electrolyte (solid-state or liquid) to regions of the electrode that are not coated with electrolyte. This dopant ion migration enables electronic charge to be injected in regions of the electrode that are not in contact with the electrolyte, thereby increasing the injected charge ($q_e$) above the values given by the equation given in the preceding paragraph. Most important for device applications, such as field emission displays, Applicants' discovery means that electrochemical double-layer charge injection can be used to inject charge in regions of the electrode that are in a gas or vacuum, rather than in an electrolyte.

This enabling and unexpected discovery resulted from Applicants surprising observation that charge can be non-faradaically injected into a nanoporous electrode, and then retained in this electrode when this electrode is removed from a volatile electrolyte and dried by pumping in dynamic vacuum. This observation means that the optical, magnetic, and electronic properties of an electrode material can be tuned, and that these tuned properties can be substantially maintained for materials applications in ambient environments, where the problematic electrolyte is absent.

Also generally important for invention embodiments, the stability observed (in the absence of electrolyte) for injected charge on surfaces of nanostructured materials (internal and external) indicates that one can continuously vary the degree of charge injection in nanostructured material elements that are not in direct contact with the electrolyte and maintain this injected charge when the power source is disconnected. This stability and the continuous tunability of charge injection in the absence of direct electrolyte contact enables many of the materials and device applications in the device embodiments. These embodiments require that the continuous tuned material elements are electronically connected to an electrode, so that the electronic part of charge injection can occur. Additionally, these embodiments require that ion conduction path(s) exist or can self form to the continuously tuned elements—which need not be in direct contact with the electrolyte.

Processes of the present invention generally require at least two electrodes, called working and counter electrodes. For the cases where the desired charge-injection-produced properties changes are for only one of these electrodes, the working electrode is defined as this electrode. In addition, one can optionally employ a reference electrode, whose function is to place the potentials of the working and counter electrodes on an absolute scale. The working electrode should typically have a capacitance of at least 0.1 F/g when fully immersed in electrolyte. More typically, the capacitance of the working electrode fully immersed in the electrolyte should exceed 1 F/g. Most typically, the capacitance of the working electrode should exceed 10 F/g when fully immersed in electrolyte. The specific capacitance of an electrode can be derived using the conventional method from the dependence of gravimetric current on the scan rate of electrode potential (versus a reference potential). (See J. Li et al., J. Phys. Chem. B. 106, 9299-9305 (2002) for a description of this method.) The above-mentioned specific capacitances for the typical, more typical, and most typical invention embodiments are the maximum values that can be measured within the stability range of the electrolyte.

Before discussing particular embodiments of the present invention, some surprising observations that provide basis for these embodiments will be described. These discoveries are further elaborated in the examples section. Following this, elaboration will be provided on (1) specialized invention embodiments and (2) material components and processing methods for the practice of these embodiments.

Figure 2:
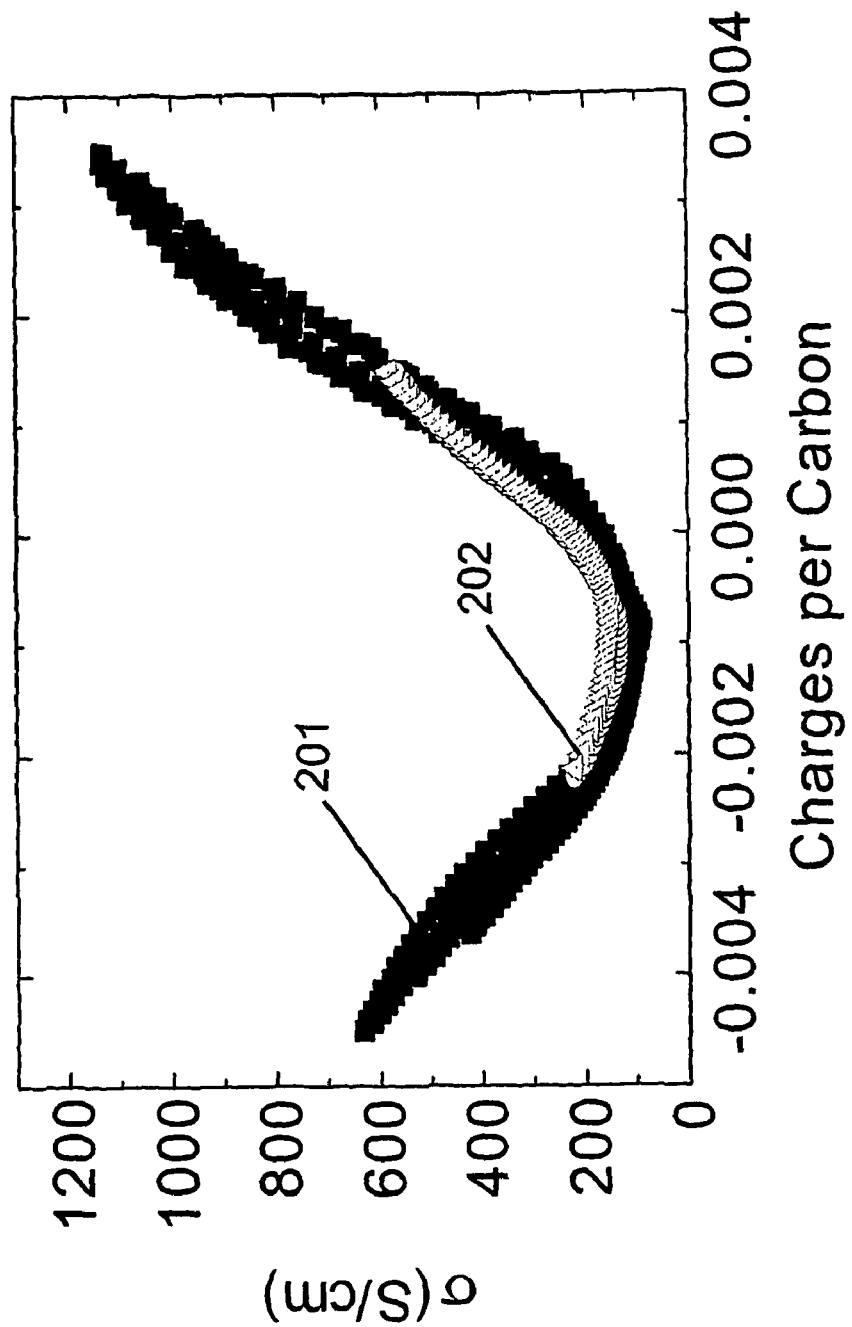
FIG. 2 shows the dependence of four-point electrical conductivity upon the amount of injected charge (per carbon) for the nanotube sheet used for the FIG. 1 experiment (black data points are for experiments using 0.1M tetrabutylammonium hexafluorophosphate/acetonitrile electrolyte and near-white data points are for related measurements using 1 M aqueous NaCl electrolyte). The origin of the charge scale is arbitrary.

The results depicted in FIGS. 1 and 2 show that a potential change and corresponding electrode charge injection can dramatically change the properties of a nanostructured electrode material. FIG. 1 shows the presently observed continuous tunability of four-point electrical conductivity as a function of applied potential (versus Ag/Ag+) for a sheet of single-wall carbon nanotubes (SWNTs) immersed in an organic electrolyte (0.1M tetrabutylammonium hexafluorophosphate in acetonitrile). These results demonstrate that the electrical conductivity of the nanotube sheet can be increased by about an order of magnitude by electrochemical charge injection. There is slight hysteresis evident for the curves in FIG. 1, with the conductivity $\sigma$ on the extreme left side of the potential minimum being slightly higher for hole injection (increasingly positive applied potential) and the conductivity slightly lower on the extreme right side of the minimum for electron injection (increasingly negative applied potentials). The different curves are for three successive cycles (using squares (101), circles (102), and triangles (103) for successive cycles). The density of these nanotube sheets is about 0.3 g/cm$^3$, versus the density of about 1.3 g/cm$^3$ for densely packed nanotubes having close to the observed average nanotube diameter. Hence, the void volume in these nanotube sheets is about 76.9 volume percent. This high void volume, and the correspondingly high accessible surface area, is generally important for achieving high degrees of non-faradaic charge injection at modest applied potentials. Supporting this conclusion, the measured BET surface area determined from nitrogen gas adsorption for these nanotube sheets is approximately 300 m$^2$/g.

FIG. 2 shows the dependence of four-point electrical conductivity upon the amount of injected charge for both the above experiment with 0.1 M tetrabutylammonium hexafluorophosphate/acetonitrile electrolyte (black data points (201)) and for other experiments using 1 M NaCl electrolyte (near-white data points (202)). Although not indicated here in this plot of conductivity versus charge (because charge measurements are not reliable for potentials exceeding the redox stability of aqueous electrolyte), reversible conductivity increases from about 100 S/cm to about 1000 S/cm were also observed at positive potentials for experiments using the 1 M aqueous NaCl electrolyte. The origin of the charge scale is arbitrary. The charge per carbon at the minimum in electrical conductivity can be used to place origin of the charge axis, since theory suggests that conductivity should be minimized at the potential of zero charge (pzc), where there is no charge on the carbon nanotube.

Figure 3:
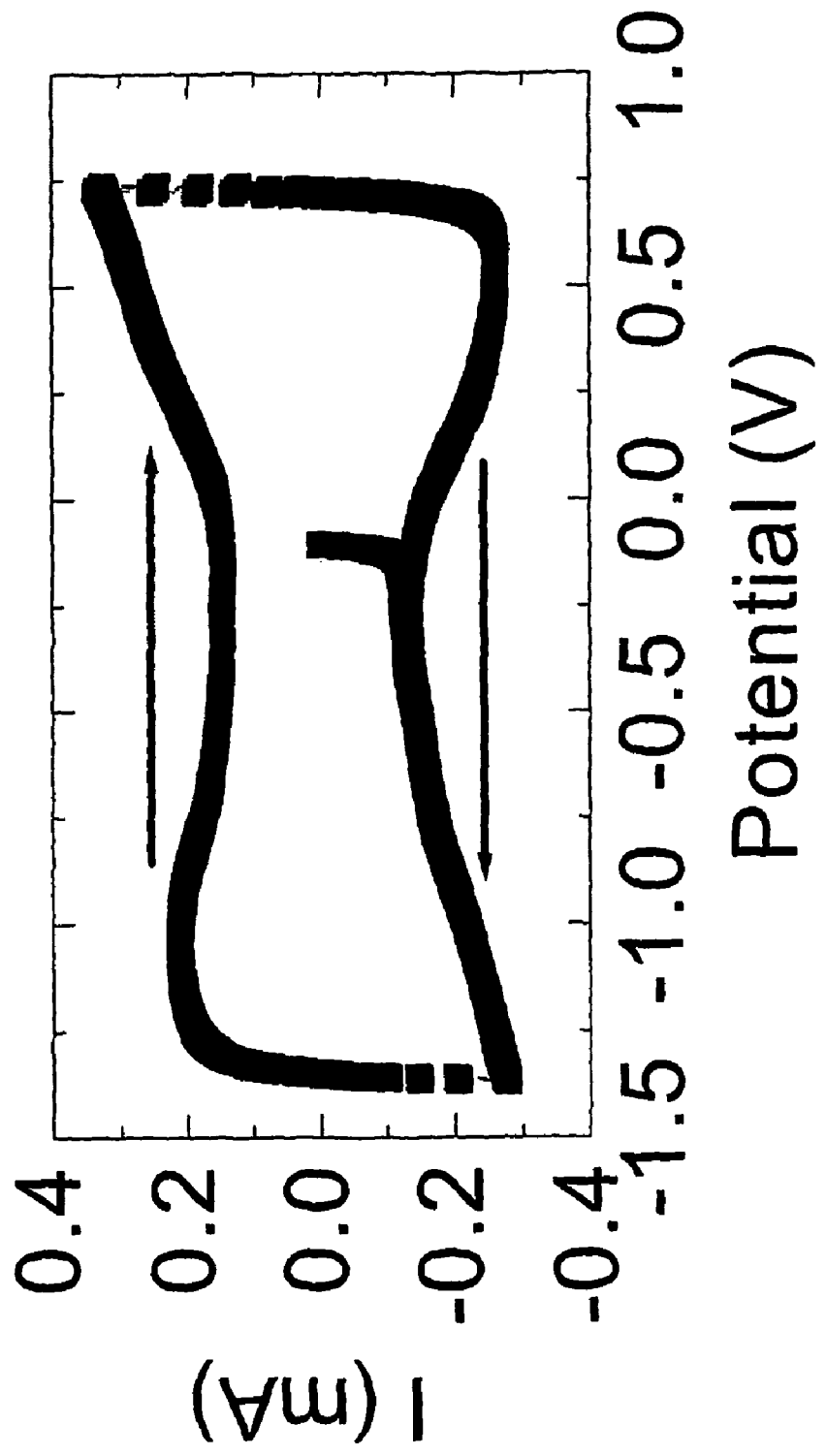
FIG. 3 shows measured cyclic voltammetry for the SWNT sheet of FIGS. 1 and 2 when immersed in tetrabutylammonium hexafluorophosphate electrolyte. These results show that the charging is predominately non-faradaic by double-layer charge injection.

FIG. 3 shows measured cyclic voltammetry during charge injection for the above SWNT sheet when immersed in the above tetrabutylammonium hexafluorophosphate electrolyte. The absence of major peaks in this cyclic voltammetry curve (measured versus Ag/Ag+) indicates that charging is predominately non-faradaic for this electrolyte and potential range.

Figure 4:
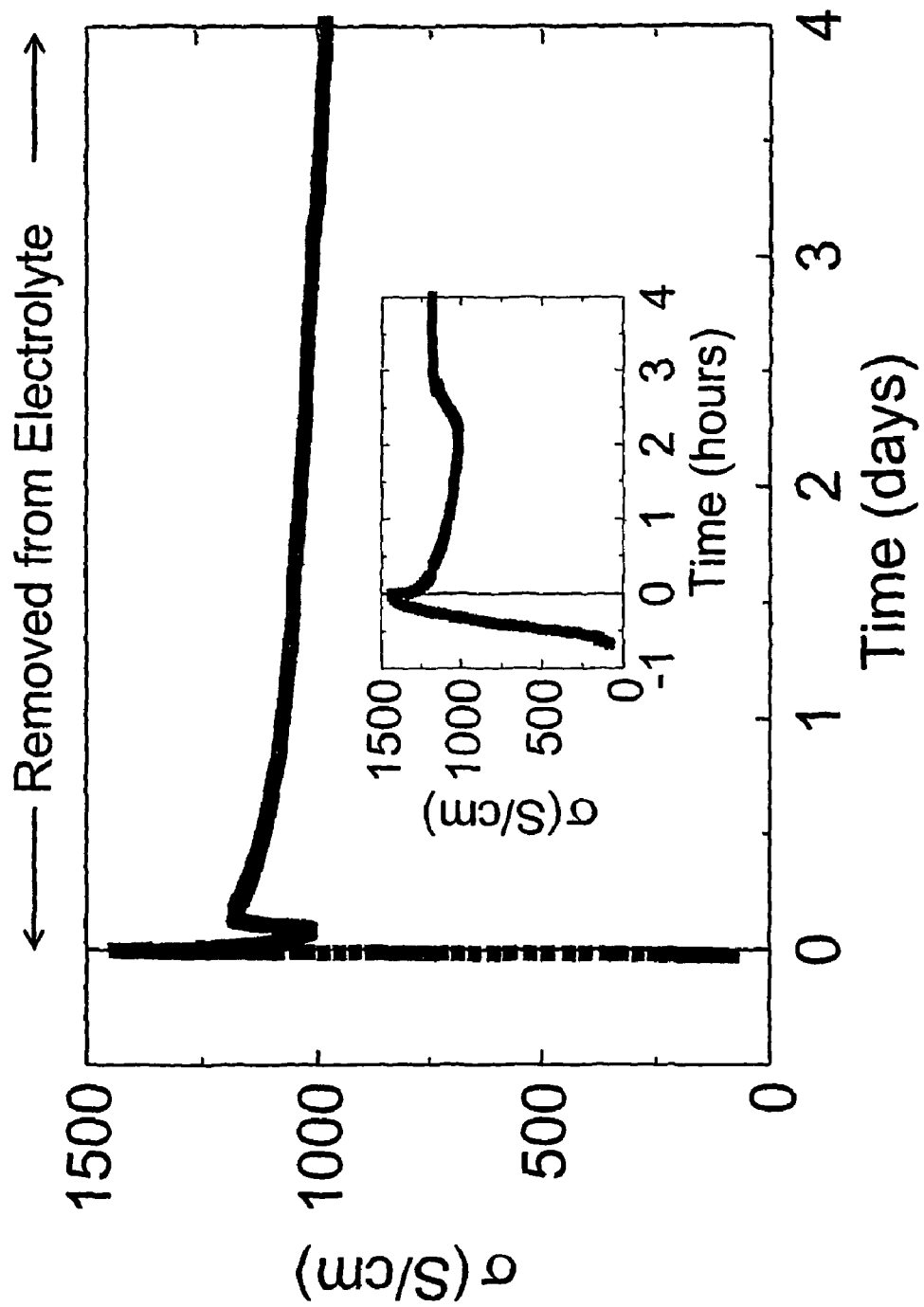
FIG. 4 shows that the dramatic hole-injection-induced increase in electrical conductivity of the nanotube sheet in FIGS. 1 and 2 is largely retained when the hole-injected electrode is dried in a flowing dry nitrogen atmosphere to remove the electrolyte. The insert to this figure shows results for the initial four-hour period on an expanded time scale.
Figure 5:
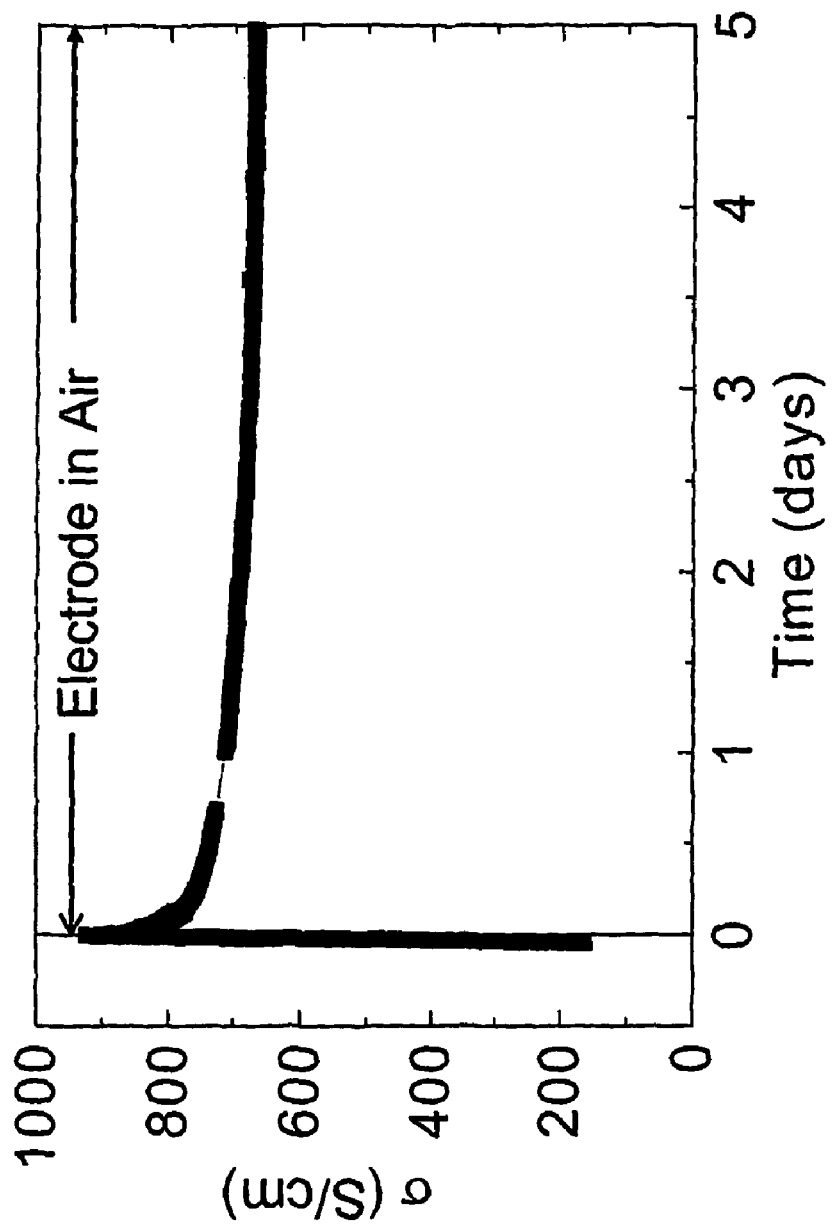
FIG. 5 shows the retention of conductivity enhancement when the nanotube sheet is removed from the electrolyte and held in air for the investigated five-day period.

FIG. 4 shows that the dramatic increase in electrical conductivity of the nanotube sheet in FIGS. 1 and 2 (obtained by hole injection for the nanotube sheet and the organic electrolyte of these examples) is largely retained when the hole injected electrode is dried in flowing dry nitrogen atmosphere to remove the electrolyte. The insert to this figure (describing results over a four-day period) shows first a conductivity increase and then a conductivity decrease during the first few hours of this four day study, which might be a result of volatilization of the acetonitrile component of the organic electrolyte. FIG. 5 shows the retention of conductivity enhancement when the nanotube sheet is removed from the electrolyte and held in air for the investigated five-day period. These results show that the enhancement of electrical conductivity of the hole-doped nanotube sheet is relatively stable even in atmospheric air. The electrical conductivity enhancement (and retained charge) degrades more rapidly in air for the hole-injected electrode than for the electron-injected electrode.

Applicants have found equally unexpected results when these room temperature measurement results were extended to generic nanostructured materials, and, in particular, to a nanostructured metal—which has no possibility of accommodating ions by faradaic processes (intercalation). These results are for a platinum electrode made by compaction of 30 nm diameter Pt nanoparticles, using the method described by J. Weissmüller et al. in Science 300, 312 (2003). The cyclic voltammetry results in FIG. 6 (using 1 M aqueous NaCl electrolyte) show that these electrodes provide the classical dependence of current on applied potential that arises for double-layer charging. There are no current peaks due to Faradaic processes and the current at constant voltage scan rate (20 mV/sec) varies little with potential. From plots of current versus potential scan rate in 1 M aqueous NaCl electrolyte), the electrode capacitance is about 14.5 F/g. The high volume fraction of void space observed in these pellets (between 81.6 and 87.2 volume percent for compaction pressures between 0.6 MPa and 2.1 MPa), together with the corresponding high gravimetric surface area, explains the high degree of non-faradaic charge injection that results for modest applied potential for the nanostructured Pt electrode.

Figure 7:
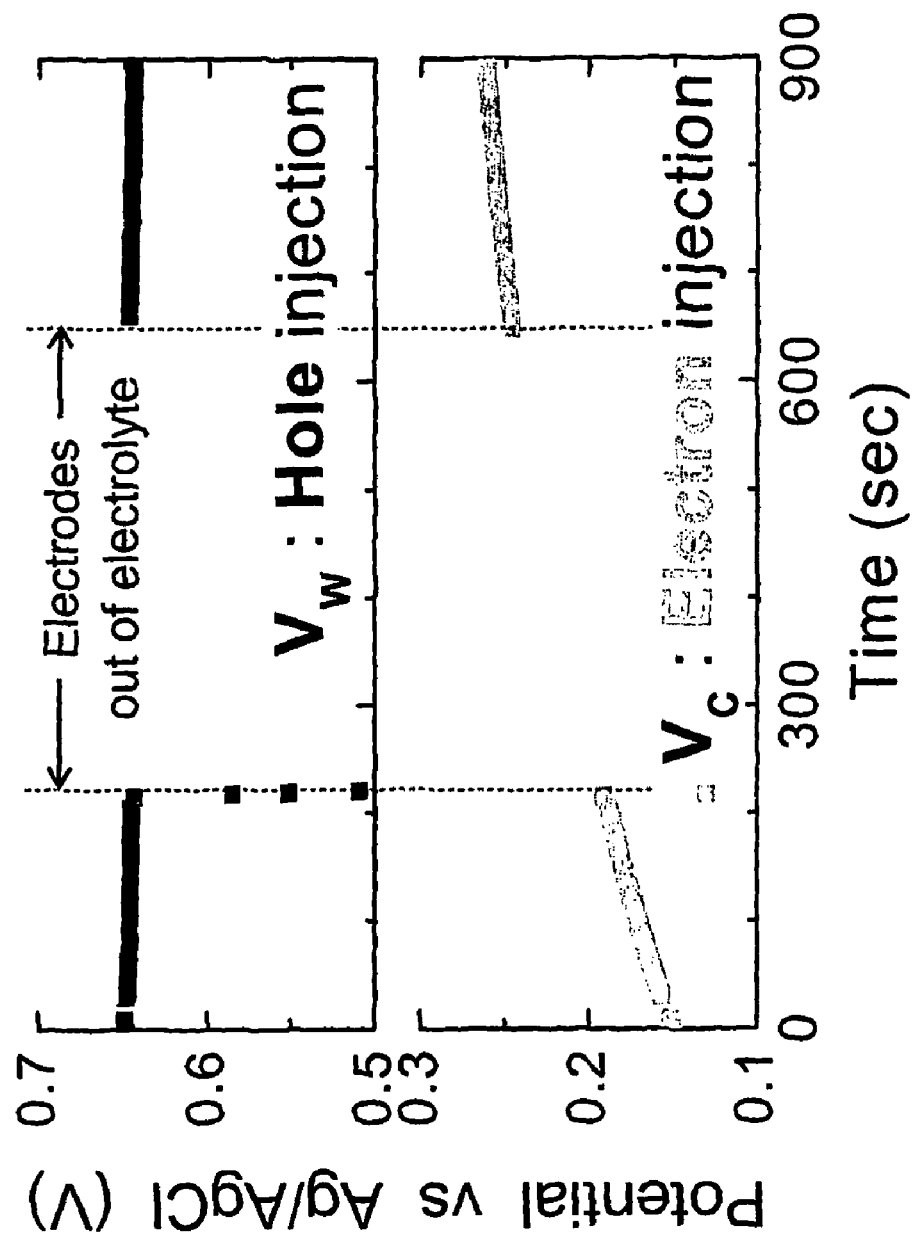
FIG. 7 shows potential measurements before and after removal of the nanostructured Pt electrodes of FIG. 6 from the 1 M NaCl aqueous electrolyte (and subsequent reimmersion into the electrolyte). The measured electrode potentials of both positive and negative electrode indicate that non-faradaically injected charge is partially retained even when the electrodes are removed from the electrolyte.

Perhaps most importantly, Applicants have found that the nanoporous Pt electrode remains charged when disconnected from the power source and removed from the electrolyte. Initial results indicating this stability are shown in FIG. 7. As shown in FIG. 7, the charge on the positive electrode (i.e., the hole-doped electrode) is retained when the electrode is removed from the electrolyte, and then held in air. Indication of this retained charge is provided by reimmersion of the nanoporous hole-injected Pt electrode in the 1 molar NaCl electrolyte, and finding that the electrode potential is substantially unchanged. Just like the case for the carbon nanotube electrode, the potential of the negatively charged electrode is less stable than for the positively charged electrode, as indicated by the results shown in the lower part of FIG. 7.

Since it is possible that some electrolyte is still retained inside the pores of the Pt electrode during the experiment depicted in FIG. 7, this experiment was repeated using much longer time periods when the electrodes are not in contact with the 1 M NaCl electrolyte, and dynamically pumping on the nanoporous Pt during this time period after the pellet electrodes have been disconnected from the power source and the electrolyte was removed from the electrochemical cell. The electrode potentials (versus Ag/AgCl) before and after this two day exposure of the electrodes to dynamic pumping were +0.58 V and +0.45 V for the hole-injected electrode and −0.04 V and +0.02 for the electron-injected electrode. The potential between the two electrodes changed from the initial 0.62 V to a final 0.43 V after removal of the electrodes from the electrolyte and dynamically pumping on these electrodes for two days.

To further evaluate the stability of charge storage, the time period in which the platinum pellets were exposed to dynamic vacuum was extended to a week. After this, the nanoporous Pt electrodes were reimmersed in the 1 M NaCl electrolyte to determine their charge state by electrochemical potential measurements (naturally, without applying any external potential). High charge storage was again indicated for the positively charged Pt electrode (indicated by retention of a 0.28 V potential, versus Ag/AgCl, compared with the initial potential before electrolyte removal of 0.33 V). The negatively charged electrode had lower stability, as indicated by a potential change from the initial −0.68 V (before removal of the electrolyte and the week-long process of drying the electrode in dynamic vacuum) to a final potential on initial reimmersion into the electrolyte of −0.32 V.

Electron and hole injection in the nanostructured platinum samples does not significantly change electrical conductivity (in contrast with the case for the nanostructured nanotube sheets), since this charge injection causes only a small fractional change in the already high total electron concentration. While it is known that charge injection in a liquid electrolyte can provide changes in unit cell volume, the prior art did not anticipate that these charge-induced volume changes can be retained in electrolyte-free materials (J. Weissmüller et al., Science 300, 312 (2003) and R. H. Baughman, Science 300, 268-269 (2003)).

The implications of these results for practical applications in invention embodiments are profound, since diverse properties (including superconductivity, magnetism, and magneto-resistance) can be very sensitive to material volume.

Figure 8:
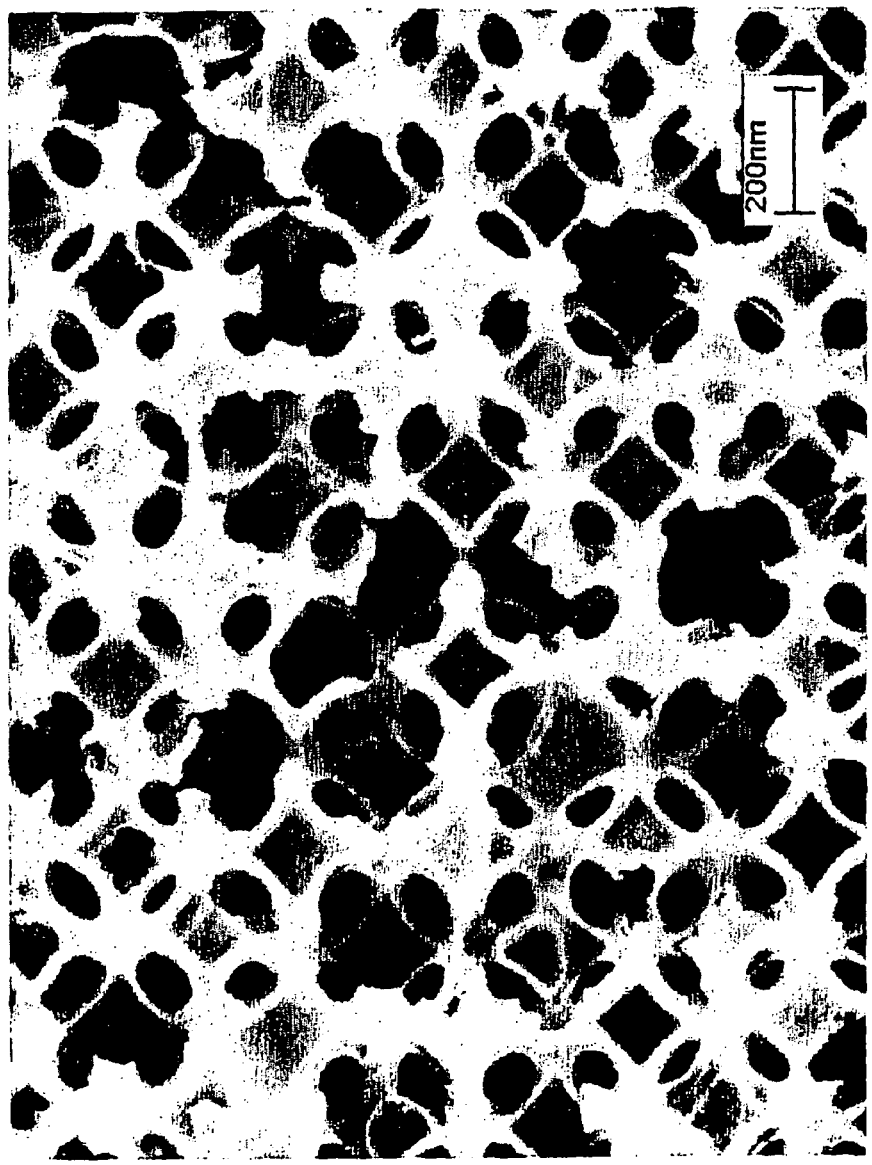
FIG. 8 shows a scanning electron microscope (SEM) picture of a nanostructured inverse-opal carbon electrode that was found to store charge without the need for a surrounding electrolyte.

Applicants have also shown experimentally that inverse opals (also called inverse-lattice photonic crystals) of conducting materials are another type of composition that can be used in some invention embodiments. In these experiments, a carbon inverse opal was synthesized by infiltrating phenolic resin into an ordinary $SiO_2$ opal, pyrolizing this phenolic resin, and then removing the $SiO_2$ template material by dissolution in HF solution. A scanning electron microscope (SEM) image of this carbon inverse opal is shown in FIG. 8. Experiments done in both 1 M aqueous electrolyte and tetrabutyl ammonium hexafluorophosphate/acetonitrile electrolyte show that electrochemically-injected charge is partially retained when the electrodes are removed from the electrolyte and dried, and that the stability of injected charge is much higher than for the same electrodes immersed in the electrolyte with the power source disconnected.

This retention of electrochemical double-layer-injected charge and charge-injection-induced properties changes, when the charge-injected material is not in contact with the electrolyte, is more broadly important for invention embodiments. Also important, Applicants have found that dry-state-retained injected charge is highly mobile, as evidenced by Applicants' observation that the charge on dry negatively and positively charged nanostructured electrodes, rapidly occurs when these electrodes are contacted in the dry state.

Processes, materials, and device applications stemming from the above-described discovery of a means for electrochemically-injecting charge in nanostructured materials and retaining this injected charge when the nanostructured material is not in contact with the electrolyte, is described next. These applications utilize Applicants' discoveries that non-faradaically injected charge and associated properties changes are retained in the absence of electrolyte. Use is also made of Applicants' discovery that non-faradaically injected charge (ion and corresponding electronic counter charge) of an electrolyte-free electrode can be highly mobile. Because of this mobility of the ions and electronic charge, electronic charge and counter ions can be reversibly and controllably electrochemically inject into nanostructured material elements that are not placed in direct contact with an ion source (for example, an electrolyte or intercalated material, such as a doped conducting polymer).

Both here and elsewhere herein the terms "free of electrolyte," "not directly contacted with electrolyte," "not contacted by the electrolyte," "largely electrolyte free," and like terms have a specific meaning that is now defined. These terms apply for a material element a if any of the following cases applies: (1) material component α was at no point placed in physical contact with a bulk electrolyte composition employed for either processing, device fabrication, or device operation; (2) either anions, cations, and/or solvating species are present only in about 10 nm or thinner surface layers on or within material component α or as salt crystals on or within material component α that cannot serve as an effective electrolyte under application conditions; (3) electrolyte-derived chemical species in materials component α that can be almost entirely removed from the bulk electrolyte by pumping in dynamic vacuum at room temperature are essentially stable in materials component α under the same conditions; (4) the ratio of free anions to free cations that are present in materials component α (i.e., those that are not crystallized as salt crystals) is either lower than 0.9 or above 1.1; and (5) major components in the utilized electrolyte are substantially absent in materials component α. Defining the meaning of these terms and like terms is pertinent, since the devices of invention embodiments operate by the surface diffusion of ions from the electrolyte and such ion diffusion can be accompanied by co-diffusion of ion-solvating species from the electrolyte.

First to be considered is a process of the present invention, wherein the properties of a nanostructured material are tuned by non-faradaic charge injection in an electrolyte, and wherein these properties changes and associated injected charge are retained when the electrode is free of electrolyte. In perhaps the simplest embodiment of this process, the material to be processes by electrochemical charge injection is immersed into a liquid electrolyte that is based on a solvent that can be volatized (like water or acetonitrile). This material component is used as the working electrode of an electrochemical cell that comprises this working electrode and a counter electrode. A reference electrode can also be present in this electrochemical cell, since measurement of the potential of this working electrode with respect to this reference electrode can be used to regulate the charge injection process. This nanostructured material, containing electrolyte in its pore structure, is charged by application of a potential difference between the working and counter electrodes. Satisfactory completion of the desired degree of charge injection can be monitored by measuring either the total charge passed through the electrochemical cell or the evolution of electrode potential versus a reference electrode. After charge injection, the nanostructured electrode (or electrodes) in which charge injection is needed can be disconnected from the power source and then dried or otherwise processed to remove liquid electrolyte (such as by washing in the solvent component of the electrolyte, followed by drying). In order to retain injected charge in the dried electrode, it is generally important that the electrode material is not contacted with materials that can undergo redox reactions with charge on the electrode. Avoiding such degradative reactions is typically more difficult for electron-injected electrodes than it is for positively injected electrodes, although this problem is decreased in difficulty when the degree of charge injection in the electrode is not high.

A useful method for substantially eliminating charge degradation of electron-injected materials (by reaction with hole-donating impurities) is to enclose these materials in an environment that comprises "getter" substances that are easier to oxidize than the electron-injected material. Likewise, a useful method for substantially eliminating charge degradation of hole-injected material (by reaction with electron-donating impurities) is to enclose these materials in an environment that comprises getter substances that are easier to reduce than the hole-injected material. A host of materials can be used as getter substances, such as Li metal or n-doped conducting organic polymers for electron-injected materials or device components and heavily p-doped conducting polymers for hole-injected materials or device components. In some invention embodiments where neither increases or decreases in charge injection are desirable, it is helpful if redox active components of the getter material do not contact the charge-injected material. For this purpose, the getter material, and components thereof, should ideally be immobile with respect to diffusion and volatilization at the normal operating temperature of the device or the charge injected material. An important exception to this is the case where contact of the getter material is used to maintain the electrochemical potential (and therefore the degree of charge injection) at a value set by the getter material. In such embodiments, the getter material is likely to be an alkali metal, an alkali metal alloy, or a donor or acceptor intercalated material.

In some embodiments, processes of invention embodiments can be described as providing, retaining, and employing charge injection to substantially change the properties of a largely electrolyte-free porous material region A. Such processes comprise the steps of: (a) placing an electrolyte within the interior of A, (b) providing an ion conducting and substantially electronically-insulating continuous path between A and a counter-electrode material B, (c) applying a potential between A and counter electrode B for sufficient time that the desired charge is injected into A, and (d) substantially removing the electrolyte from contact with A, wherein both A and B have an electronically conducting charged or uncharged state and A has an achievable capacitance for non-faradaic charging of above about 0.1 F/g. A material produced by this process is referred to herein as an "Electrolyte-Bare Ion-Gated" material (EBIG material), since charge injected electrochemically by double-layer ion gating is retained and the electrolyte is substantially absent in the final state.

The electrolytes used for process step (a) can be any of the many aqueous and organic electrolytes later-described. While solid-state electrolytes can be employed, they are generally less desirable than liquid electrolytes having electrolyte components that are easily volatilized in step (d) of the process. Electrolytes having high redox stability (such as the below-listed ionic liquids) are especially useful when high degrees of electrode charge injection are needed. The composition of material A generally depends upon the intended use of the charge-injection modified material, and these compositions for various applications will be later-elaborated. The composition of electrode B is relatively unimportant unless the charging of this electrode is desirably used for the production of material that is oppositely charge injected to that of electrode A (or unless specific properties changes are needed for electrode B in a device application). If the function of electrode B is merely to provide a counter-electrode to material A, the capacitance of this electrode is typically at least twice that of electrode A, so that most of the applied potential between electrode A and electrode B is applied across electrode A. The potential applied during step (c), the time evolution of this potential, and the duration of this potential depend upon the redox stability window of the electrolyte and whether or not redox processes occurring in the electrolyte will harmfully degrade either the electrolyte or the electrodes. It is simplest to use either constant current or a constant inter-electrode potential between electrode A and electrode B. However, it is useful for maximizing rate for batch materials processing that resistance compensation be used to control the inter-electrode potential, in order to insure that both rapid charge injection occurs and damage to either the electrodes or electrolyte due to excessive applied potentials is avoided. J. N. Barisci et al. (Journal of Smart Materials and Structures 12, 549-555 (2003)) describe the use of resistance compensation for another use (electrochemical electromechanical actuators), and the concepts described by these authors are applicable for the present application.

One measure of the degree of charge injection is the magnitude of the deviation of electrode potential from the potential of zero charge. This deviation for an electrode element that is not substantially contacted with electrolyte is typically above about 0.1 V for selected invention embodiments. More typically, this deviation should be above about 0.4 V for these invention embodiments.

The process step of charging an electrode immersed in an electrolyte can be accomplished under conditions that optimize the degree of infiltration of the electrolyte within the pore space of the electrolyte, since this optimizes the degree of charge injection achieved at a particular potential (via increasing the realized capacitance of the electrode material in the electrolyte). For the purpose of increasing electrolyte infiltration by improving electrolyte wetting of the electrolyte, a series of potentials can be applied whose effect is to remove charge from the electrode and then to re-inject charge into the electrode. For example, a constant voltage scan rate can be used to cycle the applied electrode between minimum and maximum potentials one or more times, so as to leave the electrode in a desired state at the end of the cycling process. The point is that, while charging can be usefully accomplished for regions of the electrode that are not directly contacted by the electrolyte, the degree of charging achieved at a particular potential is generally less than that achieved if the electrode is in contact with the electrolyte. For electrodes that are difficult to infiltrate with electrolyte, and situations where multiple cycling does not undesirably increase process cost or degrade electrode structure, this process of cycling, for the purpose of enhancing charge injection, can typically be accomplished at least about three times after the initial charge injection. This electrochemical cycling process includes the steps of applying a series of potentials whose effect is to remove charge from the electrode and then to re-inject charge into the electrode, so as to thereby increase the realized gravimetric capacitance of the electrode.

Processes of invention embodiments for employing charge injection to substantially change the properties of a largely electrolyte-free porous material can be applied to various forms of these materials, such as sheets, fibers, and powders. Various methods can be used for convenient non-faradaic electrochemical charge injection into powders, such as nanofiber powders. A first method is to assemble these powders into a solid electrode form, such as a sheet, use this sheet as an electrode for predominantly non-faradaic charge injection, and then to break these sheets into powders.

A second method is to disperse the powder in electrolyte, in at least one compartment of a separated-compartment electrochemical cell (where the anode compartment and cathode compartments are separated by either an ion conducting membrane or a porous frit). Agitation of the dispersion of powder in the electrochemical cell (such as by stirring or other electrolyte flow process) brings the powder particles or fiber into intermittent contact with the electrode of this compartment, thereby permitting non-faradaic charging of the powder. The opposite compartment of this electrochemical cell can have a conventionally-shaped electrode (such as a sheet) and can, optionally, also contain an agitated electrolyte-dispersed powder that can be either the same or different from the powder in the other cell compartment. An advantage of this arrangement is that two powder samples can be charged (albeit with opposite charge) during the charging step of the process.

A third method is to use a moving conducting belt to carry the powder into and out of the electrochemical cell, wherein this moving belt is part of the electrode. The opposite electrode (typically in a separate electrode compartment) can either include a conventionally configured electrode (such as a sheet), or can contain the same type as the belt-electrode powder delivery system as for the other mentioned electrode.

A fourth method is to disperse the powder in the electrolyte of an electrode compartment, and to configure this compartment so that the effect of gravity is to provide contact between the powder and the electrode of this compartment (which is typically a planar electrode). In this method the electrolyte is selected to be either substantially heavier or substantially lighter than the powder. In the former case the electrode of the compartment is in the lower most region of the electrolyte compartment, and in the latter case the electrode is in the upper most region of this compartment.

After predominately non-faradaic charge injection, the charge injected particles can be removed from the electrolyte and optionally washed and dried without completely losing the injected charge. Subsequently, the charge injected particles can be redispersed in another carrier that is useful for applications, such as normal saline solution for medical applications.

Nanoparticles typically aggregate together, and this aggregation can limit properties obtainable before and after subsequent processing. One benefit of charge injection, as well as the retention of this charge injection in substantially dried states, is a decrease in the degree of this aggregation and the ability to retain this decreased aggregation during subsequent processing, such as in the formation of nanoparticle/polymer composites (like carbon nanotube/polymer composites).

Because of the free energy increase due to the contribution of high surface area of nanoparticles and nanoparticles aggregates, these compositions can be used as high energy explosives and propellants. Methods of invention embodiments provide a way to appropriately adjust (and increase) the energy release capabilities of explosives and propellants based on nanoparticles. The energy in taking a non-capacitively charged nanoparticle from the potential of the charged state (V) to the potential of zero charge ($V_{pzc}$) is $½C_aA(V-V_{pzc})^2$, where $C_a$ is the capacitance per unit area and A is the effective surface area of the nanoparticle. This energy can contribute to the energy released during explosions and propellant operation. Also, the release of capacitively-stored energy can be used to initiate explosion upon electronic contact of nanoparticles containing either opposite charge or differing amounts of charge of the same sign. Such explosion can be initiated by mechanically contacting (and thereby electronically contacting) two or more solids comprising particles having differing signs or differing extents of charge injection. One application for such mechanical initiation of explosion is in safety air bags for vehicles. In order to maximize the gravimetric energy release potential of the charged explosives and charged propellants of present invention embodiments, it is useful that the counter ions used for charge injection have high free energy with respect to reaction products produced by explosion and propellant burning. In addition, to this application of non-capacitive charging of nanoparticles to increase the energy release during explosions or during the burning of a propellant, the additional heating effect associated with charging can be used to increase the effectiveness of chemical warming elements based on chemical reactions involving nanoparticles, and to regulate this warming process by control of charge release from nanoparticles. Like the warming devices of the prior art, these warming devices can be used in shoes and other articles of clothing to increase the comfort level of individuals exposed to freezing temperatures. One or more components of the above-mentioned charged energy release materials can usefully comprise electronically-conducting fiber, such as spun carbon nanotube fibers.

The process of charge injection changes the surface tension of particles, which can aid in dispersing particles in various materials, such as paint manufacture and generic polymer composite manufacture from either solution or melt phases. Also, this tunability in surface tension can aid in achieving appropriate dispersion of biologically-active charged particles for medical applications. Examples are the delivery of biochemically active agents that are either the counter-ions to the injected charge or the electronically charge injected particle, or a combination thereof. In addition to more direct biochemical effects, the biochemical activity can result from heating the charge-injected particle using actinic radiation, such as infrared radiation or microwave radiation. Biochemically-active ions or ion-solvating species can either be delivered to the particles during the original charge injection process or during ion exchange or ion transformation processes like those described in subsequent paragraphs. A sometimes achievable benefit of using these latter processes is that valuable biochemically-active agents can be accommodated with less waste of these agents during processing. These species can be any of the various biochemically-active species that can serve as either anions, cations, or ion solvating species, like DNA, RNA, polypeptides (such as an enzyme, antibody, or aptamer).

After predominately non-faradaic charge injection (either for the particles or a nanostructured solid), the charge-injected material can optionally be contacted to a second material, called an "ion modification material," that either (1) provides ions that replace the function of the initial ions that are originally the counter charges to the injected electronic charge, or (2) reacts with the initial ions to provide ionic species, which then serve as counter ions to the injected electronic charge. The contacting material is here called an "ion exchange material" or an "ion transformation material," depending upon whether the result of contact with the charge-injected material is the ion exchange process of (1) or the ion transformation process of (2). The benefit of such exposure can be to replace the original ions with ions that provide either increased environmental stability or increased response for the detection of agents in sensing applications. Alternatively, the result of this contact can be to provide ions that can be released as drugs or other chemicals during electronic discharge of the charge injected material. The above mentioned contact can be by exposure of the charge-injected material to gaseous, liquid, or solid states of either the ion exchange material or the ion transformation material. One example of such processes is by immersing a hole-injected material containing $BF_4^-$ into a salt solution containing the more environmentally stable $PF_6^-$. This exposure will result in at least partial replacement of the ambient unstable $BF_4^-$ with the more stable $PF_6^-$.

Another example, useful for medical applications, involves immersion of the charge-injected material into an aqueous solution containing DNA or a polypeptide, such as an enzyme, antibody, or aptamer. This exposure can result in the exchange of the original ion with an ion of the biological material and/or interaction of the original ion (such as $H^+$) with the biological material to produce a new ion that comprises the chemical compositions of both the original ion and the biological material. This biological material is now tightly bound to the charge injected material until decay of this charge injection causes release of the biological agent, which can be used for drug delivery. This decay of charge injected, and subsequent drug release, can result from exposure of the charge-injected material to redox active materials (such as those present in the body), by contact between hole injected and electron injected materials, the application of an electrical potential that causes current flow that decreases charge injection, and by heating the charge injected material (such as by exposure of the charge injected material to infrared radiation in the infrared transparency region of mammalian tissues or exposure to microwave radiation), or by exposure to other actinic radiation (such as γ-ray, x-ray, beta particle, or alpha particle radiation). Most generally, the ion modification material can comprise a biologically active component, or one that becomes biologically active as a result of exposure to the charge-injected material. In some invention embodiments it is useful for this biologically active component to be a radioactive component, so that delivery of the charge-injected material to the mammalian body provides the ability to deliver radiation to targeted tissues. Especially for these biological applications, after the contact processes with the ion modification material, excess ion modification material can be usefully removed from the charge-injected material (such as by drying). Prior to exposure to the mammalian body, the charge-injected material thereby obtained can be immersed in another agent that facilitates delivery of the biologically active material to the mammalian body. This agent is typically substantially biocompatible, like normal saline solution. While diverse materials can be used as the charge-injected material for drug delivery, carbon nanotubes and shell-core metal particles are especially useful for some application embodiments, since these materials provide infrared absorption in the transparency region of the mammalian body. For the preparation of suitable shell-core metal particles that can be non-faradaically charge injected using the present art, see C. L. Loo et al., Technology in Cancer Research & Treatment 3, 33-40 (2004) and references therein.

Semiconducting nanoparticles, especially those employed for color-based biochemical sensing, are useful for the practice of invention embodiments. Examples include, but are not limited to, nanoparticles of ZnS, ZnSe, CdS, and CdSe. The particles for these invention embodiments are typically less than 200 nm in their smallest dimension. Using methods that are above-described, such nanoparticles (or functionalized derivatives thereof) can be conveniently charged electrochemically in an electrolyte (either containing the desired counter ion, or a counter ion that can be replaced by the desired counter ion during subsequent processing steps). This charging can be used to modify the dispersability of the charged, dried particles in liquids or melts, including polymer solutions or melts used to form nanoparticle composites. In one application mode, the semiconductor nanoparticles (charge injected using electrochemical processes of this invention) are used in composites that are employed for light emitting diodes and photovoltaic cells. In another application mode, the charge-injected nano particles are used as color-based sensors, wherein the electronic charge injection and associated counter ions effect the aggregation of these particles in response to contact with an analyte (which can be biological). Such aggregation (or the interaction of the analyte with single charged nanoparticles) provides the spectroscopic response used for sensing, which is typically a color change or a change in luminescence.

The charge-injected materials of invention embodiments can be used as scaffolds for the growth of tissue in either culture media or in organisms, including humans. Also, this charge injection can be used to increase biocompatibility for devices implanted in the body. These invention embodiments utilize Applicants' surprising discovery that electrochemically-injected charge is substantially retained when a material is removed from the electrolyte and optionally washed and or dried.

Biocompatibility of the surfaces of devices implanted in the body is improved in some invention embodiments by overcoating these surfaces with a porous material having a high gravimetric surface area, such as glassy carbon. Using the device with the over coated porous material as an electrode in an electrochemical cell, charge is injected predominantly non-faradaically in the porous coating. The type (holes or electron) and degree of charge injection, as well as the nature of the counter ion to the injected charge, can affect biocompatibility. The injected ions can be either those of the original electrolyte or those that substitute for the original ions during subsequent processes, such as by immersion of the charge injected device into a solution containing the replacement ions. As an alternative to this charge injection into porous coatings that are preformed on the article to be implanted, such as a pacemaker or an artificial heart, the electronic charge injection can be in a powder (such as nanofibers) that are first charge injected and then used to overcoat the article. The sign of electronic charge injection is typically positive, although negative electronic charge injection can also be used (with some decrease in the lifetime on injected charge in the body). The counter ions for the electronically injected charge can include various inorganic, organic, and biochemically derived species. Examples are $Na^+$, $Cl^-$, proteins (especially enzymes that are cellular growth factors), antibiotics, DNA, and RNA. Nanofibers (particularly nanofibers configured as porous sheets and macrofibers) are particularly useful as substrate materials for the growth of tissue either in culture media or in animal or human bodies. Considerations on the choice of counter ions and the sign of charge injection are similar to those above-recited for surface coatings for implanted devices.

Applicants' discovery that electrochemically injected charge is stable in the absence of electrolyte also enables the tuning of nanostructured materials properties for materials absorption and desorption, such as for hydrogen storage. The key point here is that charge injection (and associated ion migration) selectively changes the interaction energy of materials with a nanostructured substrate (such as nanostructured fibers, sheets, and powders) and therefore changes the absorption capabilities of the substrate material. Discharge of this injected charge (such as by contacting oppositely charge-injected substrate materials) can aid in the release of absorbed materials.

Materials used for properties tuning by non-faradaic charge injection (including tuning for the above-mentioned chemical and drug release processes) generally have an achievable gravimetric capacitance for predominately non-faradaic charging that is typically above about 0.1 F/g, more typically above about 1 F/g, and most typically above about 10 F/g. By achievable gravimetric capacitance, it is meant the capacitance measured when using an electrolyte and potential range that maximizes non-faradaic charging and still yields predominately non-faradaic charging. The gravimetric surface area of the materials used for properties tuning by non-faradaic charge injection have an achievable gravimetric surface area (measured in nitrogen gas using the standard Brunauer-Emmett-Teller, BET, method) of typically above about 0.1 $m^2$/g, more typically above about 5 $m^2$/g, and most typically above about 50 F/g.

Volatile electrolytes can be removed from the charged electrode material most simply by just evaporating the volatile component of the electrolyte. Alternatively or additionally, the electrolyte can be removed by washing with a second liquid that is typically not an electrolyte for certain invention embodiments. For these invention embodiments this second electrolyte is typically substantially free of any salt. Ideally, this second liquid should be either miscible with the electrolyte or capable of dissolving ions of said electrolyte. This washing step or a sequence of washing steps using either the same or different liquids can be usefully accomplished either before or after an optional step in which the original electrolyte is wholly or partially removed by volatilization.

Rather than removing the original electrolyte from the charge injected electrode, charge injection can be accomplished at a higher temperature where this electrolyte serves as an effective electrolyte and then this original electrolyte can be cooled to a lower material use temperature where the original electrolyte material has such low ionic conductivity that it does not effectively serve as an electrolyte. This low ionic conductivity is preferably below $10^{-6}$ S/cm. This higher temperature is typically one at which the electrolyte is substantially liquid and this lower use temperature is typically one in which the electrolyte is substantially solid. As an alternative to using temperature change to convert a liquid electrolyte to a substantially non-conducting material, this transformation can be accomplished by polymerizing the liquid electrolyte, for example, using thermal annealing, introduction of a catalyst, or exposure to actinic radiation (typically visible, ultraviolet, or higher energy radiation).

The liquid that is used to wash the electrolyte from the electrode is typically removed by volatilization. This liquid used for washing can optionally and usefully be the solvent base of the electrolyte (such as the acetonitrile of an original 0.1M tetrabutylammonium hexafluorophosphate/acetonitrile electrolyte or the water in an original 1 M aqueous NaCl electrolyte). However, in other useful embodiments of the present invention, the liquid that displaces the electrolyte is polymerized while in contact with the electrode material. This polymerization can be accomplished, for example, using thermal annealing, introduction of a catalyst, or exposure to actinic radiation (typically visible, ultraviolet, or higher energy radiation).

Diverse properties can be tuned, and in many cases dramatically changed, as a consequence of the above process for electrochemically injecting charge non-faradaically and retaining this charge in the electrolyte-free state. Some of the effects by which charge injection can change material properties are: (1) the direct effect of changing band filling, (2) the effect of volume expansion and associated dimensional change due to charge injection, and (3) the effect of creating surface dipoles involving the injected electronic charge and correlated ions on the material surface. Material properties tuned by the processes of invention embodiments include, for example, electrical conductivity, absorption and reflectivity (including color), thermopower, thermal conductivity, surface energy, and dielectric constant. Materials with low conductivities in the non-charge-injected state (like forms of carbon, conducting polymers, and doped and undoped semiconductors, exemplified by metal oxides and metal sulfides) can be used for invention embodiments that benefit from large charge-injection-induced changes of conductivity, absorption and reflectivity (including electrode color), thermopower, thermal conductivity, surface energy, or dielectric constant.

Physical properties, such as electrical conductivity, optical absorption, magnetization, magnetoresistance, electromagnetic shielding properties, and the critical temperature of superconducting transition ($T_c$) depend very strongly on the number of charge carriers at the Fermi level. Optional and useful materials of invention embodiments include those that maximize the tunability of these properties that can be achieved by predominately non-faradaic electrochemical charge injection. Such materials include those providing (1) a low concentration of charge carriers (electrons or holes) at the Fermi level for the uncharged state, and (2) a strong dependence of Fermi energy on the amount of charge injection. This strong dependence of Fermi energy on charge injection is typically characteristic of the singularities in density of states found for low dimensional conductors. Hence, 1-D materials (like nanofibers and conjugated polymers like polythiophene) and 2-D layered materials (like cuprates of chalcogenides) are included in some compositions. However, materials that can be intercalated (and thereby charge-injected faradaically) are optionally charged predominately non-faradaically. This can be done by either (1) choosing the potential used for charge injection to avoid proximity to the potentials where faradaic redox reactions occur or (2) by employing anions and cations that have unsuitable size for intercalation under the kinetic conditions used for charge injection. For example, bundled single-wall carbon nanotubes can be intercalated if the applied potential is either too high or too low. This intercalation can be avoided by suitably choosing the potential range so that intercalation does not occur or by using ions in the electrolyte that are too large for facile intercalation (M. Stroll et al., Chem. Phys. Lett. 375, 625-631 (2003)).

Materials used for electronic conductivity tuning by non-faradaic electrochemical charge injection are optionally and preferably semiconductors when the goal is to provide the maximum dynamic range of tunability. Materials having singularities in density of states near the Fermi level can be used as materials having tunable electronic conductivity. These include the various well-known nanofibers, like single-wall and multi-wall carbon nanotube fibers.

The non-faradaically induced increase in electrical conductivity of essentially electrolyte-free materials can be usefully employed for making materials that combine high electrical conductivity with high optical transparency. These transparent conducting electrodes are of major importance for such applications as liquid crystal displays, light emitting displays (both organic and inorganic), solar cells, switchable transparency windows, solar cells, micro lasers, optical modulators, and optical polarizers. Inorganic electrodes like ITO (indium tin oxide) degrade on bending and require costly vacuum based deposition methods. The embodiments of this part of the invention combines Applicants' discovery of processes for dramatically enhancing the electrical conductivity of nanostructured carbon nanotubes with prior-art discoveries related to the application of uncharged nanostructured materials for making transparent conductors.

The prior art invention of A. Rinzler and Z. Chen (International patent number WO 2004/009884 A1 and PCT/US2003/022662 on "Transparent Electrodes from Single wall carbon nanotubes") describes methods for making electronically conducting, transparent SWNT-containing sheets. The described process enables the achievement of percolation between SWNTs in uniform coatings or films. The achieved sheet resistance is in the range of 200 ohm/sq for an optical transmission of 30%, which can be decreased to 50 ohm/sq for very thin films less than a hundred nanometers thick). However, the sheet resistance should be less than 10 ohm/sq for applications in light emitting displays, solar cells, and other current dependent devices.

Presented here are invention embodiments in which the electrical conductivity of single-wall carbon nanotubes is increased by over an order of magnitude, and retain much or all of this conductivity enhancement when the electrolyte is removed. An improvement that Applicants bring is an increase in the level of electrical conductivity that can be obtained, while still maintaining the desired degree of optical transparency. Carbon nanotubes that are non-faradaically injected and largely electrolyte free are especially useful for invention embodiments directed to highly conducting, optically transparent conductors. These conductors can be in the form of sheet composites or sheet coatings. Also, the carbon nanotubes can be single-wall nanotubes, wherein the nanotubes can be either unbundled or having a small bundle diameter. These single-wall carbon nanotubes can be hole injected, since Applicants have found that hole-injected carbon nanotubes provide much more stable electrical conductivity enhancements than do electron-injected carbon nanotubes. In order to insure long lifetimes for these non-faradaically hole-injected carbon nanotubes, it is generally important to use binder materials that do not contain electron donating impurities having redox potentials that enable reaction with the holes on the nanotubes. To insure that this is the case, any binder composition should have sufficiently high ionization potential that electron transfer does not occur to the hole-injected nanotubes. Many conventional polymers, like polyethylene and polypropylene, have this desired characteristic. Conventional methods can be used to treat binder compositions so as to remove trace reactive electron donor impurities that might react with the holes in the hole-injected carbon nanotubes.

The work function of electrode materials generally is very important for applications involving either hole or electron injection in organic light emitting displays and for charge carrier collection for solar cells, as well as for related devices. The non-faradaic charge injection of invention processes provides Fermi level and work function shifts that can be used to optimize this charge injection. The prior art work on multi-wall carbon nanotubes (M. Krüger et al., Applied Physics Letters 78, 1291 (2001)) has shown that the Fermi level increases by up to 0.3-0.5 eV upon electron injection, and decreases by up to 1 eV for hole injection, which will provide corresponding charges in the work function. These prior-art results are from electrochemical charge injection in liquid electrolyte. The enabling improvement provided by the present invention embodiments is that it is shown that the typically required charge injection can be retained in the absence of contacting electrolyte—either solid or liquid state.

The electron-injected electrolyte-free nanotubes (with decreased work function) can be used as electron-injecting electrodes for such devices as OLEDs. On the other hand, the hole-injected electrolyte-free nanotubes (with increase work function) can be used as hole-injecting electrodes. These hole-injected nanotube electrodes can be used to replace ITO, since they also have large achievable work function and can be used as an effective hole injector for OLEDs.

These device applications involving hole-injected and electron-injected electrolyte-free nanostructured materials as charge-injecting electrodes typically utilize device configurations in which an electrochemical potential is applied to the nanostructured material during device operation. This is particularly important for the electron-injected nanostructured electrodes because charge can only be stabilized on these electron-injected electrodes in an inert environment, and oxygen exposure can cause degradation if the degree of electron injection is high. On the other hand, hole-injected nanostructured electrodes can easily function without the need for either a continuously or intermittently applied electrochemical potential to refresh charge injection. Hence, these hole-injected nanotubes can be dispersed in a suitable unreactive binder and used as electrodes for devices, without any need for electrochemical charging after the initial charge injection. Transparent carbon nanotube fiber composites have already been used as replacements for low work function Al or Ag electrodes for plastic donor-acceptor solar cells ("Organic Photovoltaics" Eds. C. Brabec, V. Dyakonov, J. Parisi and N. S. Sariciftci, Springer Series in Materials Science Vol. 60, 2003). These nanotubes were not substantially charge injected. The ability provided by the present invention embodiments is to electrochemically tune the work function of the nanotubes for this application, without compromising desired performance by the need of the prior art for either dopant intercalation or an imbibed electrolyte.

Processes in accordance with some invention embodiments can be used for changing the properties of largely electrolyte-free nanostructured superconductors by substantially non-faradaic electrochemical charge injection. High temperature superconductors are especially useful, such as members of the YBCO family. The most preferred compositions include, for example, $LaSrCuO_2$, $YBa_2Cu_3O_{7-x}$, $GdBa_2Cu_3O_{7-x}$, $BiSr_2CaCu_2O_{8+x}$, and related cuprates. The compositional parameter x is typically in the range of 0.4 to 0.5 for $YBa_2Cu_3O_{7-x}$. Further guidance for the superconductor compositions that are most suitable for electrochemical non-faradaic charge injection of invention embodiments can be found in C. L. Lin et al., Applied Physics Letters 71, 3284 (1997). Although these authors use short-lived photo-injection of charge to modify the superconducting properties, Applicants have found that those compositions that undergo the greatest changes in superconducting properties upon photo-injection will also undergo the greatest changes when using the non-faradaic electrochemical charge invention of the present invention embodiments.

These superconducting oxides have low electron density at the Fermi, so non-faradaically injected charge carriers will significantly change their properties. While the prior art has used charge injection to modify the $T_c$ of superconductors, this prior-art work has not used predominately non-faradaic electrochemical charging of a porous superconductor having a high gravimetric surface area. See, for example, X. Xi et al. in Applied Physics Letters 59, 3470 (1991), who use a non-electrochemical process for switching the superconducting transition temperature of films of $YBa_2Cu_3O_{7-x}$, over a 2 K range. The achieved resistance modulation in the normal state can be as much as 20% and 1500% near $T_c$. Unlike the switching of superconducting properties in the present invention embodiments, the $T_c$ switching observed by Xi et al. is not practically useable for a macroscopic bulk superconducting material and is unstable over the long term if connection to an electrical power source is not maintained.

The non-faradaic charge injection of invention embodiment can be used for tuning superconductors for electronic transport and for electromagnetic wave shielding and propagation for ultraviolet, visible, infrared, radio frequency, and microwave frequencies. A particular application embodiment is as superconducting elements for active filtering, attenuation, phase shifting, and inter-line coupling for microwave transmission lines (such as micro strip line, strip line and co-planar wave guides). Methods for using superconductors for microwave lines and modulated wave guides are well known in the art for the microwave and radio frequency bands, and this technology can be used for application of the non-faradaically charge-injected superconductors of the present invention. Superconductors of the invention embodiments may also be used with photonic crystal arrays involving superconducting and semiconducting elements to provide switching of photonic crystal properties in the optional and preferred EM wavelength bands, such as modulation of either the photonic band gap or the width and cut-off frequency of metallicity gap. Other major applications for materials made by processes of invention embodiments are as superconducting transmission lines, and magnets.

Perovskite manganites with the general formula $R_{1-x}A_xMnO_3$, where R is a trivalent rare earth element and A is a divalent alkali earth element, are included among the preferred compositions, where optionally and most preferably R is La, Pr, Nd, or Sm, A is Ba, Ca, or Sr, and $0.3<x<0.5$. The reason for this preference is the sensitivity of the properties of these materials to EBIG (Electrolyte-Bare Ion-Gated) charge injection, which makes them especially useful for EBIG materials and devices. In fact, EBIG charge injection into these materials can cause transformation between insulating anti-ferromagnetic and metallic ferromagnetic states.

The prior art has shown that the subtle balance between the anti-ferromagnetic insulating state and the ferromagnetic metallic state can be shifted by application of external perturbations, like magnetic field (A. J. Millis, Nature 392, 147 (1998) and Y. Tomioka et. al., Phys. Rev. B 53, R1689 (1996)); electric field (A. Asamitsu et al., Nature 388, 50 (1997)); high pressure (Y. Morimoto et. al., Phys. Rev. B 55, 7549 (1997)); exposure to X-rays (V. Kiryukhin, et. al., Nature 386, 813 (1997)); or exposure to visible light (K. Miyano, et al., Phys. Rev. Lett. 78 (1997) 4257 and M. Fiebig, et al., Science 280 1925 (1998)).

In contrast with these prior-art approaches for the perovskite manganites, Applicants either induce or sensitize transitions between the insulating antiferromagnetic state and the conducting ferromagnetic state by using non-faradaic electrochemical charge injection that is either tuned or maintained in the absence of contacting electrolyte. The non-faradaically electrochemically-induced phase transition of invention embodiments can be used advantageously to replace the dielectric-based electric field effects of the prior art (S. Q. Liu et. al., Appl. Phys. Lett. 76 2749 (2000) and J. Sakai et. al., J. Appl. Phys. 90, 1410 (2001)) in high density, nonvolatile memory devices. The colossal magnetoresistance of the perovskite manganites can be tuned by the EBIG (electrolyte-bare ion-gated) methods of invention embodiments. This tuning can be used for applications where a perovskite manganites acts as a device channel, which is switched by non-faradaic electrochemical charge injection from insulating and anti-ferromagnetic to metallic and ferromagnetic. Such tuning is usefully employed for the spintronic devices of invention embodiments, especially where a perovskite manganite is between a magnetic source and drain. EBIG tuning changes the sensitivity of the perovskite manganites to transitions induced by either light or magnetic fields, and these effects can be usefully employed in devices. Additionally, EBIG materials can also be used for the control of electromagnetic wave propagation for ultraviolet, visible, infrared, radio frequency, and microwave frequency regions, since modulation of electrical conductivity also changes the refractive index, dielectric constant, absorption, and optical reflectivity.

Devices of invention embodiments generally include at least three elements: a working electrode, a counter electrode and a possibly multi-component electrolyte material that helps provide an ion conducting path between the working and counter electrodes. Electrochemical charge injection in an electrolyte-free electrode component is accomplished by applying a voltage between at least two electrodes (a working electrode and a counter electrode) that are both in partial contact with an electrolyte, where an uninterrupted path for ionic transport exists between these two electrodes. Charge injection into regions of the electrode that are not contacted with electrolyte occurs, in most of the invention embodiments, by diffusion of the dopant ions on the surface of a nanostructured material, such as a carbon nanofiber used as the channel of a field-effect transistor.

For invention embodiments where very high electrochemical charge and discharge rates are desirable, the rate of surface migration of ions in an electrochemical electrode can be increased. Using at least two electronic contacts (typically at close to opposite ends of the electrochemical electrode), a suitably high current is applied along the electrochemical electrode in the direction where ion migration is desirable. This current is referred to herein as the intra-electrode ion-migration enhancement current. Two processes produce enhanced ion migration rate from this applied intra-electrode electronic current. The first is electrode resistive heating, which increases ion mobility. The second is the "electron wind force". This electron wind force is well known to cause failure of small cross-section metal wires on circuit boards (through causing migration of atoms in the wire by the combined effects of electrostatic interaction with the electric field and momentum transfer with electronic carriers due to scattering). Reversing the direction of intra-electrode ion-migration enhancement current reverses the direction of the electron wind force for a given ionic species (together with possible solvation sphere), so increased migration rates can be obtained for both electrode electrochemical charging and discharging. To achieve this beneficial effect of rate enhancement on both electrode charging and discharging, the direction of the intra-electrode ion-migration enhancement current can be reversed in direction when transitioning between electrochemical charge and discharge processes. Use of these physical processes to enhance charge and discharge rates for an electrochemical device is quite useful and has not been previously shown in the prior art.

Figure 9:
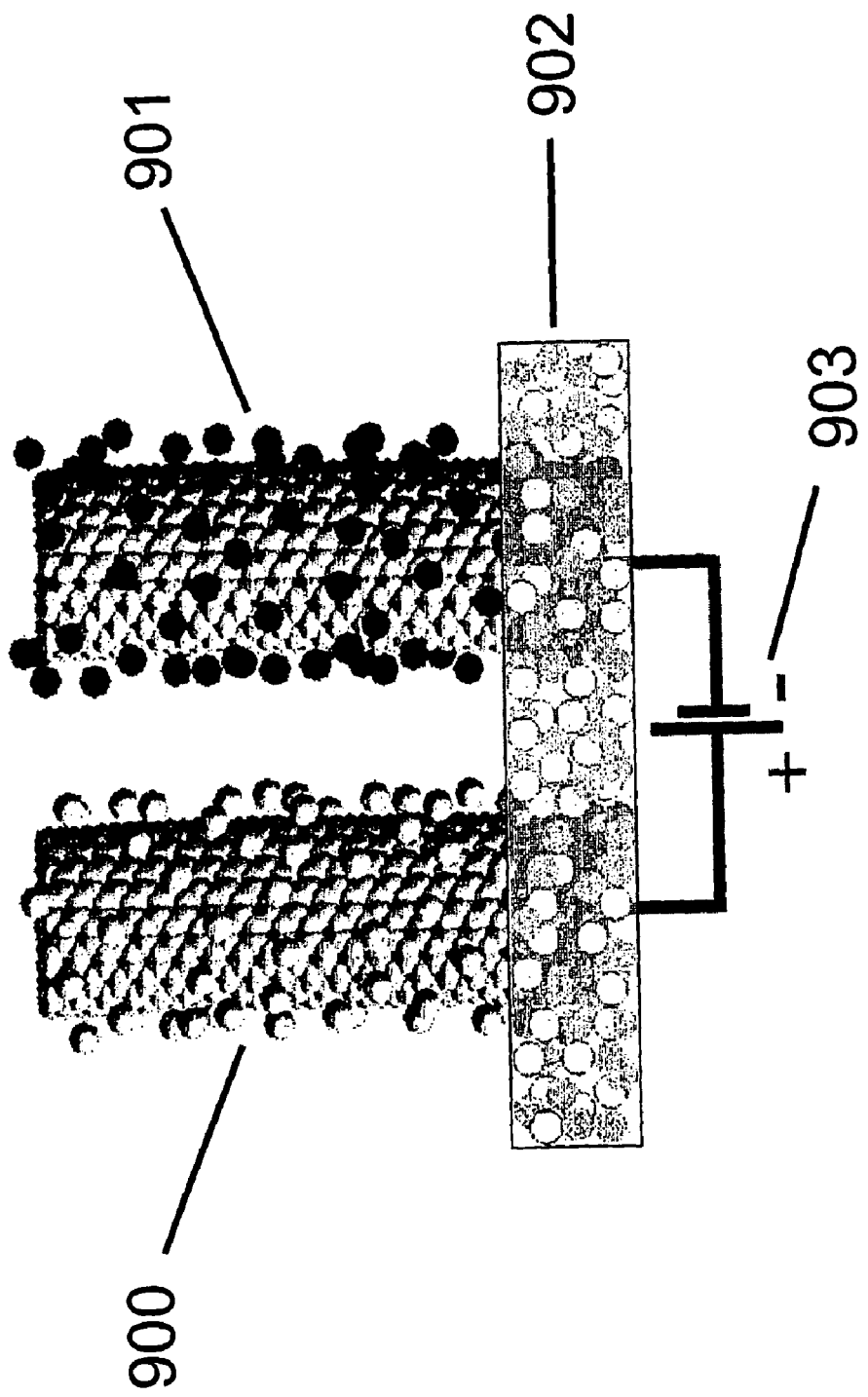
FIG. 9 uses carbon nanotube electrodes to schematically illustrate a means used in invention embodiments for injecting charge into regions of a high-surface-area electrode that is not directly contacted with electrolyte.

FIG. 9 schematically illustrates a means used in invention embodiments for injecting charge into a high-surface-area electrode that is only partially contacted with electrolyte. The charged state is pictured, where 900 is the electrode with positive injected electronic charge (electrostatically balanced by pictured anions that are in close proximity, symbolized by the white spheres) and 901 is the counter electrode with negative injected charge (electrostatically balanced with pictured cations, symbolized by black spheres). The nanostructured electrode materials for both 900 and 901 are single-wall nanotubes, although virtually any type of nanostructured conductor can be used (as long as this conductor does not undergo degradative intercalation in the potential range of device operation). As will be later described, material selection depends upon the device type and performance needs. Component 902 is an electrolyte, which only partially contacts electrodes 900 and 901. Element 903 is the variable voltage power source and associated leads that electrically connect to the two nanotube electrodes of 900 and 901. An applied potential from 903 injects charge of opposite sign in the two pictured single-wall carbon nanotube electrodes 900 and 901. The required counter ions diffuse along the nanotube surfaces to enable this electronic charge injection. Reversing the direction of current flow, by changing the applied potential, causes the ions to diffuse from the nanotube surfaces back to the electrolyte 902.

FIG. 9 pictures an arrangement where the ions used for electrode charging are stored in the uncharged state in the electrolyte. Alternatively, ions can be shuttled between the electrode elements 900 and 901 (or from and to optional additional electrodes) during the charge and discharge processes. Additionally, a combination of these electrolyte storage and inter-electrode shuttle processes can be employed. As will be later elaborated, one or more of the electrodes in an electrochemical device can be predominately faradaically charged and discharged during device operation. Typically, a region of at least one device electrode is predominately non-faradaically charged and discharged during normal device operation.

Figure 10:
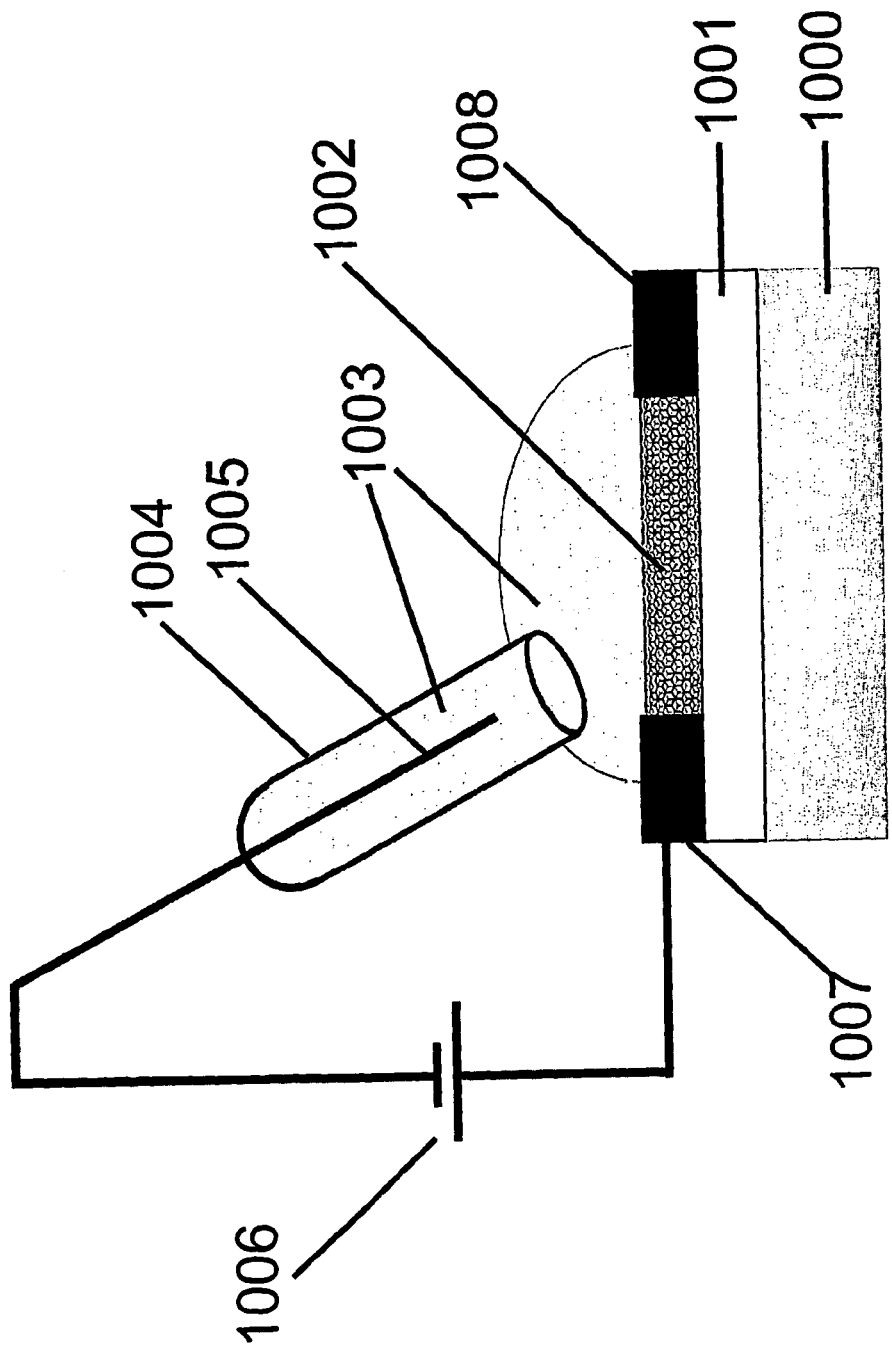
FIG. 10 schematically illustrates a prior-art device technology for using electrochemical double-layer charge injection to switch the conductivity of a semiconducting channel material. This device uses the prior art technology of liquid-ion gating, which means that the gate is immersed in a liquid electrolyte that provides the necessary ions as liquid state species.
Figure 11:
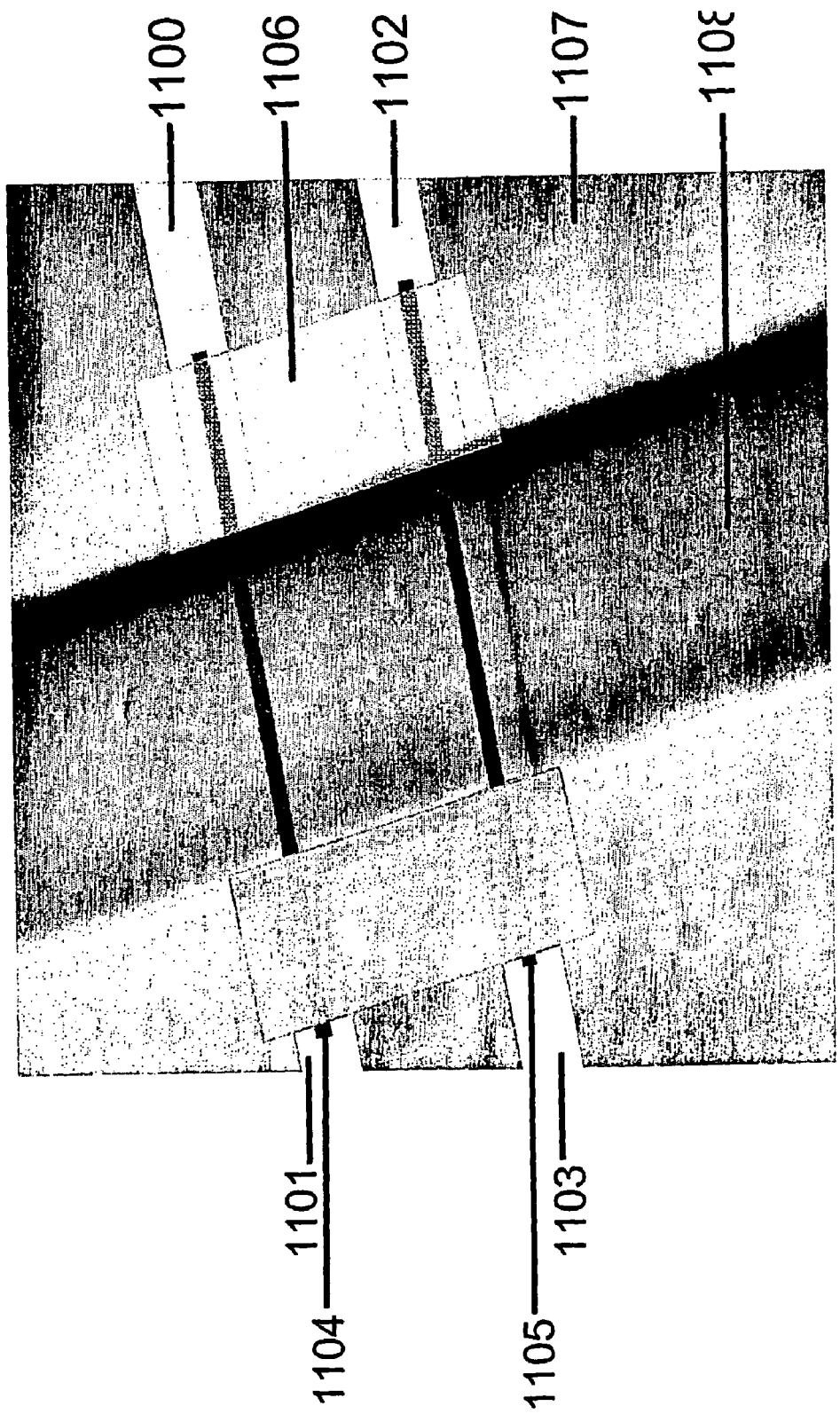
FIG. 11 schematically illustrates a first electrochemical transistor device of the present invention that does not use liquid-ion gating, which could be used for information storage, electronic switching, or gas sensing.

For comparison with the electrochemical semiconductor device of the present invention shown in FIG. 11, FIG. 10 illustrates a prior-art electrochemical semiconductor transistor device. The illustrated prior-art device of FIG. 10 is referred to in the literature (M. Krüger, Applied Physics Letters 78, 1291-1293 (2001)) as being a "liquid-ion gated" device. The device is separated from the substrate 1000 by an insulating layer 1001 (typically $SO_2$). The device channel and an electrochemical electrode (1002) is a semiconducting carbon nanotube, which is contacted by metal source and drain electrodes (1007 and 1008, respectively). The device is liquid-ion gated by using the variable potential source 1006 and associated wiring to apply a potential between the micropipette (1004) enclosed Pt wire electrode 1005 and the carbon nanotube electrode 1002, which is analogous to the channel of a conventional field effect transistor. The electrolyte 1003 covers both the nanotube channel electrode and the Pt wire counter-electrode 1005. The device operates by using the power or signal source of 1006 to electrochemically inject charge into the nanotube electrode/channel 1002. This injected charge changes the electrical conductivity of the nanotube channel 1002, thereby varying the current that flows through the channel in response to a voltage difference applied between source electrode 1007 and drain electrode 1008. This device is called a liquid-ion gated FET, since the nanotube channel 1002 is immersed in a liquid electrolyte and the ions in this electrolyte are needed for the charge injection (i.e., gating) process. This or other prior art does not recognize that electrochemical double-layer charge injection can result for electrode regions that are not in electrolyte, which is the reason for the illustrated complete immersion of the nanotube in the electrolyte. This immersion of the channel 1002 in a liquid electrolyte is clearly problematic for ordinary transistor applications. The device of FIG. 10 could be used like a Chem-FET (chemical sensor based on a FET) for detecting materials dissolved in the electrolyte, by using the effect of these materials on double-layer charge injection. However, if the material to be detected is a gas, this material must first dissolve in the electrolyte—which decreases device response rate and sensitivity.

FIG. 11 schematically illustrates an electrochemical transistor of the present invention embodiments that is not liquid-ion gated. This is an EBIG device since the electrolyte is not deposited to completely overlap the device channel, and the region of the device that is bare of electrolyte facilitates device function. The device is built over a trench (1108) in an insulating substrate (1107). There are two device channels, and neither of these channels is in contact with a liquid electrolyte. More generally important, the component of each channel that largely determines gate resistivity is not surrounded by either a liquid electrolyte or a solid electrolyte—although at least an ion component of this electrolyte must be contacting (together, optionally, with solvating species). There are two source and drain electrodes (1100 and 1101, respectively) for the first leg of the device and two source and drain channels (1102 and 1103, respectively) for the second leg of the device. Likewise there are two semiconductor channels. The channel for the first leg of the device (1104) and the channel for the second leg of the device (1105) can be, for example, nanofibers (such as carbon SWNTs). A solid-state electrolyte (1106) lays over part of the source and drain electrodes and the channel for each leg of the device.

Device operation is as follows: Application of a voltage difference between electrode 1100 and 1102 (or gate electrode 1100 and 1103) causes predominately non-faradaic charge injection of opposite sign in channels 1104 and 1105. This charge injection is enabled by the surface diffusion of cations (to electrostatically compensate for motion of electrons) for the more negatively charged channel and by the surface diffusion of anions (to electrostatically compensate hole motion) for the more positively charged channel. This charge injection in the active channel lengths (predominately the channel lengths that are suspended over trench 1108) changes in a controllable way the electrical conductivity of the channels, which is indicated by a change in the current passing between electrodes 1100 and 1101 in response to an applied potential between these source and drain electrodes (and between 1102 and 1103 in response to an applied potential between these electrodes).

The device of FIG. 11 (and a related device of FIG. 12) can be operated as a replacement for a field-effect transistor, or in such applications as information storage or gas sensing. Because of the dual-leg nature of the FIG. 11 device, this device provides two transistor elements, two information storage elements, and two sensors that are controlled in a correlated manner.

When used as a chemical sensor for gas state species, a gas phase species interacts with the channel in a way dependent on the charged state of this channel, to thereby provide a change in the resistivity of this channel. Importantly, this and related devices of invention embodiments can be used to do something that has heretofore been impossible—to do the equivalent of cyclic voltammetry for substances that are directly delivered to the device channel (or channels) in a gaseous state. This unprecedented device capability results from the fact that materials in the environment of the channel will undergo redox reaction with charges on the channel.

Like for ordinary liquid state cyclic voltammetry, the existence and rate of such reaction for a particular species in the gaseous state will depend upon the redox potentials for these species. In standard liquid-state cyclic voltammetry, one scans electrode potential at a constant rate and then plots the resulting inter-electrode current flow versus the applied potential. This process can be used for the present cyclic voltammetry, with the important difference that the sensed material is in the gas phase. For the device of FIG. 11 and devices of related invention embodiments, additional sensor information can be collected that helps uniquely characterize gas phase species. This information includes the effect of such gas-state-delivered species on the channel resistance as a function of channel potential, which is typically measured with respect to a reference electrode. Instead of detecting redox processes by using voltage scans and detecting the resulting current flow, a desired current can be caused to flow between electrodes, and the resulting potential of working and reference electrodes can be monitored versus time. Additionally, resistive or optical heating of the channel can be used to cause desorption of materials from the channel, and thereby provide another means for characterizing an analyte.

The device pictured in FIG. 11 does not provide a reference electrode, which is typically used in liquid state cyclic voltammetry. Such a reference electrode, or more than one reference electrode, can be usefully incorporated in the device of FIG. 11 by including a reference electrode material (such as a platinum wire or a platinum film) in electrolyte 1106. This reference electrode (or a multiplicity of such reference electrodes) should not be in electrical contact with other electronically conductive elements of the device. Measurement of the potential of a channel with respect to a reference electrode (which can be located in close proximity) enables placement of channel potentials on an absolute scale, so that the redox potentials of detected gas phase species can be most reliably determined. The two channel materials in FIG. 12 need not be identical or even comprise a nanofiber. Specifically, the use of film strips for one or more of these channels is also included in some invention embodiments. However, these channel materials should typically have both semiconducting and highly conducting states and the possibility of transitioning between these states as a result of charge injection. One of these channel materials can optionally also be a material that is predominately charged faradaically in the potential range of device operation, such as a conducting organic polymer or vanadium pentoxide nanoribbons (see G. Gu et al., Nature Materials 2, 316-319 (2003) and provided references for description of the synthesis, properties, and self-assembly of these vanadium pentoxide nanoribbons).

Figure 12:
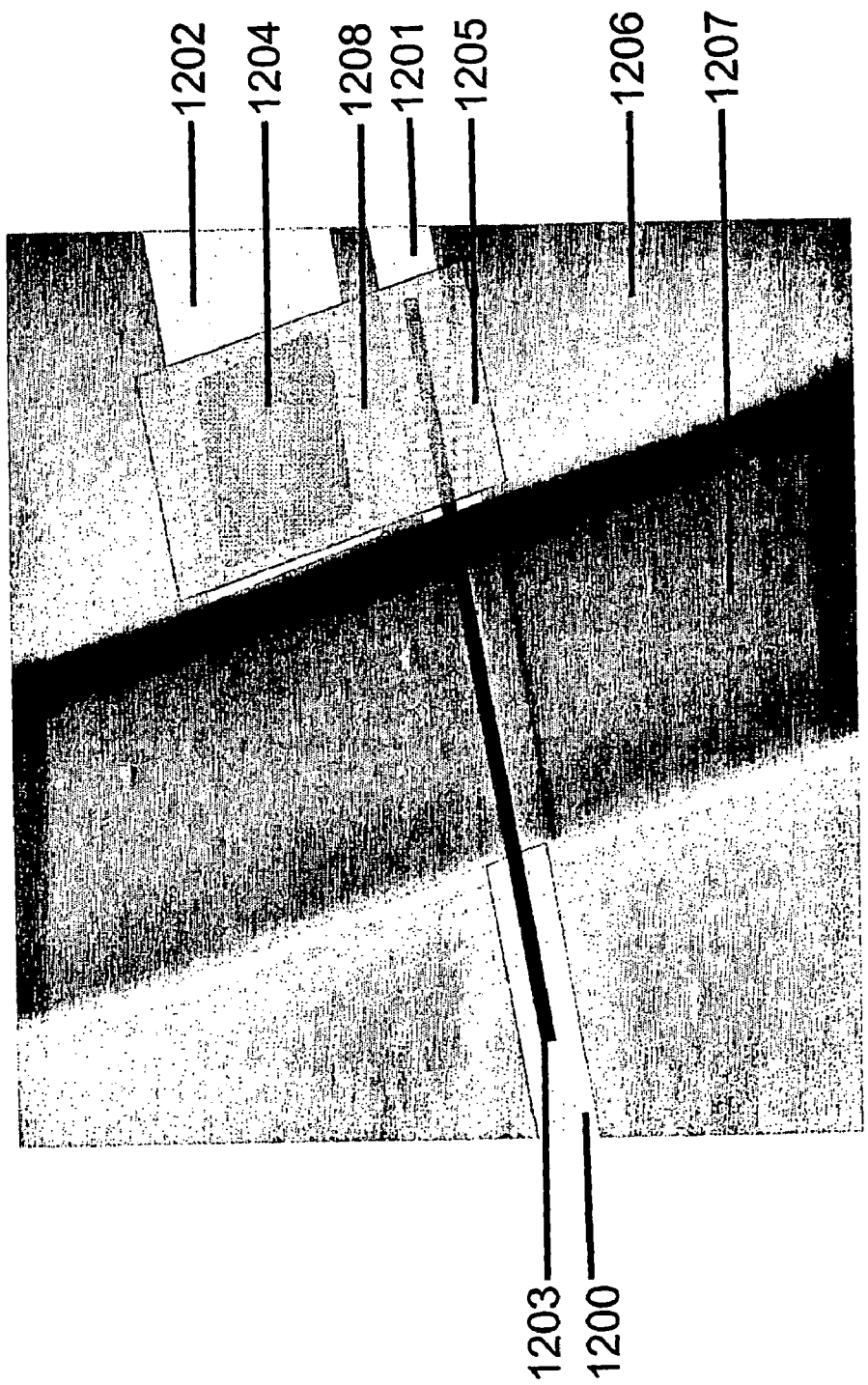
FIG. 12 schematically illustrates a second electrochemical transistor device of the present invention that does not use liquid-ion gating, which could be used for information storage, electronic switching, or gas sensing.

FIG. 12 schematically illustrates a second electrochemical transistor device of the present invention that does not use liquid-ion gating, and which could be used for information storage or gas sensing. Like the device of FIG. 11, this is also a EBIG device—but unlike the device of FIG. 11 the present device has only one channel. The device is configured over a trench (1207) in an insulating substrate (1206). The operation and benefits of this device are similar to that of the device in FIG. 11. A potential applied between gate electrode 1202 and source electrode 1201 controls the amount of charge injection in the channel 1203, which can be a semiconductor when there is no charge injection. This charge injection charges the electrical conductivity of the channel, which is measured by applying a voltage between source electrode 1201 and drain electrode 1200 and measuring the resulting current flow through channel 1203. A material 1204 capable of charge injection overlies the gate electrode and is electronically part of this gate electrode. This material can undergo charge injection either predominately non-faradaically or predominately non-faradaically in the gate-source voltage operation range of the device. The solid-state electrolyte 1208 contacts the material 1204 and the channel material 1203, and provides an ion-conducting path between these elements. However, the measured conductivity of the channel is in large part determined by regions of the channel that do not contact the electrolyte, and the charging of this channel can be predominately non-faradaic in the typically utilized operation range of the device.

Well-known prior-art methods can be used for the fabrication of the devices of FIGS. 11 and 12, and these methods will be later provided in a general discussion of methods generically useful for the fabrication of devices from material elements that can have nanoscale dimensions. Examples of the many dozens of papers in the literature that teach one skilled in the art to fabricate individual nanofiber devices are J. A. Misewich et al., Science 300, 783-786 (2003), L. Gangloff et al., Nano Letters 4, 1575-1579 (2004), and G. S. Duesberg et al., Nano Letters 3, 257-259 (2003).

Devices like that shown in FIG. 12 can also be used a chemical sensors of materials that are delivered in liquid states. A variety of processes can be used for the sensing. One process is ion exchange between the channel material and ions of the analyte. Another process is reaction of ions of the analyte with ions originally present as counter ions to the electronically injected charge. A third process is redox reaction of injected charge with the analyte. Selectivity of response can be achieved for sensor applications by incorporating biochemically selective species in the device channel material, such as DNA, RNA, and polypeptides (including, for example, antibodies, enzymes, and aptamers). This incorporation can optionally be accomplished for the device channel by exposure of the device channel in the non-faradaically charge injected state to large biological molecules, like DNA, RNA, and polypeptides. Such exposure can result in either the replacement of the original ions with such large molecules in the charged state or reaction of the original ions with these large molecules to produce new ion types.

These biological molecules (like DNA, RNA, and polypeptides) are normally charged, so they are suitable counter-ions to electronic materials injected in an electrode material. Also, they can provide recognition functions that are very useful for sensing. However, because of large molecular size they do not have high mobility on surfaces. Hence, these materials are most preferably delivered to a surface (such as a device channel) from a liquid media. This delivery (such as from normal saline solution) can be optionally accomplished during device fabrication, and this liquid and unneeded salt can be optionally removed later during device fabrication by evaporation and washing processes. Because of the low mobility of these large biological molecules on surfaces, switching of the degree of ionic charge on these molecules during device operation is typically accomplished by using electrolytes that provide ionic species having high mobility, like the $H^+$ ion in Nafion. In such case, the electronically controllable degree of incorporation of the $H^+$ ion in the biomolecules determines the amount of ionic charge on the biomolecules, which in part determines the sensitivity of a channel comprising such a biomolecules to analytes, such as a structurally matched strands of DNA. Hybridization of a DNA strand on a device channel with an analyte DNA strand is an especially useful sensing mode.

Is well known in the prior art that faradaic charge injection can profoundly affect the optical properties of material and that these faradaically-changed optical properties can be maintained in the absence of an electrolyte. However, prior-art investigators have not discovered that optical properties changes can result from non-faradaic charge injection that is accomplished without direct contact of an ionically conducting material (such as an electrolyte or electronically intercalated conducting polymer).

Figure 13:
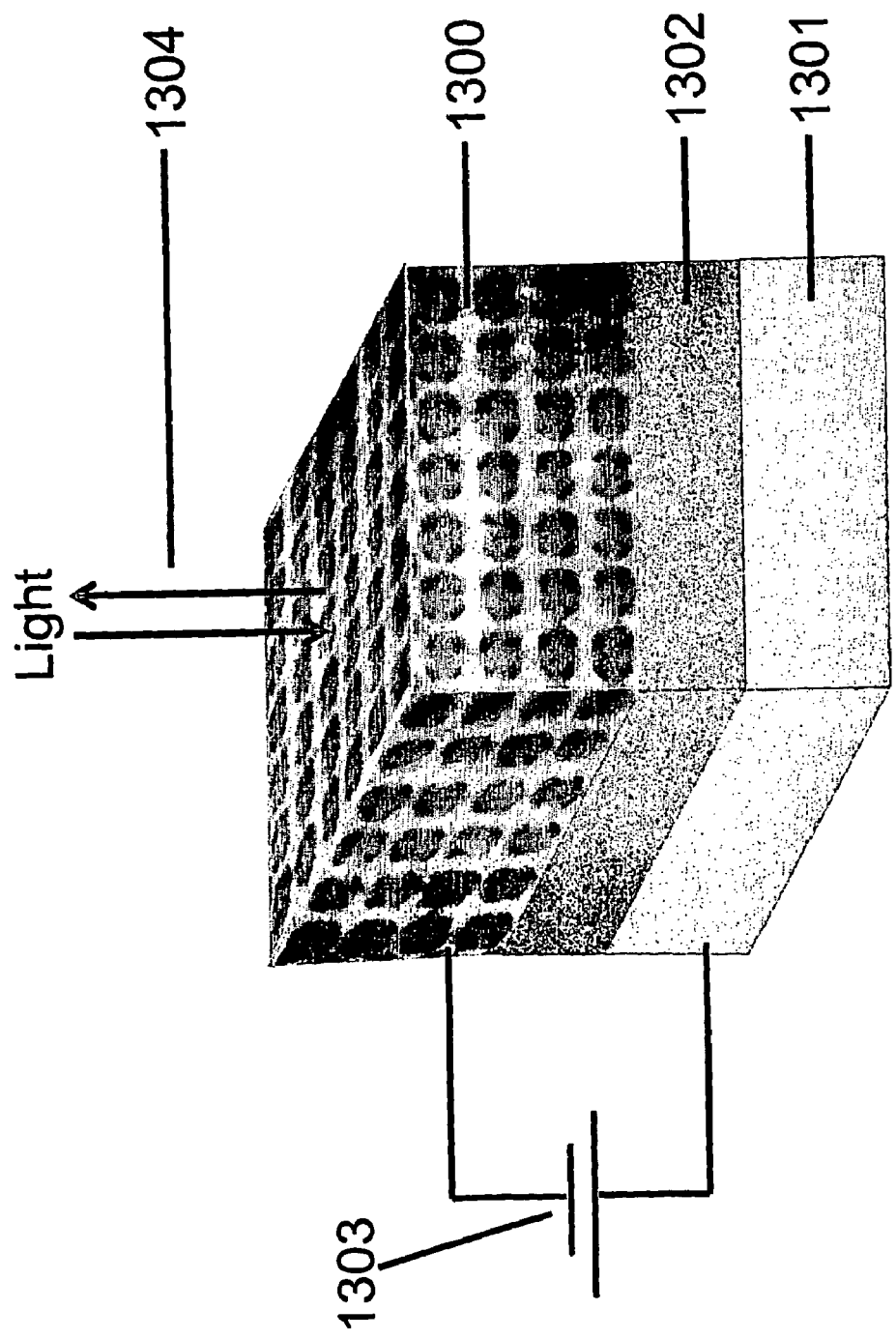
FIG. 13 schematically illustrates an optical gas sensor, based on the surface-enhanced Raman effect, that uses electrochemically controlled charge injection in a metallo-dielectric photonic crystal to optimize sensitivity and species selectivity.

The optical device schematically illustrated in FIG. 13, which is illustrative of many related devices of the invention embodiments, utilizes the above-described discoveries of Applicants'. Devices of this and related types of the invention embodiments provide the switching or optical properties of a material region that is not directly contacted with an electrolyte or an intercalated material that provides ion transport. Typical applications of these devices are gas sensors based on surface enhanced Raman (SERS) or fluorescence, infrared camouflage layers, and electronically switchable photonic crystal mirrors.

FIG. 13 schematically illustrates an optical gas sensor, based on the surface-enhanced Raman effect, that uses electrochemically controlled charge injection in a metallo-dielectric photonic crystal to optimize sensitivity and species selectivity. The desired device performance enhancement originates from a number of possible effects, including (1) the charge-injection-tuned pickup of gas phase components that are to be sensed, (2) the optimization of the resonant effect of SERS by charge-injection-based tuning of plasma frequency (and therefore the resonance enhancement of the SERS effect), and (3) concentration of the gas-phase components on the high surface area of the electrode used for sensing.

Element 1300 of FIG. 13 is an inverse-lattice photonic crystal, which also functions as a working electrochemical electrode. This element is preferably a conducting photonic crystal having a void volume of greater than about 50%. This element is optionally an inverse-lattice photonic crystal that is comprised of a high reflectivity metal, like silver (which is especially suitable). Element 1302 is a solid-state electrolyte that contacts the photonic crystal. The solid-state electrolyte preferably has low electronic conductivity and an ionic conductivity of above $10^{-4}$ S/cm at room temperature. Element 1301 is a counter electrode to the working electrode 1300, which is also a photonic crystal. This counter electrode can be one that operates predominately faradaically or predominately non-faradaically. Intercalated conducting polymers that undergo predominately faradaic charging during device operation or very high surface area non-intercalated materials (like nanoporous Pt or nanofibers) are especially suitable for use as this counter-electrode. This counter electrode element 1301 can optionally be a second photonic crystal that can be predominately charged non-faradaically during device operation. The benefit of using two photonic crystals is that one obtains two materials for SERS sensing (one with negatively injected charge and the other with positively injected charge), which can be simultaneously probed optically during device operation. Element 1303 is a variable voltage or variable current power supply, and associated electrical wires to the working electrode (1304) and the counter electrode (1301). Item 1304 in FIG. 13 indicates the input and output of light to the photonic crystal, which need not be in the pictured orthogonal direction to the photonic crystal surface. The electrolyte element 1302 typically includes a reference electrode (not shown) for placing measured potentials on an electrochemical scale—so that the degree of charging can be determined from the measured potential of 1300 with respect to this reference electrode, and used to control the degree of charge injection for 1300.

Various methods well known in the art could be used to make the device of FIG. 13 and related devices, as either devices that are macroscopic or macroscopic in lateral area, and optionally probed either above the diffraction limit of light or using well known photon tunneling methods (that avoid the diffraction limitation of light). Methods for fabricating a metallo-dielectric photonic crystal 1300 (which can be from a high reflectivity metal like silver) are described, for example, by A. A. Zakhidov et al., U.S. Pat. No. 6,261,469 and U.S. Pat. No. 6,517,762, L. Xu et al., Advanced Materials 15, 1562-1564 (2003), L. Xu et al., J. Am. Chem. Soc. 123, 763 (2001), and O. D. Velev et al., Nature 401, 548 (1999). Fabrication of the device can proceed, for instance, by using methods of these references (and optionally using conventional lithographic methods) to make photonic crystals 1300 or arrays of photonic crystals (if an array of many devices are required) on a substrate. Subsequent deposition of electrolyte 1302 and counter electrode 1301 (for instance, a conducting organic polymer) can, for instance, be accomplished by spin coating 1301 and 1302 (again with optional usage of conventional lithographic methods to define device size) on 1300. The thereby fabricated devices can be transferred to a second substrate using conventional wafer bonding methods, followed by either chemical or mechanical removal of the first mentioned substrate, so that each photonic crystal is obtained as the top layer on the second substrate. The electrical connections to the photonic crystal 1300 and the conducting polymer in each device can then be lithographically defined. More simply, employing a slab of photonic crystal as the substrate and depositing the electrolyte 1302 and counter electrode 1301 on one side of this substrate can eliminate the need for these first and second substrates.

Application of the device of FIG. 13 as a SERS based gas sensor is as follows: Applying a potential between the working electrode 1300 and the counter electrode 1301 injects charge into the photonic crystal electrode (1300), thereby modifying the adsorption of targeted materials onto the external and internal surfaces of 1300 and appropriately shifting the frequency of surface plasmons. Different gas components can be selectively detected by measuring the SERS spectra during scanning the degree of charge injection in 1300. Either this device scanning is at a sufficiently slow rate that surface adsorption and desorption can be accomplished at ambient temperature or heating of component 1300 can be used to accelerate these surface absorption and desorption processes. This heating can be accomplished either electrically by resistance heating or by the heating effect of radiation adsorption. Monitoring the SERS spectra during heating and cooling processes is usefully employed for obtaining additional information about the composition of the sensed gas. Additionally, measurement of current flow between the working and counter electrode as a function of the potential of these electrodes (or the electrode potential versus applied inter-electrode current and time) can be used in combination with the SERS spectra to characterize analytes.

Like for most of the devices of invention embodiments, the device of FIG. 13 can be operated either in a "rocking chair device" mode or in an "electrolyte ion storage" mode, or as a combination thereof. In the rocking chair mode, ions are shuttled between working and counter electrodes during device operation, and the function of the electrolyte (1302) is just to electronically insulate the working and counter electrodes and to enable ionic transport between them. In the electrolyte ion storage mode, the electrolyte stores the ions that are injected into opposite electrodes during device operation (typically anions for one electrode and cations for the opposing electrode for a given change in inter-electrode operation voltage). If there is only one mobile ion in the device system, then the device operation will be by the rocking chair mode, which requires only sufficient electrolyte 1302 to insure that the working electrode (1300) and the counter electrode (1301) are electronically insulated with respect to each other and that these electrodes are intimately contacted by the electrolyte. Although device operation in either of these modes can be usefully employed for this and other devices of invention embodiments, device operation in predominately the electrolyte storage mode can be advantageous. The reason is that operation in strictly a rocking chair device mode requires that at least one of these electrodes is charge injected during device fabrication. Operation in the electrolyte ion storage mode requires electrolytes in which both anions and cations are mobile. This contrasts with the case of fuel cell devices of invention embodiments (based on either hydrogen or hydrocarbon fuels), where electrolytes providing predominately $H^+$ ionic conduction are optional and more preferred, because of the need for $H^+$ ion conduction for these fuel cells and the relatively high electronic conductivities of many $H^+$ transporting electrolytes.

Devices having the basic configuration shown in FIG. 13 can also be used to switch other properties of the working electrode of this figure, especially magnetic properties, electrical conductivity, microwave absorption, surface energy, thermal diffusivity and thermal conductivity, thermopower, the existence and characteristics of superconductivity, and surface friction coefficients. For all of these application modes except switching surface friction and switching surface energy, it is advantageous that the working electrode material comprises at least 20% void volume. More advantageously, the void volume is at least about 50%, and most advantageously, this void volume is at least about 75% for the working electrode. Specific compositions suitable for these types of devices are listed elsewhere in this section.

The presently discovered ability to electrochemically inject charge into electrode regions that are not in direct contact with electrolyte is especially useful for fuel cell devices. According to conventional thinking, fuel cell redox reactions (oxidation or reduction of fuel cell reactants) occur at locations where the catalyst, fuel cell reactant, electrolyte, and electrode come in joint contact. The device embodiments in the fuel cell area utilize Applicants' discovery that redox reactions (either faradaic or non-faradaic) can occur for electrode regions that are not in contact with electrolyte. One consequence of this discovery are devices providing greater catalyst utilization, since efforts to at least partially contact the electrode with electrolyte results in many catalyst particles being buried in electrolyte, thereby making these catalyst particles inactive—since they are not exposed to the fuel cell reactant (which is often a gas). The result of ineffective use of catalyst is high catalyst cost for the fuel cell. Another consequence of the discoveries used in invention embodiments is high achievable gravimetric current densities, since a high gravimetric surface area electrode is used and most of the catalyst on this surface area is active.

Figure 14:
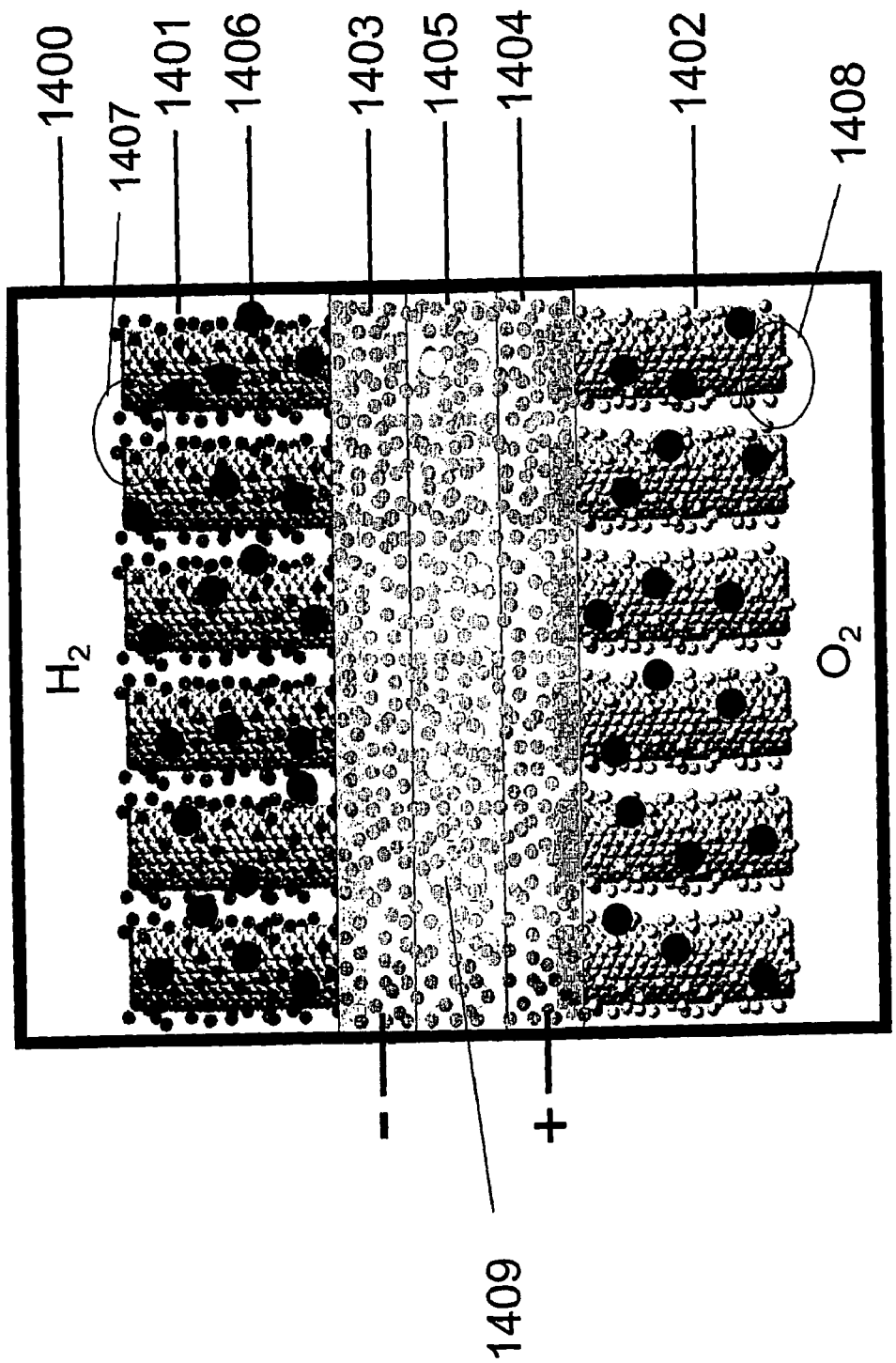
FIG. 14 schematically illustrates a fuel cell of invention embodiments. Unlike the case of prior-art fuel cells, the fuel cell redox reactions predominately occur in the gas phase (on surfaces of carbon nanotubes that are exposed to the $H_2$ and $O_2$ gas) without directly contacting electrolyte.

FIG. 14 schematically illustrates a fuel cell in accordance with invention embodiments, which is enclosed by element 1400. Elements 1401 and 1402 are carbon nanotube forests along with associated $H^+$ cations (1407) and $O^{-2}$ anions (1408) resulting from redox reaction of the fuel components ($H_2$ and $O_2$). By carbon nanotubes forests it is meant an array of vertically aligned nanotubes. These forests contain catalyst particles 1406, such as Pt nanoparticles. Elements 1403 and 1404 are electronically conducting sheets that are $H^+$ ion conductors (such as partially protonated, conducting polyanaline) that are electrically contacted on the left to withdraw the electrical energy produced by the fuel cell. These sheets (1403 and 1404), which make electrical contact to the nanotubes, are separated by a sheet (1405) of a proton-conducting electrolyte of the type used for conventional fuel cells, such as hydrated Nafion. The large spheres 1409 symbolize the negatively charged polymer in this electrolyte. This fuel cell works by the oxidation of $H_2$ to produce protons ($H_2 \rightarrow 2H^+ + 2$ electrons) on the top nanotube forest 1401 and by the reduction of $O_2$ to produce $O^{-2}$ ($O_2 + 4$ electrons$\rightarrow 2O^{-2}$) on the bottom nanotube forest (1402). Unlike in the case of prior art fuel cells, these redox reactions predominately occur in the gas phase (on surfaces of the nanotube forest that are exposed to the $H_2$ and $O_2$ gas). $H^+$ ions transverse the electronically and ionically conducting sheet 1403, the electrolyte sheet 1405 (ionically conducting), and the electronically and ionically conducting sheet 1404 to react with the $O^{-2}$ ions to produce an overall cell reaction ($O_2 + 2H_2 \rightarrow 2H_2O$). The reduction at electrode 1401 and the reduction at electrode 1402 provides a cell potential of approximately a volt that produces a current through electrically powered devices that are attached to the indicated + and − electrodes (shown on the left hand side of the figure).

Various methods well known in the art can be used to fabricate the fuel cell device of FIG. 14. For example, the synthesis of either single walled or multiwalled nanotube forests (like the pictured nanotube arrays) by chemical vapor deposition (CVD) and by plasma-enhanced CVD is described in the literature by various authors (see S. Fan et al., Science 283, 512-(1999), A. M. Casell et al., Langmuir 17, 260-(2001), and L. Delzeit et al., J. Appl. Lett. 91, 6027-(2002)). A conducting polymer (like conducting polyaniline) can be chemically polymerized, deposited from solution, or electrochemically polymerized on top of the nanotube array that is on the growth substrate. Then the conducting polymer with attached nanotube forest can be stripped from the growth substrate to free the combined elements 1401 and 1403. The nanotube forest 1402 and contacting conducting polymer 1404 can be analogously fabricated. Both of these nanotube forests and supporting conducting polymer layers can be connected on opposite sides of a freestanding polymer electrolyte membrane 1405 to thereby complete the complicated aspects of device fabrication. This connection can be made, for example, by using a solvent or swelling agent to soften either the electrolyte layer or the conducting polymer layers 1403 and 1404 (or both), so lamination of the electrolyte and conducting polymer layers is facilitated. The nanotube forest electrode 1401 can be optionally replaced with various other nanostructured materials, such as the porous carbon networks loaded with catalyst. See A. A. Zakhidov et al. in Science 282, 897 (1998), U.S. Pat. No. 6,261,469, and U.S. Pat. No. 6,517, 762 and J.-S. Yu et al., J. Am. Chem. Society 124, 9382-9383 (2002) for details on how these porous carbon networks can be synthesized by opal templating, and filled with catalyst particles.

While the fuel cell reactants shown for the device are $H_2$ and $O_2$ (which can be oxygen in air), other fuel cell fuel couples (in either gaseous or liquid states or a combination thereof) can be more generically used for invention embodiments. These include, for example, methanol and hydrazine and the oxidant hydrogen peroxide. The fuel component that is oxidized is optionally and most preferably in gaseous form and is optionally and most preferably either hydrogen; a hydrocarbon such as $CH_4$, $C_2H_6$, or $C_3H_8$ at preferably 100-200° C.; an alcohol such as methanol or $C_2H_4(OH)_2$ at preferably 20-80° C.; $H_2S$ at preferably 20-90° C.; a nitrogen derivative such as $NH_2NH_2$ at preferably 20-60° C.; or ammonia at preferably 200-400° C. The fuel component that is reduced is optionally and most preferably oxygen.

Examples of proton-conducting electrolytes that are useful for the fuel cell device of FIG. 14 (and in related devices) are Nafion, S-PEEK-1.6 (a sulfonated polyether ether ketone), S-PBI (a sulfonated polybenzimidazole), and phosphoric acid complexes of nylon, polyvinyl alcohol, polyacryamide, and polybenzimidazole (poly[2,2'-(m-phenylene)-5,5'-bibenzimidazole]. These and other useful proton conductors for use at either ambient or higher temperatures are described in G. Alberti et al., J. Membrane Science 185, 73-81 (2001); G. Alberti and M. Casciola, Solid Sate Ionics 145, 3-16 (2001); P. L. Antonucci et al., Solid State Ionics 125, 431-437 (1999); L. Jörissan et al., J. Power Sources 105, 267-273 (2002); A. Bozkurt at al., Solid Sate Ionics 125, 225-233 (1999); and T. Norby, Solid Sate Ionics 125, 1-11 (1999). As an alternative to Pt, various other fuel cell catalysts can be used, including Ru and such Pt alloys as Pt—$WO_3$ and Pt—Ru and other catalysts given in B. Rajesh et al., Fuel 81, 2177-2190 (2002). This catalyst can be added to the nanotube arrays either after initial synthesis of the nanotube forest, or after subsequent process steps by using well-known methods (see, for example, B. Rajesh et al., Fuel 81, 2177-2190 (2002); C. Wang et al., Nano Letters 4, 345-348 (2004); W. Li et al., J. Phys. Chem. B 107, 6292-6299 (2003); X. Sun et al., Chem. Phys. Lett. 379, 99-104 (2003); G. Che et al., Nature 393, 346-349 (1998); and J.-H. Han, Diamond and Related Materials 12, 878-883 (2003)).

While carbon nanotube forests are used here to illustrate the device methodology, any of a number of nanoporous conductors can provide the function of elements 1401 and 1402, such a sheets of nanofiber paper (such as carbon nanotube paper) and membranes made by the growth of carbon nanotubules in the pores of alumina membranes (see G. Che et al., Nature 393, 346-349 (1998) and B. Rajesh et al., Fuel 81, 2177-2190 (2002)). The electrode elements 1401 and 1402 need not be made of the same material. In fact, one of these electrode elements can be a fuel cell element of the prior art that is essentially fully infiltrated with electrolyte.

Devices based on electrochemically tunable charge injection on the inside of hollow nanofibers are also fall within the scope of the present invention embodiments. Such devices are especially useful for applications where the presence of ions on nanofibers is problematic. For example, it is sometimes useful to tune the work function (and therefore the electron emission properties) of nanotube fibers by charge injection for applications where these nanotubes are used for the field emission of electrons. These nanotube field emitters operate in vacuum and the presence of mobile ions on the external surface of nanotubes or nanotube bundles can cause undesirable fluctuations in electron emission characteristics, and stability in electron emission is critically important for such applications as cold cathode emitters for high resolution electron microscopes. In these invention embodiments, the inside of the hollow nanotube fibers can be contacted with all of the components of an electrolyte. However, in states accessed during normal device operation, the material inside the nanotube will differ from conventional electrolytes in that these is a net excess or either anions or cations.

Figure 15:
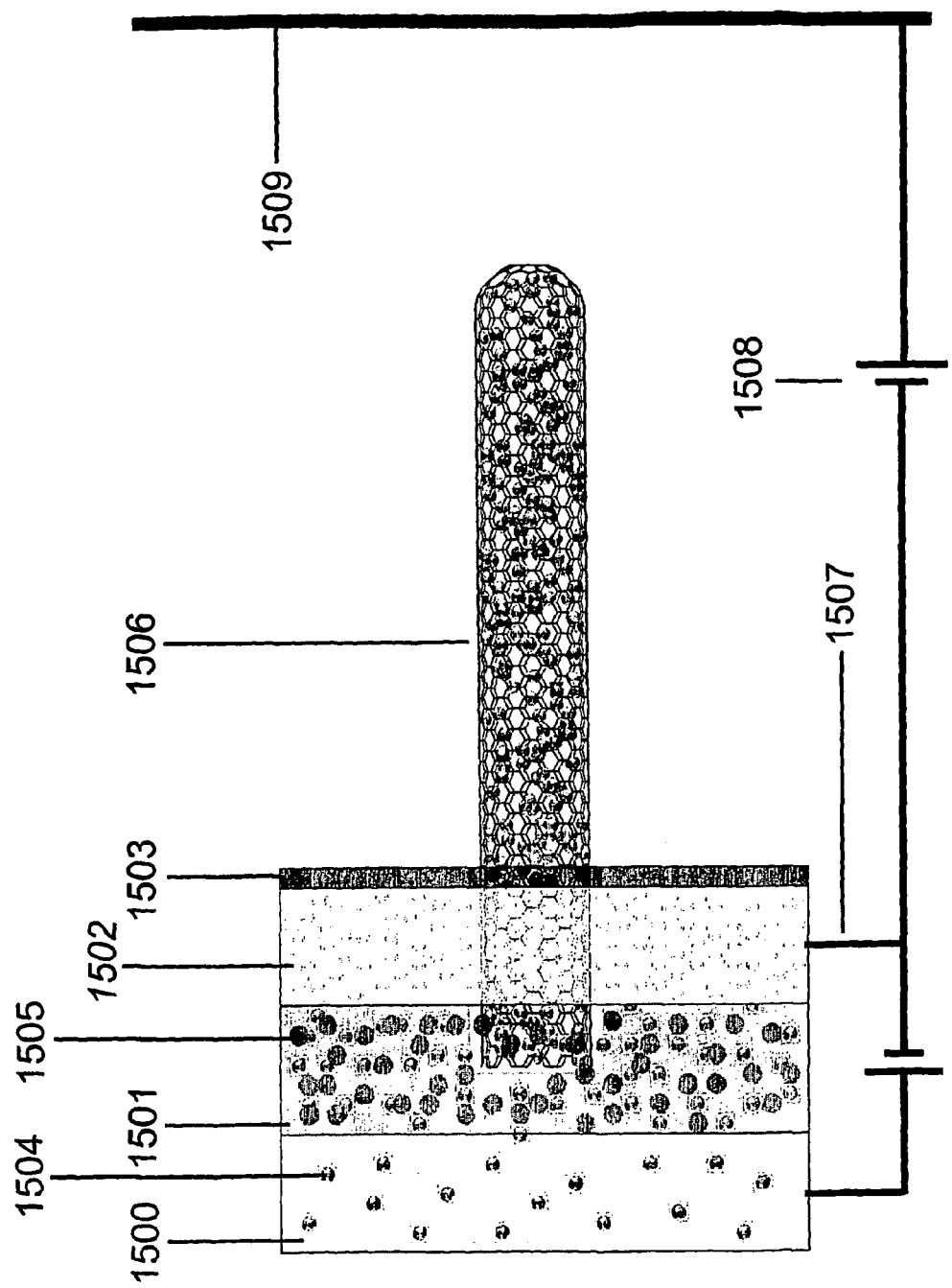
FIG. 15 schematically illustrates a tunable nanotube device in which tunability results from an electrochemically-induced insertion of ions inside a nanotube, and insertion of associated counter electronic charges onto the nanotube.

FIG. 15 schematically illustrates a tunable nanotube device in which tunability results from electrochemically induced insertion of ions inside a nanotube, and insertion of associated counter electronic charges onto the nanotube. One particularly important tunable property is electronic work function. An important type of device having the FIG. 15 configuration is a electron field emitter that can be used, for example, as an electron emitter for field-emission displays, electron microscopes, and x-ray sources. Increased stability of electron emission intensity is one advantage of this particular invention embodiment, as compared with other invention embodiments of this invention where ions are electrochemically placed on either the inside of the nanotube or on both the inside and outside of the nanotubes. The case is especially useful when the ions electrochemically inserted into the interior of said nanotube are at least 10 times more numerous than those electrochemically inserted on the exterior surface of said nanotube The device shown in FIG. 15 contains electrochemically-active electronic conductors 1500, 1502, and 1506. Elements 1500 and 1502 can optionally be materials that can be intercalated, so they electrochemically charge predominately faradaically. Element 1500 is the counter electrode to a working electrode that comprises the electronically interconnected elements 1502 and 1506. Element 1501 is an electrolyte that separates these working and counter electrodes. Element 1506 is an electronically conducting nanotube that is closed at one end and open at the opposite end. Element 1504 (and like elements in electrolyte 1505 and inside the nanotube element 1506 are mobile cations. Elements 1505 in the electrolyte 1501 are anions, which can be either mobile or immobile. The total charge of on these anions matches the total charge of the cations in the electrolyte 1501. In contrast, the total ion charge in elements 1500, 1502, and 1506 is matched in large part by electronically injected charge in these elements. Element 1503 is an ion permeation barrier material, such as a deposited metal, which restricts ion placement during charging to filling of the nanotube 1506. This element 1503 can optionally be omitted. One disadvantage of this omission is that the resulting partial placement of ions on the exterior surface of the nanotube can decrease the stability of electron emission. An advantage of omitting element 1503 is that higher amounts of charge can be injected into element 1506 (at a given applied potential between 1500 and 1502) than would be the case if ion placement during charging were restricted to only the inside of the nanotube element 1506. Element 1506 is a variable potential power source and associated electronic connections that enables the application of a potential between the counter electrode 1500 and the working electrode that comprises 1502 and 1506. Element 1508 is a power source that applies a potential between nanotube 1506 and a counter electrode (1509) to thereby cause electron emission.

The device of FIG. 15 operates as follows. Ions shuttle between the counter electrode (1500) and the working electrode (comprising 1502 and 1506) depending upon the potential applied between these electrodes by 1507. The degree of charge injection varies in a controllable manner with the work function of nanotube element 1506. Electron emission occurs (predominately from near the tip of nanotube element 1506) in response to the application of an applied voltage between 1506 and 1509.

The choice of materials for the device of FIG. 15 can be made in various useful ways depending upon performance considerations for a particular application. Also, variations on this device design are useful. For example, there is an excess of cations in the device of FIG. 15, and this excess of cations is stored in the working electrode (comprising 1502 and 1506) and counter-electrode (1500). The counter charges are injected electrons in these electrodes. In normal operation, this pictured device operates as an above mentioned rocking chair mode, where ions are shuttled between working and counter electrodes during device operation, and the function of the electrolyte (1505) is just to electronically insulate the working and counter electrodes and to enable ionic transport between them. While the ions shuttled in FIG. 15 are cations, other invention embodiments involve the inter-electrode shuttling of cations. Also, devices of invention embodiments can be constructed analogously so that operation is in the electrolyte ion storage mode. The only basic difference between the device of FIG. 15 and a related device of invention embodiments that operates in the electrolyte storage mode is that both anions and cations used for device operation predominately come from the electrolyte, so these ions must both be mobile. The electrode elements 1500 and 1502 can be either a nanoporous material that charges predominately non-faradaically or an electrode material that charges predominately faradaically, such as low surface area conducting polymer. The nanotube element 1506 can optionally be a multiwall nanotube, instead of the pictured single walled nanotubes. However, this multiwall nanotube should typically be closed on one end for at least one of the nanotubes in the multiwall assembly (in order to enhance the stability of electron emission). The nanotube element 1506 can either have an open end that is located in element 1502 or an open end that opens into the electrolyte 1505 (as pictured in FIG. 15), as long as this nanotube makes electronic contact with element 1502. These nanotubes can be carbon nanotubes or any of the enormous variety of conducting materials that are known to form either single walled nanotubes or multiwall nanotubes (including double walled nanotubes). Also nanotube element 1506 can comprise a bundle of single walled nanotubes, a bundle or multiwall nanotubes, or a mixture thereof. The aspect ratio of the nanotube or nanotube bundle element (ratio of diameter to exposed length) is important for determining the field enhancement factor, as is the absence of proximity similarly high neighboring conductors. Specific compositions useful for the practice of invention embodiments are described later, when the various possible compositions and comparative advantages and disadvantages of these compositions for various application embodiments are described.

Devices of FIG. 15, and related devices of invention embodiments, contrast with those of the prior art. Consider the application of the FIG. 15 device for field emission of electrons. Carbon nanotubes are currently widely studied as a source for electric-field-induced electron emission (so-called cold cathode electron emission). They are already used as a cold cathode for numerous applications, such as Field Emission Displays (FEDs) and x-ray sources. Invention embodiments enable gate-controlled electrochemical charge injection in carbon nanotubes for the optimization and control of the electronic work function of the carbon nanotubes, and therefore their emission characteristics. When electrons are injected into the nanotubes the work function decreases, and when holes are injected the work function increases. Invention embodiments provide electronically tunable cold cathodes for flat panel displays, lighting fixtures, electron sources for electron microscope, and discharge tubes for over-voltage protection.

The next described devices of invention embodiments are supercapacitors having greatly reduced self-discharge and the ability to be dry-shipped. Prior art supercapacitors are based on continuously maintained contact of electrolyte with the capacitor electrodes. This electrolyte contact causes two major problems. The first problem is that the presence of this electrolyte means that charge cannot be stored in supercapacitors over long time periods. This self-discharge cannot be eliminated as long as electrolyte interconnects the two electrodes, since (a) self-discharge results from the small electronic component of electrolyte conductivity and (b) redox mediators can exist in the electrolyte, which undergo oxidation at one electrode and reduction at the opposite electrode—to thereby shuttle electronic charge between electrodes. If the first problem could be solved then it might be possible to ship charged supercapacitors for later use in the field. A second problem then arises, since the continuously maintained electrolyte in the supercapacitor increases the supercapacitor shipping weight. The experimental discoveries involving this invention show that injected charge in electrodes can be maintained even when the electrolyte is absent, and that self-discharge is inherently lower that for the case where the supercapacitor electrodes are immersed in electrolyte.

Figure 16:
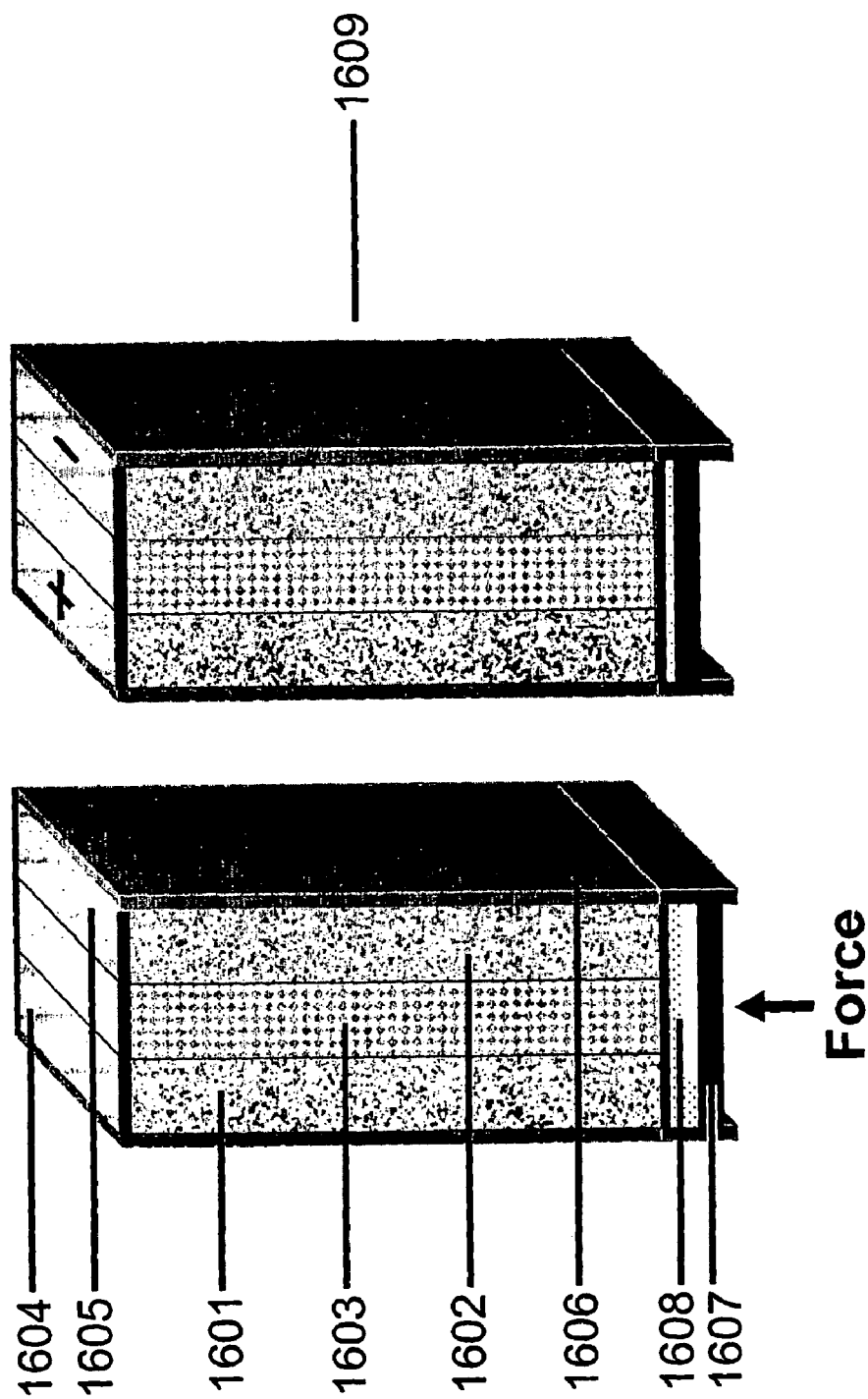
FIG. 16 schematically illustrates a supercapacitor of invention embodiments that can be charged, drained of electrolyte, partially or completely evacuated then reactivated for subsequent discharge in a remote location by refilling with electrolyte. In the illustrated case (showing a cross-section of the device normal to the supercapacitor electrode sheets), the electrolyte for device refill is carried in a compartment of the device. In an alternative invention embodiment, the electrolyte (which can be salt water) is injected into the supercapacitor device from an electrolyte container that is separate from the device.

FIG. 16 schematically illustrates a supercapacitor of invention embodiments that can be charged, drained of electrolyte, partially or completely evacuated then reactivated for subsequent discharge in a remote location by refilling with electrolyte. In the illustrated case (showing a cross-section of the device normal to the supercapacitor electrode sheets (1601 and 1602)), the electrolyte for device refill is carried in a compartment of the device. In an alternative invention embodiment, the electrolyte (which can be salt water) is injected into the supercapacitor device from an electrolyte container that is separate from the device. A benefit of this alternative design is that the supercapacitor can be dry shipped in charged state without the need to simultaneously transport the electrolyte.

While batteries can provide much higher energy storage densities than supercapacitors, the power densities of supercapacitors can be much higher than for batteries, which is what makes this invention embodiment important. Also, Applicants have discovered that injected charge is much more stable in the absence of contacting electrolyte than it is for the electrolyte-containing supercapacitor. In the device of FIG. 16 (in container 1606), non-faradaically injected charge is stored in the hole-injected electrode (1601) and in the electron-injected electrode (1602) in the absence of contacting electrolyte. Subsequent release of this stored energy is enabled when electrolyte (1608) in the device is pushed into the supercapacitor compartment that contains the sheet electrodes 1601 and 1602 and the porous insulator sheet (1603), which prevents short circuiting of these electrodes. Application of a force to the moveable element 1607 breaks a membrane (not shown) separating the supercapacitor electrodes and separator sheet from the electrolyte and pushes the electrolyte into the active cell volume, as shown in 1609 (which is the supercapacitor device after release of the electrolyte into the region of the electrochemically active cell elements). Before this electrolyte release, the electrical contacts (1604 and 1605) to the electrochemical electrodes are electrically floating, but after the release of electrolyte these electrical contacts acquire the relative potentials shown in 1609.

The invention embodiments also include a supercapacitor/battery hybrid device in which at least one (and in some cases both) of the device anode and cathode comprise elements that that are predominately faradaically charged and predominately non-faradaically charged. The component that is predominately non-faradaically charged is typically exterior to the component that is predominately faradaically charged, such as being a covering a sheet on one or both sides of a sheet of the predominately faradaically charged material. These predominately faradaically charged electrode components should be in electrical contact and advantageously in close physical contact. This supercapacitor/battery hybrid device has the advantages of devices like that shown in FIG. 16 in that the device can be stored and shipped in a dry state without contacting electrolyte, and then electrolyte can be placed in contact with the electrodes immediately prior to usage, thereby increasing charge storage life over the life that would result if the device electrodes were in maintained joint contact with the electrolyte. In this "dry state" of the supercapacitor/battery hybrid energy storage device there is no complete ion path in an electrolyte between said electrode and a counter electrode, so redox mediator impurities in the electrolyte and trace electronic conductivity the electrolyte cannot cause charge degradation. Moreover, this supercapacitor/battery hybrid energy storage device has the optional benefit of being refilled with electrolyte (or the liquid component of said electrolyte, such as water) at usage site—thereby providing a reduced shipping weight. Though at a cost of increased device weight and volume (needed to accommodate the weight and volume of the predominately faradaic component of the hybrid device), the supercapacitor component can self-charge after capacitive discharge, as a result of ion and charge flow from the predominately faradaic electrode component to the predominately non-faradaic electrode component. The gravimetric surface area of the predominately non-faradaically charged electrode component can advantageously be at least 10 times that of the predominately faradaically charged electrode component. More advantageously, the gravimetric surface area of the predominately non-faradaically charged electrode component can be at least about 100 times that of the predominately faradaically charged electrode component. Various materials can be used for the predominately non-faradaically charged electrode component and for the predominately faradaically charged electrode component, and these different electrode components can be the same material having two quite different degrees of porosity. Advantageous electrode compositions for the predominately faradaically charged electrode compositions are alkali metals and alkali metal alloys, intercalated forms of carbon, and intercalated conducting polymers. Porous carbon nanotube sheets are particularly suitable for the predominately non-faradaically charged electrode composition. As for conventional batteries, there can be more than electrodes in the supercapacitor/battery hybrid energy storage devices, and these electrodes can be connected either in-series or in-parallel arrangements (or a combination thereof) depending upon the required device output voltage. Both the flat plate and spiral would electrode arrangements used for conventional batteries can be usefully employed for the present supercapacitor/battery hybrid devices.

Alternatively, from a view of optimizing discharge rate by minimizing diffusion distances for a supercapacitor/battery hybrid energy storage device, the predominately faradically charged electrode component can interpenetrate within a predominately non-faradaically charged electrode component. For example, a high discharge rate and high charge storage capacity electrode could be produced by dispersing particles or nanofibers of an doped electronically conducting organic polymer (such as alkali-metal-doped poly(p-phenylene, a conducting polyaniline, or doped $V_2O_5$ nanofibers) within a matrix comprising uncoated carbon nanofibers. Of the various alternative ways to accomplish this dispersion, filtration of the faradaically conducting component together with dispersed carbon nanotube fibers to form a composite sheet is especially simple. Excepting the co-addition of the faradaically charged component, this is the conventional process used to form nanotube sheets (J. Liu at al., Science 280, 1253 (1998); A. G. Rinzler et al., Appl. Phys. A 67, 29 (1998)).

Devices of invention embodiments can use dynamically varied non-faradaic charge injection to control the movement of materials through filters containing nanoscale and/or microscale pores. These embodiments can use predominately non-faradaic double-layer charge injection to dynamically and selectively control the flow of materials (in gases, liquids, or melts) through porous membranes.

Figure 17:
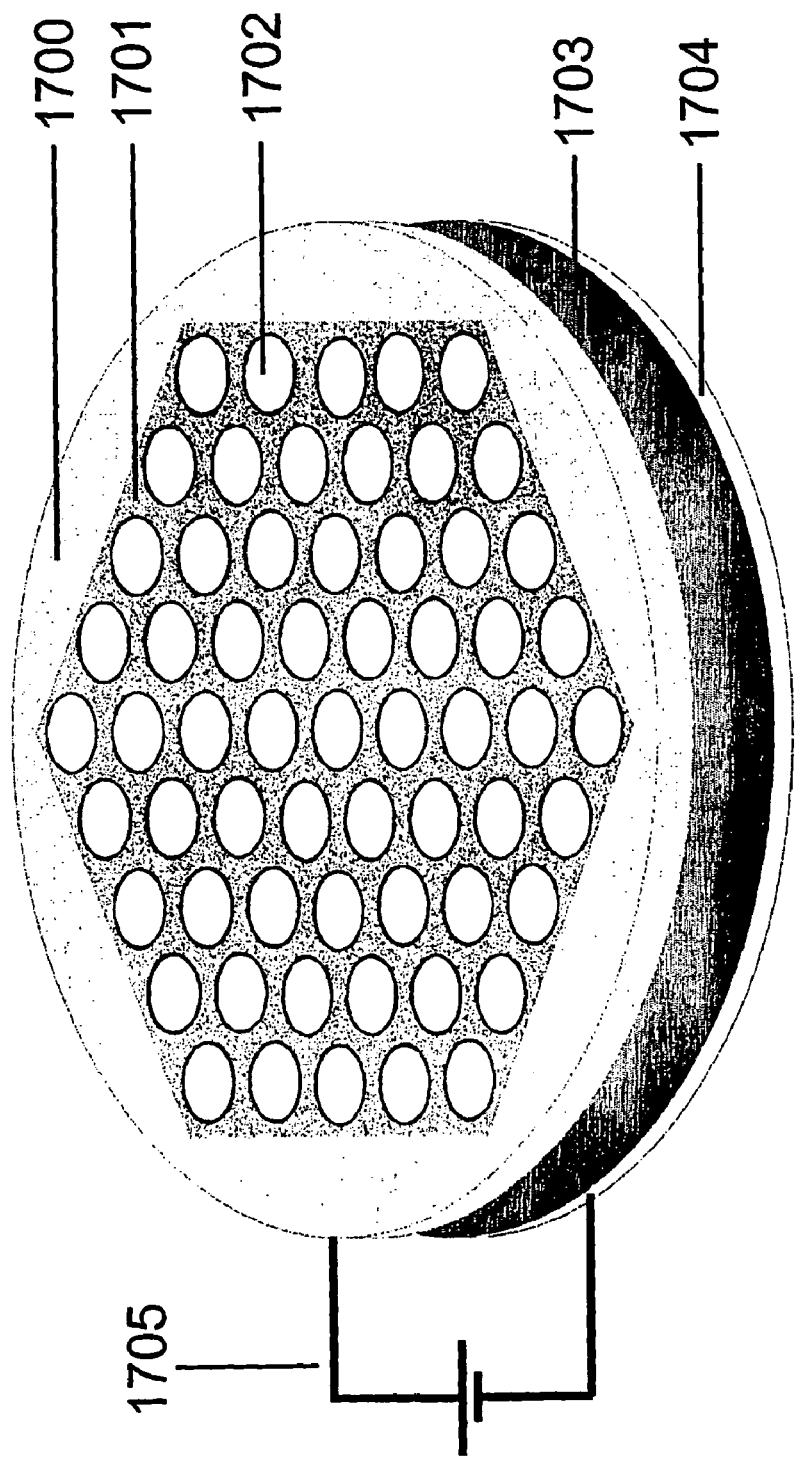
FIG. 17 schematically illustrates a filtration device that uses non-faradaic charging to dynamically and selectively control the transport of material though a membrane having discreet pores.

One such invention embodiment (using the concept of discrete pores) is schematically illustrated in FIG. 17. The invention embodiments of this figure and that of alternative invention embodiments (where membrane pores are uniformly distributed) are most generically applicable for dynamic and selective control of the permeability of porous membranes for materials in dissolved states; particles in solutions, melt, or supercritical states; and molten materials. In the device of FIG. 17, 1701 is a filter material containing pores 1702. The walls of these pores, which are substantially in the thickness direction of the filter material 1702, are coated (at least in part) with an electronic conductor. The pictured coating on the top surface of the filter material is also an electronic conductor (1701), which substantially electronically contacts the electronic material on the walls of the 1702 pores of the filter material. The substantially interconnected electronically conducting materials on the top surface of membrane 1700 and the walls of pores 1702 electronically interconnects with material 1700, and this total interconnected structure serves as the working electrode of the device. Element 1704 is the counter electrode of the device. This counter electrode element contacts the electrolyte 1703, but does not substantially contact the working electrode element. Element 1703 (the electrolyte) and 1704 (the counter-electrode) either do not extend over the pores in the membrane, or are porous themselves—so as not to impede the operation of the membrane. The power source used to obtain membrane channel charging, together with electrical leads to the electrode element 1700 and counter electrode, is element 1704. This power source can be of variable voltage, so that the membrane filtration properties can be dynamically tuned. Discharge of the non-faradaically injected charge removes the ions in the pores of the filter, thereby enabling convenient cleaning of the filter when needed.

The device of FIG. 17 operates in the following way. Application of a potential between the said working electrode and the counter electrode 1704 causes predominately non-faradaic charging of the electronically conducting material on the walls of pores 1702. This involves essentially simultaneous charging of these walls of 1702 by electronic charge injection and the migration of ions into the pores (preferably from the electrolyte 1703) to electrostatically compensate these electronic charges. These ionic counter charges selectively retard transport of materials down the pores by effectively reducing the size of pores 1702. Also, the effectiveness of this pore filling on transport through the membrane depends on the degree of charge injection, the sign of charge injection versus that of components in the material being filtered, as well as the geometry of the ions associated with charge injection versus those in the material being filtered. These dependencies provide additional features that enable the selective tuning of transport through the membrane by materials having different sizes, geometries, charges, and charge distributions.

The conducting electrode material in pores 1702 need not extend along the entire length of the pores. In fact, a major fraction of the membrane pore volume can be used to store a drug, which is released at a rate determined by the applied potential between the working electrode and the counter electrode 1704. Also, a drug reservoir can be on one side of the membrane so that drug delivery (for example, through the skin) is determined by membrane transport that depends upon the inter-electrode potential and the corresponding degree of non-faradaic charging.

Devices of invention embodiments also provide electromechanical actuation and electrochemical tunable chemical actuation. It is well know that charge injection, either faradaic or non-faradaic, can provide electrochemical electromechanical actuation. This electrochemical actuation is fundamentally different from that for magnetostrictive, electrostrictive, ferroelectric, electrostatic, and shape-memory actuation. For examples of such faradaic and non-faradaic actuation, see R H. Baughman, Synthetic Metals 78, 339-353 (1996); R. H. Baughman et al., Science 284, 1340 (1999); R. H. Baughman et al., U.S. Pat. No. 6,555,945; G. Gu et al., Nature Materials 2, 316-319 (2003); and R. H. Baughman, A. A. Zakhidov, and W. A. de Heer, Science 297, 787-792 (2002). A problem with prior art technologies of actuation using electrochemically-induced dimensional changes is that an electrolyte must be used, and both solid-state and liquid electrolytes provide disadvantages. First, liquid electrolytes are generally problematic because of the need for electrolyte containment, and on the microscale (for anything other than microfluidic applications) incompatibility with conveniently employable device fabrication methods. Second, while the use of liquid electrolytes can avoid these problems, others appear. Most importantly, the mechanical modulus of the electrolyte acts to constrain the achievable actuation in the best case, and in the worst case (for electrolyte ion storage operation modes) the electrolytes provide dimensional changes themselves and these electrolyte-induced dimensional changes work in opposition to the dimensional changes of at least one of the actuator devices. Hence, these all-solid-state electrochemical electromechanical actuators have been cantilever devices. These cantilever devices, when based on a porous actuator electrode, contain electrolyte in the volume of this electrode, as well as a separator between the two needed electrodes. Hence, these prior art all-solid-state electrochemical electromechanical actuator operate by bending, thereby utilizing the mismatch in electrochemically induced dimensional changes of mechanically coupled opposite electrodes. This presents a problem, since such bending actuators do not provide a very efficient way to convert electrical energy to mechanical energy. Unlike faradaic electrochemical actuators, the non-faradaic actuators of some preferred embodiments do not require dopant intercalation and de-intercalation during the actuator cycle, so they do not suffer from cycle life and cycle rate limitations from such partially irreversible processes.

Figure 18:
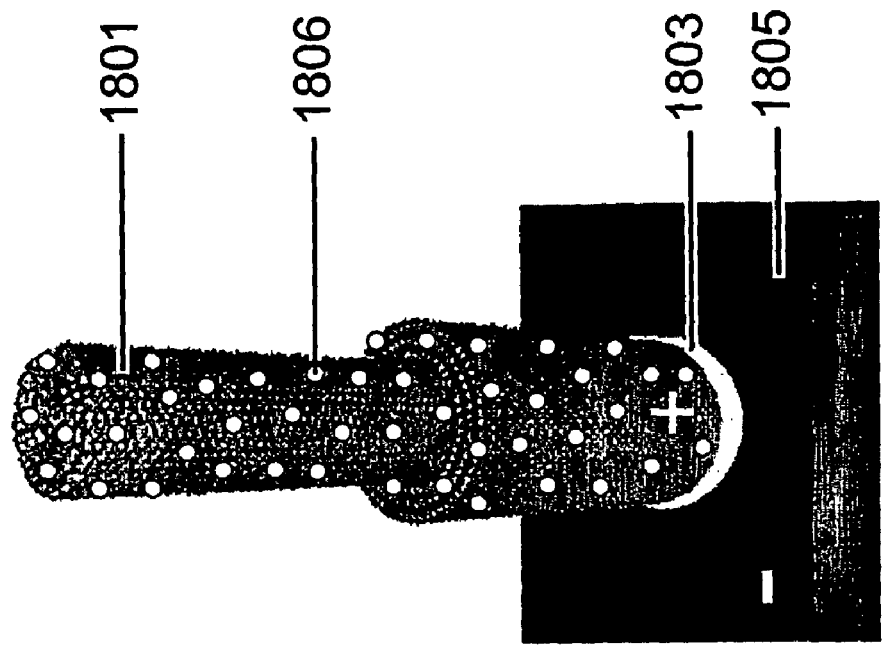
FIG. 18 schematically illustrates an electromechanical actuator device of invention embodiments that can provide much larger actuation strains than any prior art device of any type. This device uses a carbon multiwalled nanotube (MWNT) which telescopes outward in order to decrease free energy by increasing the surface area available for charge injection.
Figure 18:
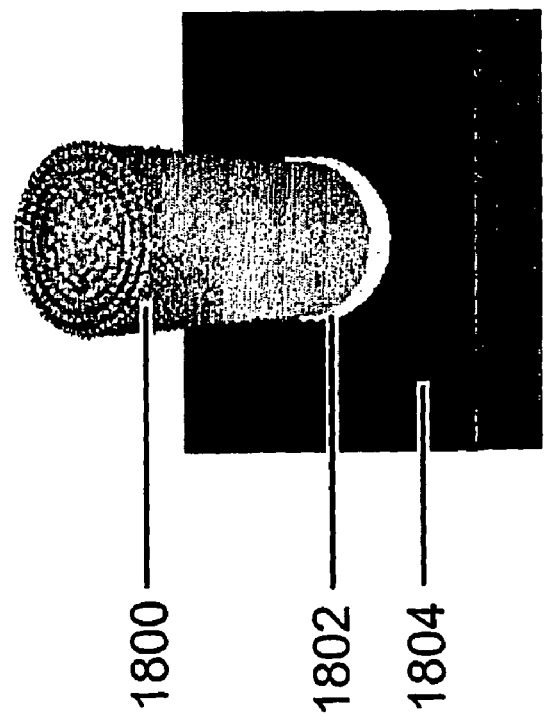

FIG. 18 schematically illustrates an electromechanical actuator device of invention embodiments that operates by a different mechanism, and can provide much larger actuation strains than any prior art device of any type. This device uses a carbon multiwall nanotube (MWNT) that telescopes outward in order to decrease free energy by increasing the surface area available for charge injection. The picture on the left (elements 1800, 1802, and 1804) shows the MWNT before non-faradaic charge injection, and the picture on the right shows the same MWNT that is partially extended by non-faradaic charge injection. Element 1800 is the MWNT in fully contracted state and element 1801 is the MWNT in partially extended state. This MWNT is a working electrode for a electrochemical cell whose counter electrode is element 1804 and 1805 (which is the same element for the two indicated states of the device). The electrode elements are electronically separated by the electrolyte (designated 1802 on the left and 1803 on the right). The (−) sign on element 1805 and the (+) sign on element 1801 indicates that a potential has been applied between the working electrode 1805 and the counter electrode 1801. This applied potential results in the injection of electrons into the working electrode 1801, and the associated migration of positively charged ions 1806 to the surface of this MWNT 1801.

The device operates because the actuator is a supercapacitor with an energy associated with the capacitance C of $E_c = \frac{1}{2} q^2/C$, where q is the amount of charge injection. Since charge injection is largely to nanotube walls that are externally exposed (rather than internal to the multiwall nanotube), the capacitance C of the multiwall carbon nanotube (MWNT) increases approximately proportionally to the external wall area of the MWNT ($A_e$). Hence, $C = A_e C_a$, where $C_a$ is the capacitance per exposed surface area of the MWNT. At fixed degree of charge injection q, C can be decreased by increasing $A_e$ by the telescope-like extension of the MWNT. This provides the driving force for actuation, which is opposed by the energy cost of creating new external surface area.

A device of FIG. 18 can be fabricated, for example, using methods already employed for making carbon nanotube tips for atomic force microscopy (AFM) and scanning tunneling microscopy (STM). For example, a MWNT can be grown on the tip of a conducting doped silicon nanoprobe tip, which provides electrical connection to the MWNT electrode. Thereafter, the electrolyte layer can be deposited on the Si nanoprobe tip either by electrochemical polymerization, chemical reaction, or solution deposition. Then a conducting polymer layer can be deposited on top of the electrolyte layer by chemical reaction or solution deposition. This conducting polymer layer serves as the counter electrode of the device. Thereafter, the electrolyte coating and the conducting polymer coating over most (but not all) of the MWNT can be removed by conventionally employed methods, such as the application of a voltage pulse. Finally, a nanoprobe manipulator can be used to make contact with the conducting polymer counter electrode. The thereby obtained MWNT electromechanical actuator can be used for manipulations on the nanoscale. This actuating nanoprobe tip can be used in gaseous, vacuum, or liquid environments, including biological fluids.

The mechanical actuators of the present invention embodiments can be run in reverse to convert mechanical energy to electrical energy for mechanical sensor and energy conversion devices. The benefits of using electrode elements that are not in direct contact with the electrolyte is the same as for the above-described actuators that are used to convert electrical energy to mechanical energy. For cases in which the working and counter electrodes are identical, the generation of electrical energy requires that mechanical stress be applied differently to these electrodes. Typically, a tensile stress is applied to one electrode while a compressive stress (or a decrease in tensile stress) is applied to the other electrode. These electrochemical devices for sensing mechanical stress and strain and for converting mechanical energy to electrical energy generate high currents at low voltages, which provides advantages for some applications over ferroelectric mechanical-to-electrical energy converters, which generate low currents at high voltages. This performance of electrochemical energy converters of the present invention embodiments is desirable for minimizing the effect of lead capacitances for remotely located sensors, so that sensor-response amplifiers need not be located down-hole when doing seismology for oil exploration. The ability to operate these energy-harvesting devices at low frequencies could be usefully exploited for the conversion of mechanical energy of ocean waves to electrical energy. An array of such devices can be electrically interconnected in series to provide an increased output voltage. In another embodiment, the electrodes of the electrochemical electromechanical energy-harvesting device are electrically biased during device operation using an applied voltage. An advantage of such biasing is that the electrical energy generated by mechanical stress can be increased. However, when using such biasing, the stress generated voltage changes should ideally be electrically isolated from the biasing voltage. This can be accomplished by using a capacitor in series with the bias circuit. These devices used to convert mechanical energy to electrical energy typically utilize either a uniaxial or biaxial applied stress. Device polarity can be achieved using different materials for opposing electrodes, an applied bias voltage, or the application of differing stresses to the opposing electrodes.

Figure 19:
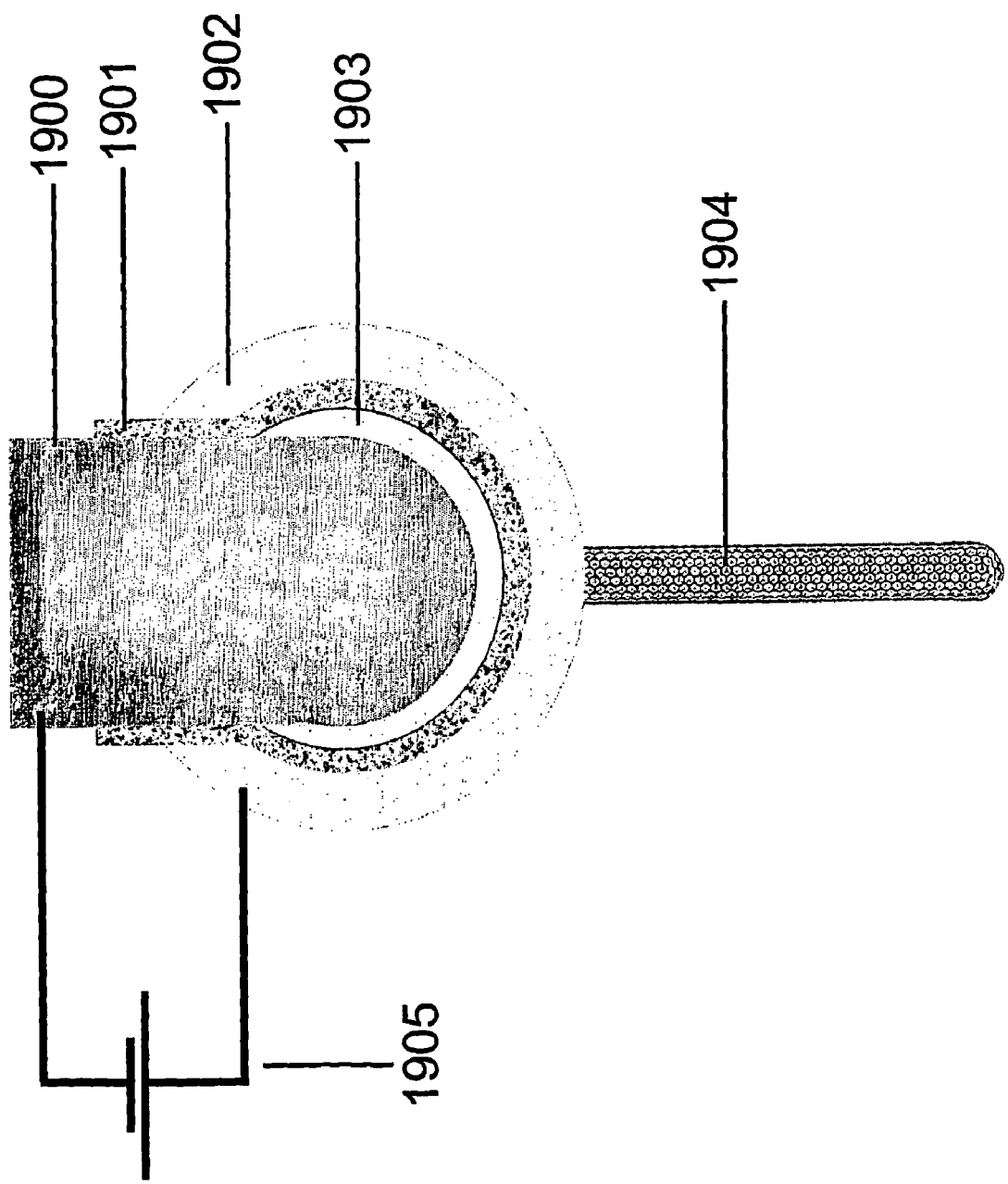
FIG. 19 schematically illustrates an electrochemically-gated device that can be used for atomic probe imaging and electron emission.

FIG. 19 is illustrative of one generically applicable device configuration of invention embodiments. This device is a nanoprobe that can be used for such diverse applications as atomic probe imaging and electron emission. Element 1900 is a conducting nanoprobe tip base (such as an elemental metal), which mechanically supports the device and provides electronic connection to element 1903, which is an electrochemical counter electrode for the device. Element 1901 is an electrolyte that separates the counter-electrode element 1903 from element 1902, which is part of the working electrode. Element 1904 is a nanofiber, such as a carbon single wall nanotube, a multiwall carbon nanotube, or a bundle of these nanotubes that electronically interconnects only with element 1902. Element 1905 is a power source (and associated electronic interconnects) that provides an adjustable potential between the counter electrode 1903 and the working electrode, which comprises elements 1902 and 1904.

In the operation of this device, a change in the potential applied between working electrode and counter electrode (by power source element 1905) causes a change in the degree of electronic charge injection in element 1904, as well as the migration of ions on element 1904 to compensate these electronically injected charges.

Consider first the application of the device of FIG. 19 for scanning probe imaging, such as either atomic force microscopy or atomic tunneling microscopy. The dynamically controllable charge injection into 1904 (via the potential applied by 1905) changes the work function of 1904 and therefore can dynamically tune the properties of this probe tip for atomic tunneling microscopy. Equally important, and sometimes more important for some applications, the device of FIG. 19 is configured so that electrochemical charge injection in nanotube tip 1904 is accompanied by the transport of counter ions onto the nanotube tip 1904. These ions can substantially modify in a tunable way the tunneling characteristics of the nanotube tip 1904 for both atomic force and atomic tunneling microscopes. Use of the device of FIG. 19 as a field emission tip can utilize both the charge in work function of the tip (as a result of electronic charge injection) and the effect or counter ions on this tip on field emission. Moreover, the device of FIG. 19 can be just one of an array of like field emission tips that can be independently controlled electronically.

The devices like shown in FIG. 19 can be constructed by applying presently know technologies for nanofabrication. For example, the nanoprobe base 1900 (which is an electrically conducting contact) can be coated in the tip region by the counter electrode material 1903, which can be a conducting organic polymer that is deposited from polymer solution (or deposited from monomer solution by electrochemical polymerization). The electrolyte 1901 can be then over coated on the counter electrode element (again, for example, by either solution deposition or electro-polymerization), as can be the subsequent coating of element 1902, which is part of the working electrode. The nanotube tip 1904 can be attached to the electronically and ionically conducting element 1902 by various methods. For example, until the electrolyte 1902 loses the solvent used for deposition, this layer can act as an adhesive for harvesting a nanotube or small nanotube bundle from a pre-synthesized nanotube array, such as a nanotube forest. Electrical contact to the counter-electrode 1903 is by the conducting nanoprobe base 1900. The other electrical contact (to the working electrode component 1902 can be made using a nanomanipulator during an inspection process to assess whether or not the nanotubes element 1904 is correctly adhering to 1902. For the purpose of conveniently making said contact (as well as for convenience in making suitable depositions on 1901 and 1902) it should be understood that these layers can extend much further back from the tip of 190 than is shown in FIG. 19.

Figure 20:
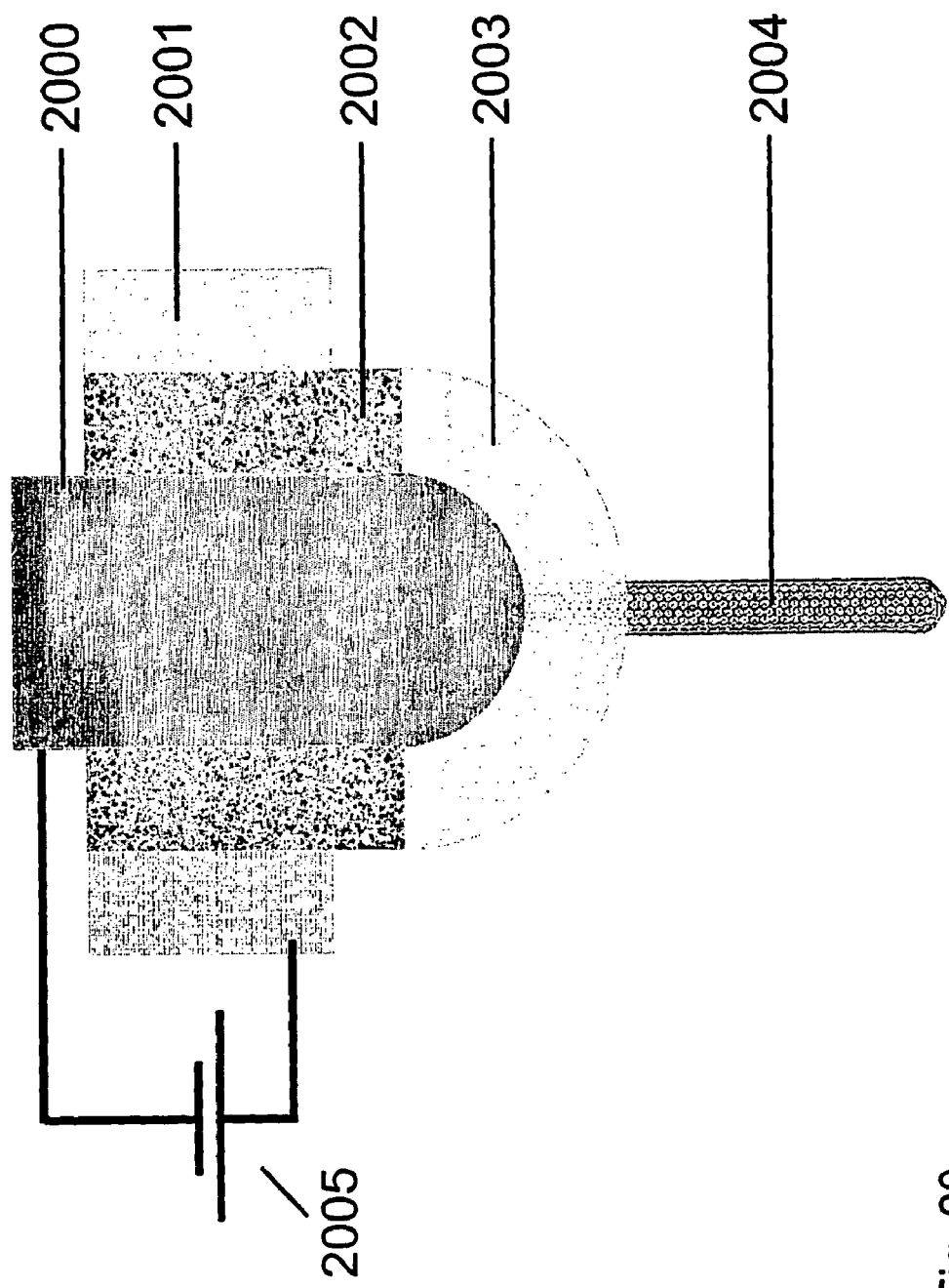
FIG. 20 schematically pictures a device that operates like the device of FIG. 19, except that the nanotube probe tip base makes electrical contact to the nanotube. Such design facilitates device construction.

FIG. 20 shows a device that operates like the device of FIG. 19, except that the nanotube probe tip base makes electrical contact to the nanotube. Such design facilitates device construction. The nanoprobe base is the conducting cylinder 2000, the power source with associated electrical interconnects is 2005, the counter-electrode is 2001 (which can optionally be a doped conducting polymer), the electrolyte separating working and counter electrodes is 2002, the working electrode is comprised of 2003 (which can optionally be a conducting polymer) and element 2004. Although element 2004 is shown here as a carbon nanotube, various conducting probe tip materials can serve this function. In fact, element 2004 can be just a sharpened part of the nanoprobe base 2000, such as an electrochemically-thinned tungsten wire. Also, element 2003 can optionally be eliminated.

As an example, the fabrication of probes of the type shown in FIG. 20, is described, but with element 2003 eliminated (so diffusion of ions along the thereby revealed tip surface of the nanoprobe base 2000 is required for electrochemical charging of 2004 during device operation. The nanoprobe base (2000) with attached nanotube 2004 is commercially produced, and these are typically made by depositing catalyst on the tip of nanoprobe base 2000, and using chemical vapor deposition to grow the nanotube on 2004 on 2000. (For several methods that can be used for such nanotube growth on a probe tip, see J. H. Hafner et al., Nature 398, 761-762 (1999) and J. H. Hafner et al., J. Physical Chem. 105, 743-746 (2001)). After making electrical connection to nanotube base 2000, nanotube base 2000 and attached 2004 can be dipped into an electrolyte, so that an insulating protective coating can be deposited onto the tip of nanoprobe base 2000 and all of element 2004. (See J. K. Campbell et al., J. Am. Chem. Soc. 121, 3779-3780 (1999) for methods for monitoring the depth of immersion into the electrolyte, so only the tip region is coated with an insulating protective coating.) The electrolyte 2002 can be then electrochemically polymerized onto the desired region of the device (since the insulating character of the protective coating will prohibit deposition on top of this coating. Next, element 2001 can be deposited from solution (via a dip/dry process) and electrical connection is made to element 2001. Deposition of the material of element 2001 on top of the protective coating is avoided by having selected the coating material so that it is not wet by the mentioned solution. Finally, either chemical etching or dissolution in a solvent removes the protective coating.

Figure 21:
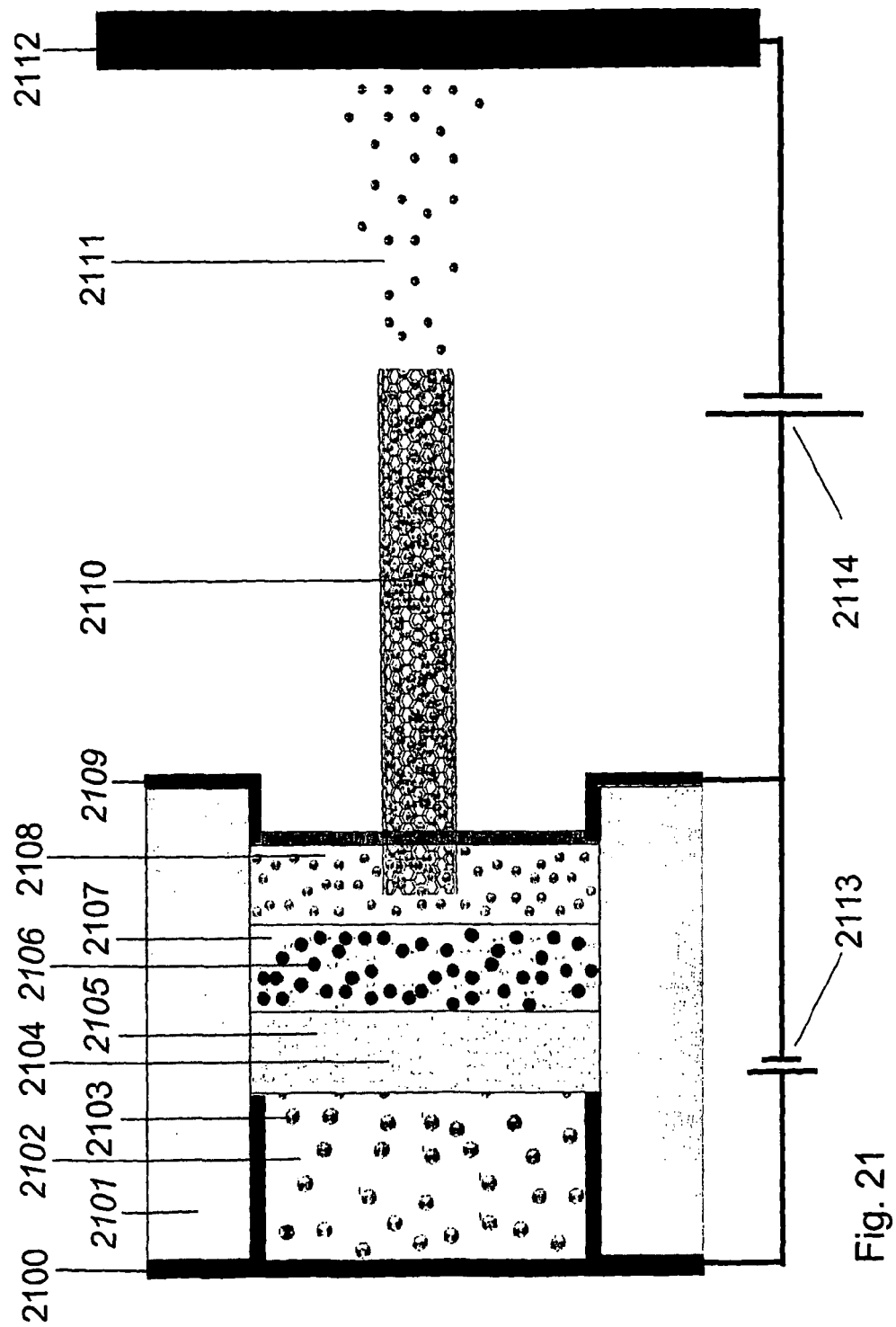
FIG. 21 schematically illustrates a device in which a high-surface-area nanostructured material functions as an electrochemically-gated ion beam source, that can be modulated at will by the application of low voltage potential between electrochemically-active electrodes.

FIG. 21 illustrates an invention embodiment in which a high-surface-area nanostructured material (2110) functions as an electrochemically gated ion beam source. This device uses our surprising experiment observation that we can non-faradaically inject charge in a nanostructured element, and retain this charge in the absence of a contacting electrolyte. While this figure pictures a carbon nanotube as the emission element (2110), this emissive element can be any of a variety of nanostructured materials whose surfaces (interior, exterior, or a combination of interior and exterior) can contain counter ions that can be field emitted. Element 2101 is an electrical insulator. Element 2102 is a vacuum or other medium in which the source of field emission species (2103) are dispersed. For example, this medium can be liquid, gaseous, or solid (such as an alkali metal that is evaporated into the gaseous state using an heater; a solution of an alkali metal, or a complex of an organic solid with an alkali metal). Element 2100 in this figure serves as an electronically conducting electrode contact, as well as a confinement wall for 2102 and 2103 (although the containment and electrode contact element of 2100 can optionally be separate materials). The field emission precursor species (element 2103) can be either charged or neutral. If this species is neutral, should be capable of undergoing at least partial charge transfer with counter electrode element material 21004 for some applied potential to this element. If this field emission species is charged, with the counter ion to this charge residing in 2102, counter-electrode element 2104 is usefully capable of undergoing charge transfer with this counter ion charge. For example, a neutral species 2103 can be an alkali metal atom that undergoes oxidation or reduction with counter electrode element 2104—thereby simultaneously transferring electronic charge to 2104, and being converted to an ion. If electron emission species 2103 is charged, the counter-ion to this charge within 2102 should ideally be able of transferring electronic charge to counter-electrode element 2104, thereby enabling the migration of the ion emission species into 2104. The electron emission species 2103 becomes the ionic electron emission species 2105 within counter-electrode 2104, as well as the same ion emission species that is pictured within electrolyte 2107, the working electrode components 2108 and 2110, and the field emitted ion beam 2111. The counter charges to the ionic emission species in 2104, 2108, and 2110, are, respectively, the electronically injected charge (holes or electrons) in these elements. The counter-ion species in electrolyte 2106 to the type ions found in 2105 are the counter ions 2106 found within 2107. Element 2112 is the electrostatic counter electrode to the ion emission source 2110, wherein 2112 is at a negative potential with respect to 2110 if the ions emitted by the ion source are positive ions. Elements 2113 and 2114 are voltage sources (and associated electronic interconnects), which are able to apply a variable voltage. The voltage supply element 2113 applies a voltage between the electrode (comprising 2108 and 2110) and the counter-electrode element comprising 2104 (along with the associated ions 2104 and 2106) via the electrode conducting elements 2100 and 2109.

The operation of the device of FIG. 21 is described in the following. Element 2100 helps confine a source of material for ion emission (2103), which can be in either charged or neutral. Either as a result of (1) electronic charge transfer from neutral forms of this field emission species to counter-electrode element 2104 or (2) electronic charge transfer from counter ions (within 2102) to counter-electrode element 2104, the ion emission species derived from 2103 are able to migrate into the counter-electrode element 2104 (where they become 2105). In the absence of parasitic reaction processes, migration of the ion emission species 2105 across the electrolyte 2107 and into working electrode components 2008 and 2110 is controlled by the potential applied by 2113. The application of a potential with suitable sign and magnitude between 2110 and 2112 causes the emission of the ion beam 2111.

Figure 22:
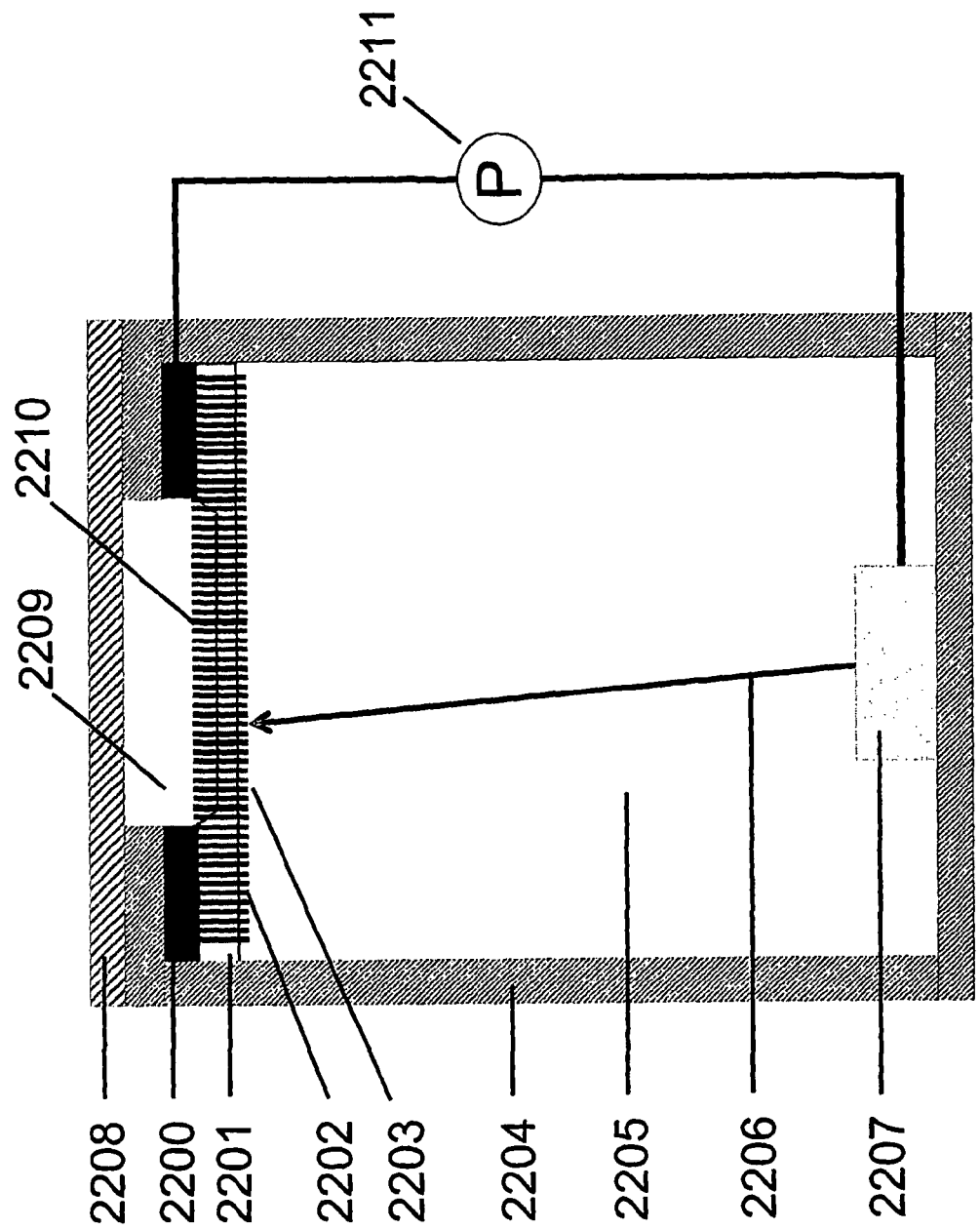
FIG. 22 schematically illustrates a cross-sectional view of a device in which individual nanoscale electrodes (pixels) are electrochemically charged either positively or negatively using a focused electron beam. In contrast with the case of other device illustrations, electrochemical charging does not require a wire lead to the electrode, so extremely small pixels can be conveniently addressed within a densely packed pixel array.

The preceding figures showing invention embodiments have used electrical wires to connect electrochemical electrodes to the power source. FIG. 22 shows an invention embodiment in which electrochemical charge injection results from charging via an electron beam, so there is no direct contact of an electrical lead to the electrochemically charged element. The major advantage of such electron-beam-induced charging is that the electron beam serves as an electrical contact that can be conveniently changed at will and, more importantly, used to individually address electrode elements (called pixels) that are on the nanometer or sub-nanometer scale. Interestingly, electron beam irradiation can be used to charge nanoscale pixels either negatively or positively—low electron energies result in negative charging, and high electron energies result in positive charging (since the loss of secondary electrons can exceed the gain of electrons from the primary beam).

FIG. 22 provides a schematic cross-sectional view of a device in which individual nanoscale pixels can be electrochemically charged either positively or negatively using a focused electron beam. Element 2203 comprises a electronically conducting support 2200, electronically non-interconnecting wire-like pixels 2202 and 2210 that are a parallel array, and a solid-state electrolyte 2201 that interpenetrates the pixel array. Element 2204 is an enclosure that separates the vacuum (2205) on the inside of 2204 from both the ambient atmosphere and an atmosphere that can be arbitrarily chosen for the enclosed region 2209, which contains samples that are placed on top of the exposed pixels 2210. Element 2211 is a voltage source that provides the electron-beam-induced electrochemical charging of pixel elements like 2202 and 2210. The electron beam, used for charging, is 2206. This focused electron beam is produced by the electron beam source 2207. Sheet 2208, which completes enclosure 2209, can optionally be used as an easily removable entry port for placing samples in contact with pixels 2210 within enclosure 2209.

The device of FIG. 22 operates as follows. Charging of a particular pixel in the pixel array is accomplished by focusing the electron beam 2206 on that pixel. Depending upon the voltage used to produce the electron beam, the nanotube becomes either negatively or positively charged. For example, if electrons are injected into a particular nanotube, holes will be injected into the counter-electrode pixels (i.e., those contacting 2200). The existence of electrolyte 2201 enables the charging of individual nanotubes to much higher extents than would be possible if 2201 were a dielectric, since ions from electrolyte 2201 can locally electrostatically compensate for the electronic charge on the pixels.

The device of FIG. 22 can be used for various useful processes—including, for example, the assembly of nanoscale objects on the platform comprising the pixel array. The assembly process utilized here is the switching of surface tension of a pixel as a result of predominately non-faradaic electrochemical charging of the pixel. The thereby self-assembled nanostructured objects, which could be the components for a nanoscale circuit board, can optionally be transferred to another substrate for subsequent fabrication steps. This process of pixel-based assembly and transfer of assembled nanoscale objects can be repeated as needed for a manufacturing process. Surface tension changes induced by temperature gradients, selective area deposition, or by photo-induced reactions are well known in the prior art. However, this use of electron-beam-induced pixel charging for electrochemically switching surface energy is unique to the present invention embodiment.

In another application mode, the device of FIG. 22 is used for a new type of nanoscale microscopy, which we call Electron-Beam Electrochemical microscopy (EBE microscopy). This application made uses the well-known fact that detection of scattered electrons can be used to measure the potential of an element in an electron microscope. While the choice of investigated material is virtually unlimited, biological materials (like cells and cells arrays and DNA) provide important application opportunities. The microscopy uses oppositely charges pixels as opposite electrodes for doing spatially resolved electrochemical characterization, including spatially resolved cyclic voltammetry (curves of current versus potential at constant voltage scan rate, or related curves of potential versus charge at constant current). Such spatial information on the oxidation and reduction processes can be used to probe chemicals within cells or to sequence DNA. The device of FIG. 22 employs focused electron beam generation and electron energy detection capabilities that are well know, and widely used in scanning electron microscopes and scanning transmission microscopes. Numerous papers in the prior art describe methods for making vertically aligned nanotube arrays (nanotube forests) and manipulating these nanotube forests to make devices. These methods can be usefully employed for the present invention embodiments that use nanotube forests. Examples of these methods are described by P. Soundarrajan et al. in J. Vac. Sci. Technology A 21, 1198-1201 (2003), J. Li et al., J. Phys. Chem B 106, 9299-9305 (2002), and A. M. Cassell et al., Nanotechnology B15, 9-15 (2004).

The discovery that electrochemically injected charge is stable in the absence of electrolyte also enables the dynamic tuning of nanostructured materials properties for materials absorption and desorption, such as hydrogen storage. Charge injection (and associated ion migration) selectively changes the interaction energy of materials with a nanostructured substrate (such as nanostructured fibers, sheets, and powders) and therefore changes the absorption capabilities of the substrate material. Changing the degree of charge injection by changing the applied potential can aid in the release of absorbed materials.

Invention embodiments also provide the use of predominately non-faradaic electrochemical charge injection for dynamically tuning thermal conductivity. These invention embodiments use the unexpected observations described herein that non-faradaically injected electronic charge and associated counter ions are stable on nanostructured materials even in the absence of a contacting electrolyte. Use is also made here of the fact that phonon scattering lengths are long in low-dimensional nanostructured materials (like carbon nanotubes), so these materials can have large thermal conductivities (see P. Kim et al., Phys. Rev. Lett. 87, 215502-1 to 215502-4 (2001)). The large thermal conductivities can be usefully employed, for example, for connecting hot circuit-board components to a material that is at lower temperature. However, for both the purpose of regulating temperature and avoiding the heating effect of electrical pulses sometimes used in thermoelectric cooling, it is desirable to be able to electrically tune thermal conductivity. This tunability of thermal conductivity is achieved here as a result of the combined effects of electronic charge injection and the associated migration of counter ions on the surface of the nanostructured material (which can change thermal conductivity because of a change in charge carrier density, can increase conductivity because of phonon transport in the ion layer, and can decrease thermal conductivity because of ion-based scattering of phonons associated with a highly thermally conducting nanostructured material, like carbon nanotubes).

Figure 23:
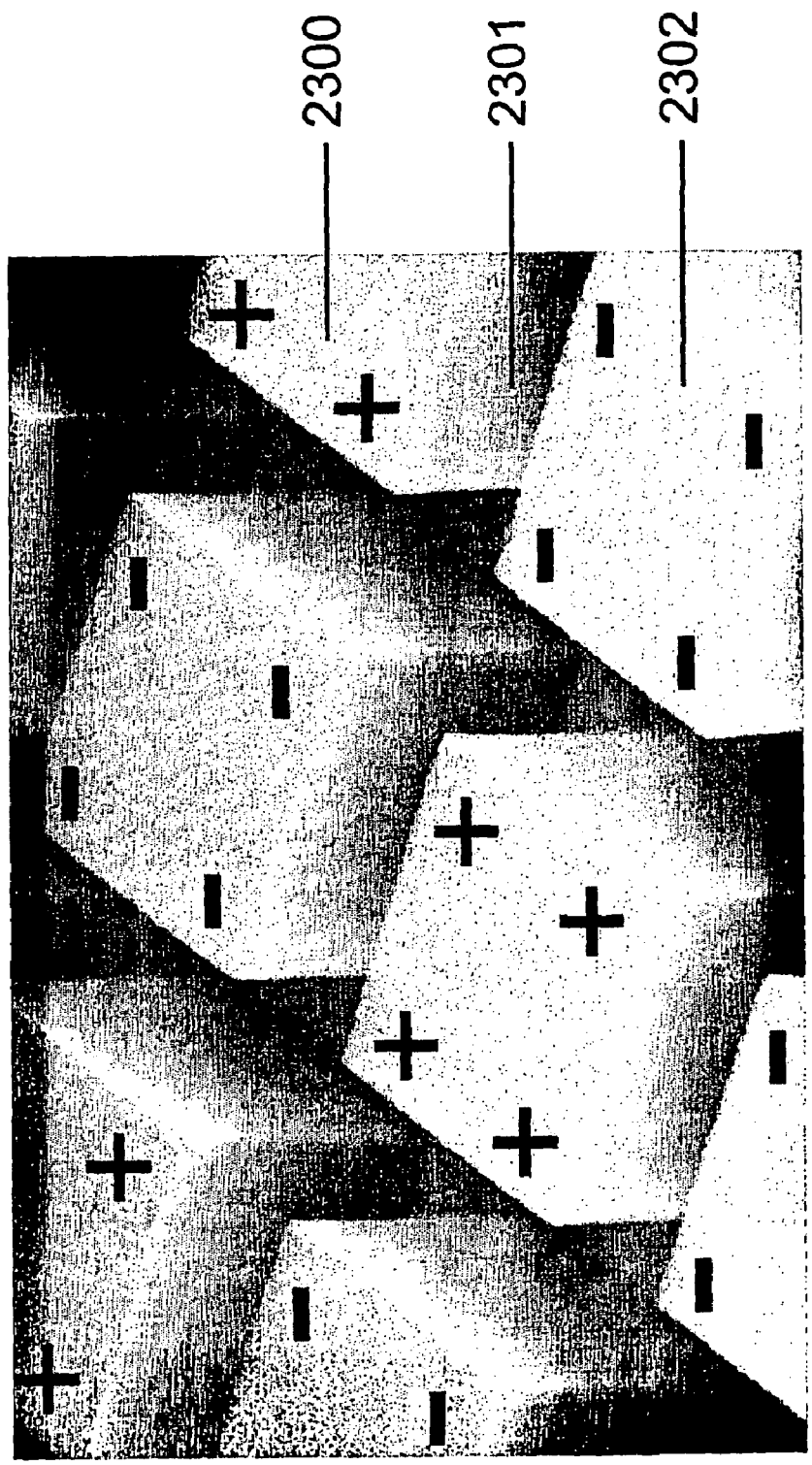
FIG. 23 schematically illustrates one type of device of invention embodiments that provides tunable thermal conductivity.

FIG. 23 schematically illustrates one type of device of invention embodiments that provides tunable thermal conductivity. The blocks in FIG. 23 (2300, 2302, and like elements) are arrays of multiwall nanotubes that have been grown on a substrate by patterned deposition of catalyst on the substrate, followed by growth of a nanotube forest (comprising parallel nanotubes that are orthogonal to the substrate). While this sample is not yet infiltrated with electrolyte, 2301 shows the inter-block spaces where electrolyte can be infiltrated during device fabrication. The blocks of nanotubes in FIG. 23 are 100 microns in lateral dimensions, although either larger or smaller dimensions can be employed for these blocks. An advantage of using small lateral dimensions is in an enhanced rate of tunability, and a disadvantage is an increased cost of device fabrication. The substrate (upon which these blocks rest) contains conducting pads, so alternating blocks provide working and counter-electrodes for an electrochemical cell. The application of a potential between these working and counter electrodes causes charge injection and associated ion injection into the nanoporous blocks, and thereby charges thermal conductivity. This changed thermal conductivity varies in an electronically controllable manner thermal transport along the nanotubes between the substrate and a material that is positioned on top of the blocks of nanotubes.

The electrolyte 2301 can fill or partially fill the regions between the nanotube blocks in FIG. 23. It is required that electrolyte connects at least one working electrode bock with one counter electrode block. Pervasive presence of the electrolyte 2301 in the structure is problematic, since the extensive presence of this electrolyte can act to reduce the dynamic range of thermal conductivity tuning (since the electrolyte can also contribute to thermal conductivity). When a large dynamic tunability range is needed (albeit with some sacrifice to tunability rate), the electrolyte should preferably not substantially infiltrate the blocks (2300, 2302, and like blocks). From this view of maximizing dynamic range of tunability, the electrolyte can optionally be deposited so as to interconnect blocks in only one direction. Also, the electrolyte need not fill the cavity between any two adjacent blocks. While this invention embodiment is illustrated using an array of identical nanotube blocks, non-block arrays can also be used and the material used for electrodes need not be comprised of carbon nanotubes. Also, the material used for working and counter-electrode elements can be different. In addition, the counter electrode element need not be porous and need not be charged predominately non-faradaically during device operation. For example, the working electrode elements can be a metal mesh made by a known opal templating process (see A. Zakhidov et al. in Science 282, 897 (1998), U.S. Pat. No. 6,261,469, and U.S. Pat. No. 6,517,762, as well as O. D. Velev et al. in Nature 401, 548 (1999)) and the counter-electrode element can be a doped conducting polymer. Another useful method for making nanoporous metals for such device embodiments is by dealloying alloys (see J. Erlebacker et al., Nature 410, 450-453 (2001)).

Figure 24:
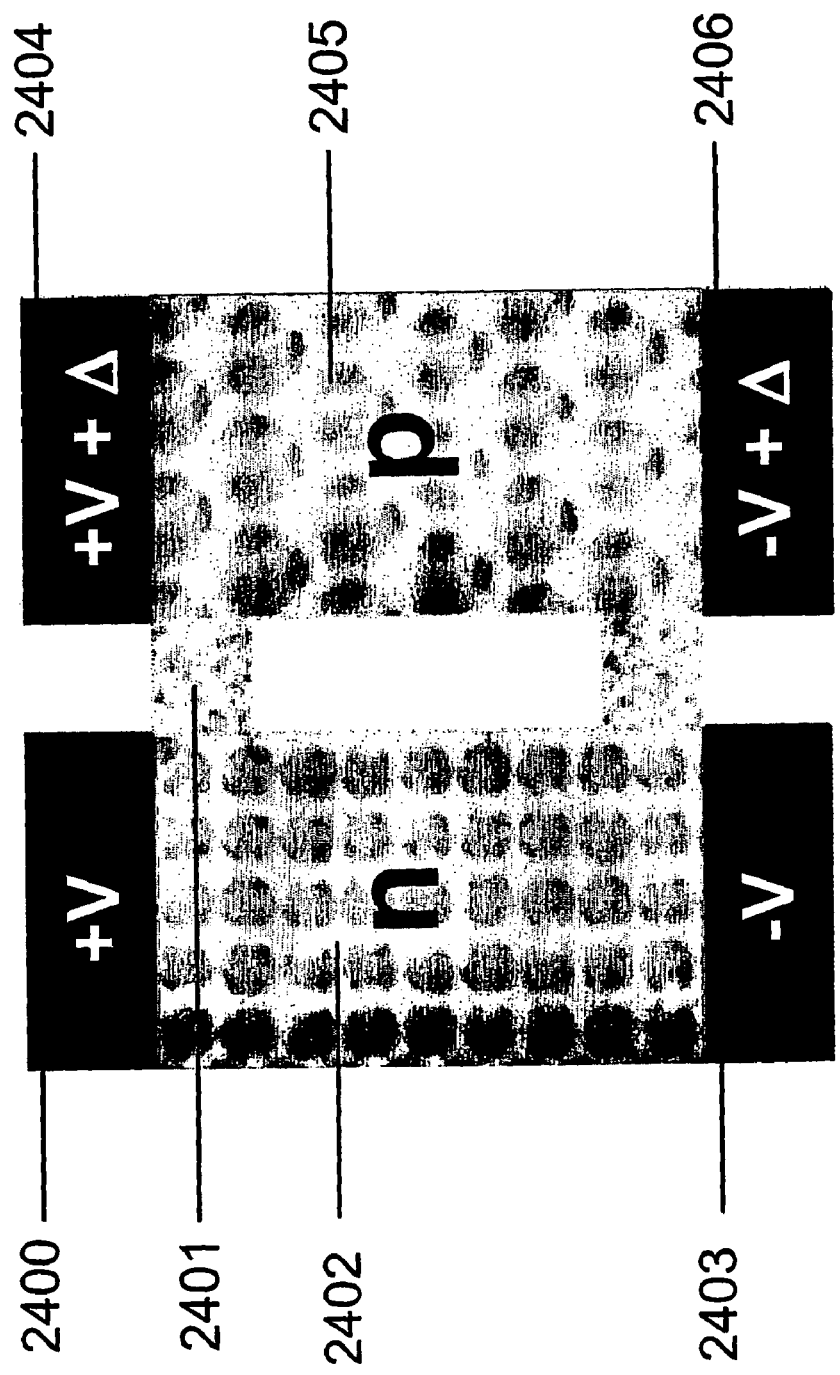
FIG. 24 illustrates an invention embodiment in which predominately non-faradaic charge injection is used to optimize the figure of merit (ZT) of thermoelectric elements interconnected by electrolyte.

FIG. 24 illustrates an invention embodiment in which predominately non-faradaic charge injection is used to optimize the figure of merit (ZT) of thermoelectric elements (2402 and 2405). These thermoelectric elements are interconnected by electrolyte 2401. The indicated applied potentials on electrodes 2400, 2403, 2404, and 2406 results in predominately non-faradaic charge injection into these electrodes (electrons in 2402 and holes in 2405), which optimizes the ZT of 2402 and 2405, by changing the thermal power (S), thermal conductivity ($\sigma_T$) and electrical conductivity ($\sigma_e$) of these elements (ZT, which is an efficiency index, is $S^2\sigma_e/\sigma_T$). These thermoelectric elements can be interconnected electronically like for conventional thermoelectric devices to provide either a cooling capability (pictured in FIG. 24), or the capability of generating electrical energy from a temperature difference. In these cases, the top electrodes (2400 and 2404) are at a different temperature than the bottom electrodes (2403 and 2406) during device operation.

At least one of the electrodes 2405 and 2402 should be porous. In the illustrated case, both of these electrodes are porous, and made by the opal templating process of A. Zakhidov et al., Science 282, 897 (1998) and U.S. Pat. No. 6,261, 469 and U.S. Pat. No. 6,517,762). A direct photonic crystal (also called a direct-lattice photonic crystal or a opal photonic crystal) typically comprises spheres. An inverse photonic crystal (also called an inverse-lattice photonic crystal or inverse-opal photonic crystal) is made by templating the void space of a direct photonic crystal. Like for the device of FIG. 23, there are advantages in minimizing the amount of electrolyte in the device. The reason for doing so is that any electrolyte that provides a substantial path for thermal transport between hot and cold regions of the device can degrade ZT, since it increases the effective $\sigma_T$.

The unexpected discoveries involving this invention show that it is not necessary for electrolyte to substantially fill nanoporous electrode of FIG. 24 (2402 or 2405) in order to obtain electrochemical tunability of thermoelectric properties. This is in contrast with the prior art, such as earlier teachings of R. H. Baughman et al. in U.S. Pat. No. 6,555,945. The benefit of largely eliminating the electrolyte from these porous elements is to decrease the effective contribution of electrolyte thermal conductivity to $\sigma_T$ in the equation for ZT. In fact, ZT can be maximized by using the minimal amount of electrolyte that is needed to provide a continuous ion path between the working and counter electrodes (2402 and 2405).

Devices of invention embodiments can be used for the control of electromagnetic wave propagation and reflectivity for ultraviolet, visible, infrared, radio frequency, and microwave frequency regions. Such switching can use changes in electrical conductivity, refractive index, dielectric constant, absorption, and reflectivity as a consequence of electronically controlled predominately no-faradaic charge injection. It is known in the prior art that such changes can be induced in porous materials by electrochemical non-faradaic charge injection. However, the prior art has not understood that such electrochemical switching of properties can occur for material regions that are not contacted by an electrolyte. One benefit of invention embodiments is the decrease or total elimination of undesirable properties contributions from an electrolyte.

Figure 25:
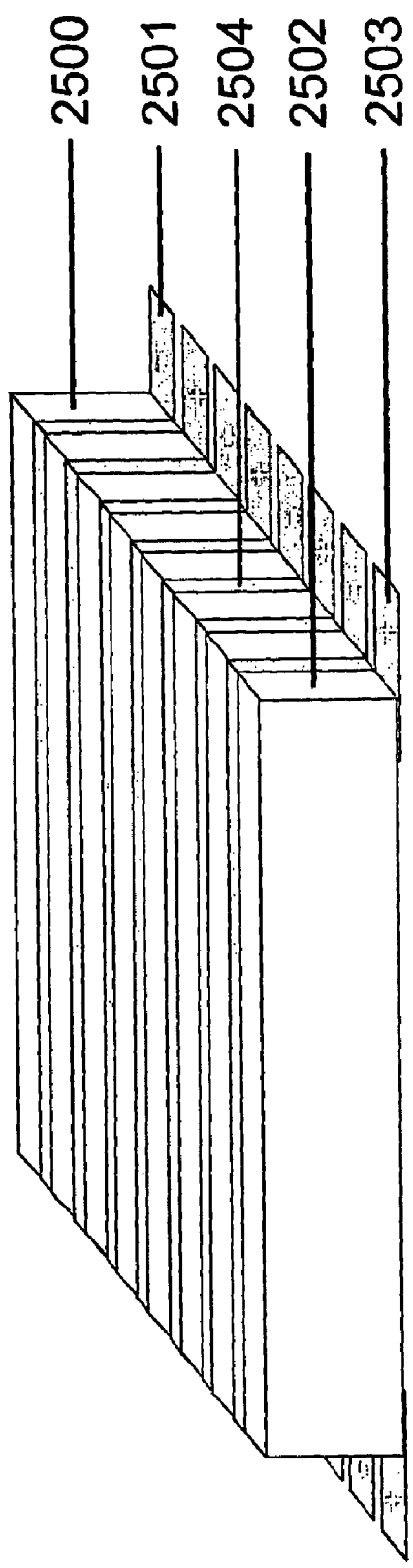
FIG. 25 illustrates a device embodiment of the present invention where electromagnetic radiation propagates within the device either at least approximately parallel to the electrode layers or predominately along the lengths of element 2500 (and like elements), along the lengths of element 2502 (and like elements), or along both of these types of elements (in contrast with the possibly approximately perpendicular propagation of the electromagnetic radiation for the device of FIG. 13).

The sensor device of FIG. 13 provides one invention embodiment in which optical properties are tuned without employing electrolyte contact to tuned regions that are accessible to the electromagnetic radiation. This embodiment utilizes an electrolyte that is on the reverse side of the optical element (and obscured by it), so that presence of the electrolyte did not adversely affect achieved properties. The device of FIG. 25 is one in which the electromagnetic radiation propagates either at least approximately parallel to the electrode layers or predominately along the lengths of element 2500 (and like elements), along the lengths of element 2502 (and like elements), or along both of these types of elements (in contrast with the possibly approximately perpendicular propagation of the electromagnetic radiation for the device of FIG. 13). Element 2500 is the negatively charge-injected electrode and 2501 is an electrical contact for this electrode. Element 2502 is a positively charge-injected electrode, element 2503 is an electrical contact to this electrode, and element 2504 is an electrolyte that separates elements of the type 2500 from elements of the type 2502. Charge injection in 2500 and in 2502 (and like elements in the array) provides the desired charge in transmission and reflection properties of the device. The device operates by the changes in properties for electromagnetic wave propagation that result from charge injection into 2500 and 2502 (and like elements). The benefit of this device arrangement is that the electrolyte 254 need not penetrate into the elements (2500 and 2502) that are switched by charge injection, so the effects of charge injection on electromagnetic wave propagation are not obscured by possible absorption of electromagnetic radiation by 2504. These benefits result from the discovery of the inventors that predominately non-faradaic charge injection can occur without the need for contacting electrolyte.

Figure 26:
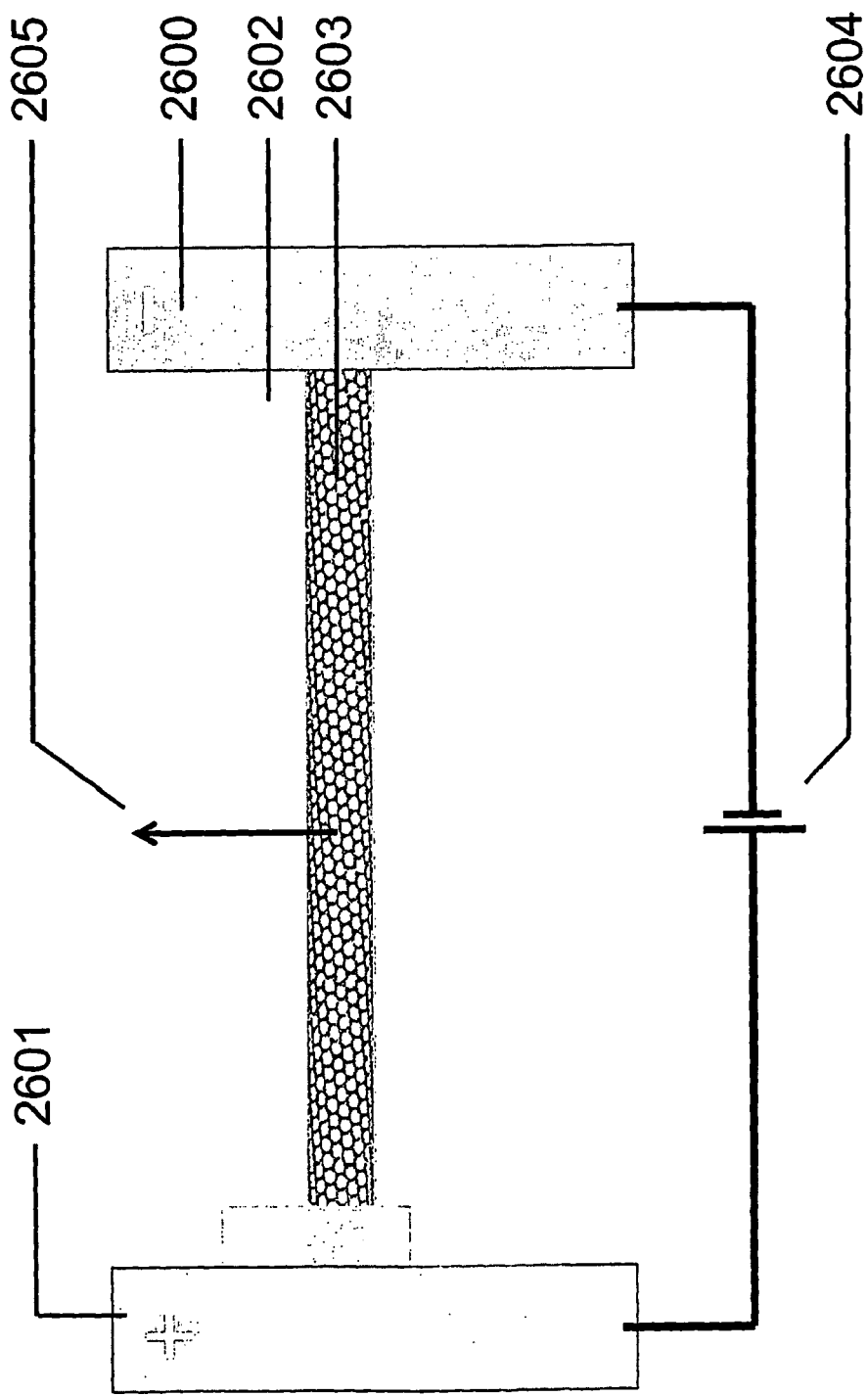
FIG. 26 schematically illustrates an EBIG (Electrolyte-Bare Ion Gated) device that provides electroluminescence by using a semiconducting nanostructured material—in this case a semiconducting carbon nanotube.

FIG. 26 schematically illustrates an EBIG (Electrolyte-Bare Ion Gated) device that provides electroluminescence by using a semiconducting nanostructured material—in this case a semiconducting carbon nanotube. Elements 2600 and 2601 are electrical contacts to a semiconducting nanotube, which are charged negatively and positively, respectively, by the battery and associated electrical connections that comprise element 2604. Element 2602 is an electrolyte that provides a continuous path between opposite ends of the nanotube (element 2603). This device operates by hole injection on one end of the nanotube and electron injection on the opposite nanotube end. These injected charges are compensated by ions of opposite sign that migrate along the nanotube to coulombically compensate for the injected charge. Light (indicated by the arrow 2605 is emitted as a result of recombination of injected holes and electrons. Unlike other invention embodiments, the working and counter electrodes of this device are electronically interconnected, albeit with a semiconducting nanotube.

Figure 27:
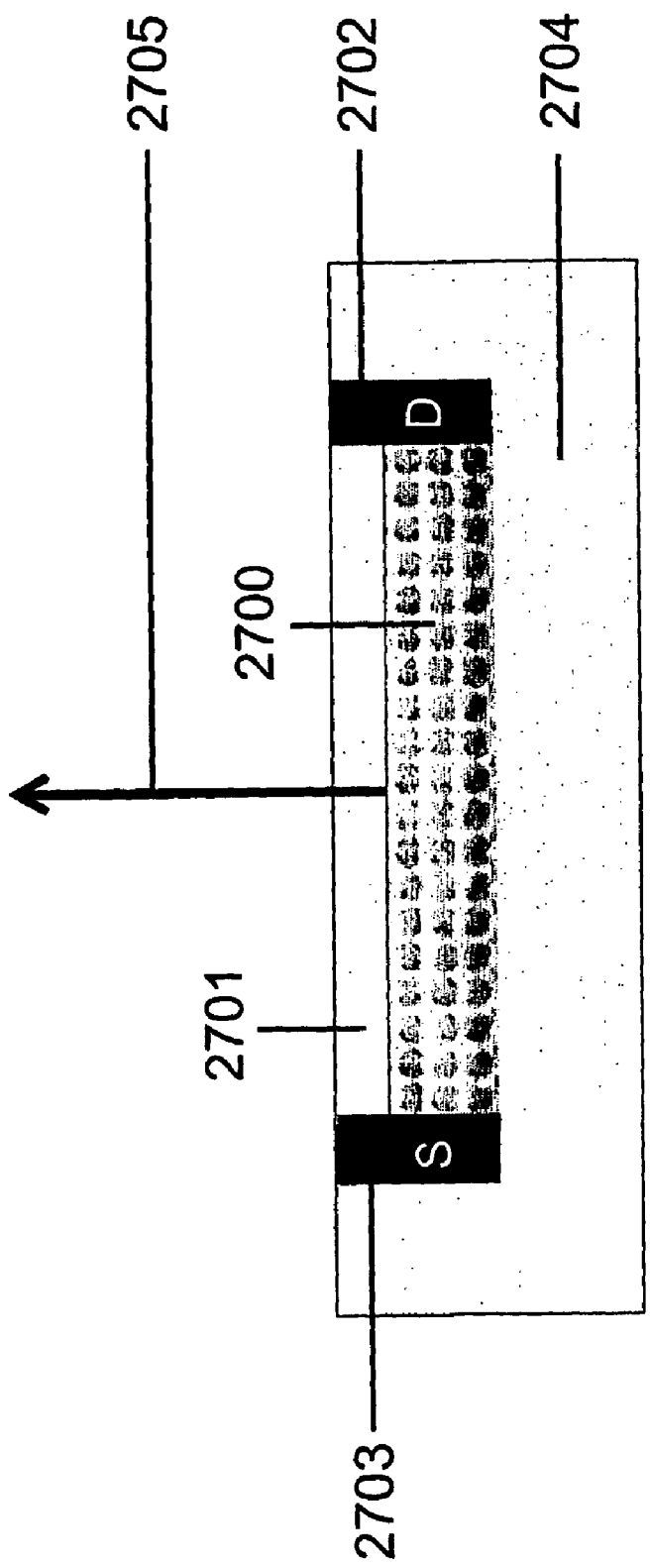
FIG. 27 schematically illustrates another EBIG that is light emitting, wherein the light-emitting element is a semiconducting inverse-opal photonic crystal.

FIG. 27 schematically illustrates another EBIG that is light emitting, wherein the light-emitting element is a semiconducting inverse-opal photonic crystal (2700). Elements 2702 and 2703 are source and drain electrodes, respectively, and are simultaneously working and counter electrodes. These electrodes contact opposite sides of the pictured photonic crystal 2700, which is also contacted by the electrolyte 2701, which can be a solid-state electrolyte that is highly transparent in the spectral range where light emission is required. Element 2704 is an insulating substrate material, which can optionally contain an array of the EBIG light emitters, as well as semiconductor devices for independently varying light emission from each EBIG light emitter. Hole and electrons are injected on opposite ends of the semiconducting crystal 2700 as a result of the EBIG gating, which are electrostatically compensated by the diffusion of counter-ions from the electrolyte 2701. Charge carriers of opposite sign are injected by the source and drain electrodes and their recombination in 2700 results in the emission of light (illustrated by element 2705). The benefit of having the electrolyte substantially non-penetrating in 2700 is that the width of the photonic bandgap is unaffected by the refractive index of the electrolyte (although it can be effected to a lesser extent by ions that diffuse into 2700 during electrochemical gating). The benefit of using a photonic crystal as the light-emitting element is that the emission from the photonic crystal is directional. Also, by using teachings of the prior art for non-gated photonic crystal lasers, light emission by lasing can be obtained.

Figure 28:
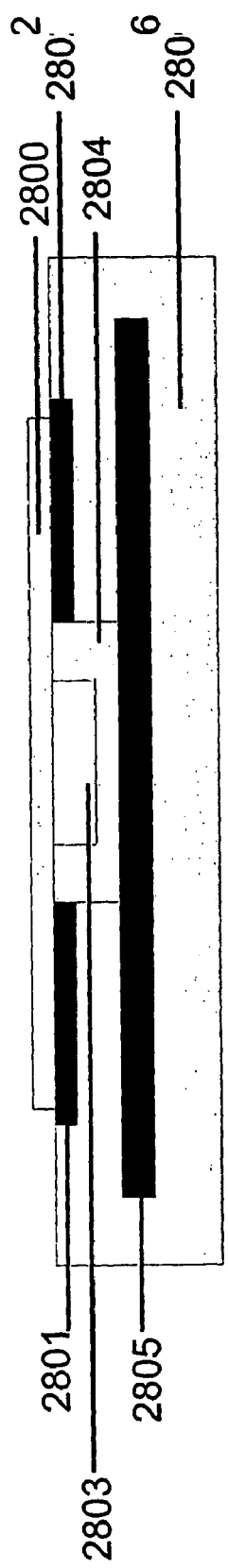
FIG. 28 schematically illustrates a back-gated electrolyte-bare ion gate (EBIG) field effect transistor that has an air gap.

FIG. 28 schematically illustrates a back-gated electrolyte-bare ion gate (EBIG) field effect transistor that has an air gap. This device differs from air-gap field-effect transistors in that the electrolyte 2804 is present, which can supply counter ions of opposite sign for electronic charges injected into channel 2800 by the source electrode (2801) and drain electrode (2802). Element 2805 is the gate electrode, element 2806 is an insulator, and element 2803 is an air gap. For application modes in which the device of FIG. 28 is used like a Chem-FET (field effect transistor chemical sensor) for gas sensing, this air gap can optionally be used as a gas flow path for gas sensing and analysis. As for other EBIG sensor devices of the invention embodiments, devices of FIG. 28 can be used for detailed gas sensing by the equivalent of gas cyclic voltammetry, in which case it is useful to have one or more reference electrode in electrolyte 2804.

This device of FIG. 28 fundamentally differs from the ion-gated devices of the prior art in that the channel electrode 2800 is not fully contacted with electrolyte and non-contacted regions substantially contribute to device functionality. The entire device of FIG. 28 can optionally be encapsulated in a protective material, such as a barrier polymer, using known art of device coating. Various device geometries orthogonal to this cross-sectional view can be conveniently used. For example, application modes of this device as a gas sensor can profitably use a configuration in which the air gap 2803 is used for gas delivery and is elongated orthogonal to the plane of the drawing. On the other hand, using either a square or cylindrical geometry for this air gap can facilitate miniaturization. The left and right parts of channel 2800 (together, respectively, with the contacting electrodes 2801 and 2802) can be viewed as two current-carrying electrochemical electrodes. Element 2805 is a third current-carrying electrochemical electrode. Charge injection into the left and right sides of the channel will be identical if the potential difference between 2801 and 2802 is negligible compared with that between 2801 and 2805. In the case where 2805 is electronically floating, a change in the potential between 2801 and 2802 will result in hole injection in one side of the channel 2800 and hole injection in the opposite side of 2800. This channel ideally has a semiconducting state, so that changes in the degree of charge injection can provide large changes in the conductivity of the channel, which is measured by the source-drain current (between 2801 and 2802) that results from the application of a small change of potential between source and drain. The channel 2800 can be either nonporous or solid, and element 2805 can be either faradaically or non-faradaically charged during device operation. Also, ions can either be stored in the electrolyte in one state of the device or these ions used for the charge-discharge process of 2800 and 2805 can be shuttled between 2805 and 2800 (and the reverse) during device operation. A combination of these ion processes can also be profitably used. In one device embodiment, the gate 2805 is optionally a metallic conductor. In another invention embodiment, 2805 is a semiconducting material, electrical contacts are provided between opposite ends of 2805, and measurement of current flow between these electrical contacts (in response to a potential difference between these contacts) provides a second type of device response.

Various metal disulfides are especially useful as channels for the devices like that shown in FIG. 28, like the semiconducting $WSe_2$, $MoS_2$, $MoSe_2$, $HfS_2$, $SnS_2$ layer phases. The related phase of $NbSe_2$ is useful for other invention embodiments, since it is metallic at ambient and superconducting at low temperatures.

Note that the device configuration of FIG. 28 can also be used for an electroluminescent light source if element 2800 is a semiconductor. In this case, electrode 2805 is optional and functions to assist in electrochemical charge injection in the light-emitting element 2800. The connecting electrolyte path between the left and right sides of the channel 2800 need not be present. In such case, transport of ions between opposite ends of 2800 can occur either within 2805 or on the surface of 2805.

Figure 29:
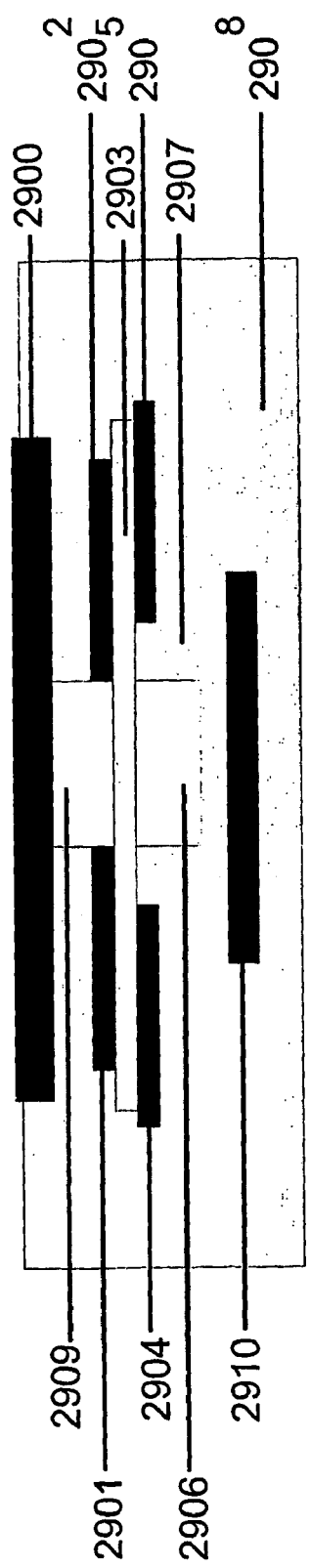
FIG. 29 illustrates a device embodiment of the present invention, wherein the advantageous combination of non-faradaic electrochemical and gas-gap-based electrostatic charge injection for a chemical sensor that can replace conventional Chem-FETs, is depicted. This illustrated embodiment depicts a Chem-FET sensor device that is at the same time a EBIG sensor.

The device of FIG. 29 shows the advantageous combination of non-faradaic electrochemical and gas-gap-based electrostatic charge injection for a chemical sensor that can replace conventional Chem-FETs. This example is for a Chem-FET sensor device that is at the same time a EBIG sensor. An analyte gas is passed through conduit 2906. Element 2909 is either an air gap or, if elements 2906 and 2909 are optionally connected, a gap that is filled with the analyte gas. Element 2907 is an electrolyte; element 2903 is a semiconducting channel; elements 2904, 2905, and 2910 are source, drain, and gate electrodes for dry-state electrochemical charge injection; element 2908 is an insulator; and elements 2901, 2902, and 2900 are, respectively, source, drain, and gate electrodes for the gas-gap-based electrostatic charge injection. The benefit of this hybrid Chem-FET is that either dielectric-based or electrochemical dry-state charge injection can be used (or a combination thereof). Only the electrochemical charge injection results in the movement of ions onto the channel, and these ions modify device response for a given degree of charge injection. Hence, the availability of these two charge injection methods enables improved selectivity for analyte detection.

The technologies for fabricating nanoscale materials, nanoscale devices and nanoscale materials assembled within macroscopic devices have rapidly advanced in the last decade, and these technologies can be exploited for the fabrication of devices of invention embodiments. For example, numerous methods have been developed that are applicable for positioning nanofibers within devices, orienting these nanofibers in desired directions, and providing appropriate electronic interconnections. Issues such as determining the most appropriate contacting metal and the deposition methods applicable for these metals in nanoscale devices are resolved to a satisfactory state in the prior art literature (see, for example, Y. F. Hsiou et al., Applied Physics Letters 84, 984-986 (2004) for methods for applying low resistance contacts to carbon nanotubes).

Well known and widely practiced micro-lithographic techniques can be used to obtain patterned depositions and to anchor nanofibers (such as carbon nanotubes) on a substrate. A useful solution to the problem of firmly mechanically and electrically contacting individual single-wall nanotubes or single-wall nanotubes bundles (while leaving much of the nanotube or nanotube bundle free of constraining contacts) has been described by D. A. Walters et al. in Applied Physics Letters 74, 3803-3805 (1999). Using micro-lithographic techniques, these authors demonstrated that single-wall nanotubes could be rigidly attached on opposite ends (both electrically and mechanically), so that they are suspended over a microscopic trench.

Various other methods well known in the prior art can be used to provide nanofibers that are positioned in desired locations on substrates, and appropriately oriented. One method is by "scanning tip electrospinning", which has been described by J. Kameoka et al. in Nanotechnology 14, 1124-1129 (2003). This method achieves patterned deposition of continuous individual nanotube fibers by electrostatic spinning from a microfabricated spinning tip. Electrostatic spinning is typically of a solution of a polymer (such as polyethylene oxide, polyacrylonitrile, DNA, a conducting polymer like polyaniline, polyethylene, and various copolymers), which can optionally include particles such as carbon nanotube fibers (see D. H. Reneker and I. Chun in Nanotechnology 7, 216-223 (1996)). Depending upon the final state needed for the patterned spun nanofibers, the polymer can be pyrolized (such as to convert a polyacrylonitrile nanofiber to a carbon nanofiber), dissolved, or chemically etched array (so as to reveal the nanoparticles, such as carbon nanotube fibers). Probably the most commonly used method for starting nanotube growth from a desired position on a substrate is to deposit the catalyst nanoparticles used for growth at that position, for example using either contact printing or photolithographic methods (H. Dai, Accounts Chemical Research 35, 1035-1044 (2002)). As shown in the preceding reference, contact printing on posts within a post array can be used to grow nanotubes between these posts—like the wires spanning high-tension towers. Orientation of nanofibers in a desired direction on substrates can involve such methods as dielectrophoresis (R. Krupke et al., Nano Letters 3, 1019-1023 (2003)), the orientating effects of liquid crystals or fluid flow fields (S. Huang et al., J. Am. Chem. Soc. 125, 5636 (2003)), and magnetic or electric fields (Y. Zhang et al., Applied Physics Letters 79, 3155-3157 (2001) and H. Dai, Accounts Chemical Research 35, 1035-1044 (2002)). Also important for device fabrication, nanofibers (such as carbon nanotubes) self-orient during microwave plasma-enhanced chemical vapor growth to be locally perpendicular to the growth substrate even when this substrate is highly non-planar, such as the surface of an optical fiber (see C. Bower et al., Applied Physics Letters 77, 830-832 (2000)). Like the case of carbon nanotubes, ZnO conveniently self-organizes into useful forest-like arrays (with the nanowires orthogonal to the substrate) during simple vapor transport and condensation processes (M. H. Huang et al., Science 292, 1897-1899 (2001)). Forms of elemental carbon, especially carbon nanofibers or graphite are included in some compositions as one or more electrodes for invention embodiments. Like for the case of conducting polymers most of these carbon compositions can be used as either predominately non-faradaic or predominately faradaic electrodes, depending upon the gravimetric surface area of the form of carbon and the potential of device operation. For use as a non-faradaic electrode or non-faradaic electrode component, graphite is especially suited to be in the form of largely exfoliated graphite. Suitable carbon fibers include multi-wall nanotubes (which comprise concentric graphite sheets), single-wall nanotubes (which comprise a single cylindrical graphite sheet), carbon fiber scrolls (a spirally wound graphite sheet), and carbon fibers with radial alignment (in which graphite planes extend radially about the fiber direction). Since multi-wall carbon nanotubes, single-wall carbon nanotubes (SWNTs), and carbon nanotube scrolls have hollow interiors, these hollow materials can optionally be filled by insulating, semiconducting, or metallic compositions by known methods, so as to thereby modify charge injection characteristics. In order to maximize surface area for predominately non-faradaic charging, the number-average diameter of single-wall and multi-wall carbon nanotubes used as predominately non-faradaic electrodes is preferably below about 10 nm. The term number-average diameter means the ordinary average of the diameters of the nanotubes, without any special weighting according to the size of the diameter.

Single-wall carbon nanotubes (SWNTs) are especially well-suited for use as electrodes. The dual laser method, the chemical vapor deposition (CVD) method, and the carbon-arc method are suitable methods for making the carbon nanotubes, especially single-wall carbon nanotubes, and these methods are well known in the literature (R. G. Ding et al., Journal of Nanoscience and Nanotechnology 1, 7 (2001) and J. Liu et al., MRS Bulletin 29, 244-250 (2004)). Carbon single-wall nanotubes can have armchair, zig-zag, or chiral arrangements of carbon atoms. These nanotubes are differentiated in that the armchair nanotubes have a circumference of para-connected hexagonal rings (like found in poly(p-phenylene)), the zig-zag nanotubes have a circumference of linearly side-connected hexagonal rings (like found in linear acenes), and the chiral nanotubes differ from the armchair and zig-zag nanotubes in that they have a sense of handedness. The geometry of carbon nanotubes is specified using conventional nomenclature using the indices (n, m). Depending on the appearance of a belt of carbon bonds around the nanotube diameter, the nanotube is the armchair (n=m), zig-zag (n or m=0), or chiral (any other n and m) variety. All armchair SWNTs are metals; those with n−m=3k, where k is a nonzero integer, are semiconductors with a tiny bandgap; and all others are semiconductors with a bandgap that inversely depends on the nanotube diameter. Since methods are available for selecting carbon nanotubes according to conductivity type, the choice of nanotubes for particular applications can be optimized. The optimal SWNT type depends upon the device or materials application. Metallic nanotubes are generally suitable for applications where maximum conductivity is desired, such as for transparent conductors or as counter electrodes where rapid response rate is desired. On the other hand, semiconducting nanotubes are desired for the channel material for semiconductor devices of the present invention.

Various methods of separating single wall and multiwall nanotubes (by type, length, diameter, etc.) are useful for invention embodiments. Examples of known methods for such separation involve (1) use of charge transfer agents that complex most readily with metallic nanotubes, (2) complexation with selected types of DNA, and (3) dielectrophoresis (R. Krupke et al., Nano Letters 3, 1019-1023 (2003) and R. C. Haddon et al., MRS Bulletin 29, 252-259 (2004)). These and other methods can be used to provide nanotube materials for the practice of this invention, such as the nanofiber transistors of FIGS. 11 and 12. The various dielectrophoretic methods are especially useful for depositing nanotubes of a desired conducting type (metallic (or small bandgap) or semiconducting nanotubes) on a device substrate between two electrodes (which are used to apply the alternating current potential used for the dielectrophoresis). Depending upon the frequency of the voltage applied for dielectrophoretic deposition, either metallic (and near metallic nanotube having very small bandgaps) or semiconducting nanotubes (having much larger band gaps) can be preferentially deposited on semiconductor substrates. If the nanotubes in solution are partially bundled, and the chosen frequency for the dielectrophoretic process favors deposition of metallic nanotubes, the deposited nanotubes can be bundles containing a metallic nanotube (or very small bandgap semiconducting nanotube) together with semiconducting nanotubes. More generally, if it is desirable to remove metallic nanotubes from a single walled nanotube bundle (or remove a metallic nanotube from being the outermost wall on a multiwall nanotube, well-known high voltage pulse methods can be used (see P. Collins et al., Science 292, 706-709, (2001) and A. Javey et al., Nano Letters 2, 929-932 (2002)).

Synthetic methods generally result in mixtures of nanotubes having different diameters. Use of catalyst for nanotube synthesis that is close to monodispersed in size (and stable in size at the temperatures used for synthesis) can dramatically decrease the polydispersity in nanotube diameters, and having this narrower range of nanotube diameters can be useful for invention embodiments. S. M. Bachilo et al. describe such a method in Journal of the American Chemical Society 125, 11186-11187 (2003).

Nanotubes and nanoscrolls filled with agents that provide charge transfer to the nanotubes are included in preferred electrode compositions, including those used as device channels. One reason for this preference is that these agents effectively bias the degree of charge transfer to the nanotubes and nanoscrolls, thereby shifting the Fermi level of the nanotubes and consequently the density of states at the Fermi level. The filled volume of the nanotubes should have a net non-zero charge and the counter charge to this net non-zero change can predominately reside on or near the external surface of the nanotube or nanoscroll. Examples of filling agents that can have a net non-zero charge when inside the nanotubes or nanoscrolls are ionic salts and salt solutions, partially ionized elements (such as alkali metals and divalent elements such as calcium), and organic transfer agents. For the purposes of this invention embodiment, ionic salts and ionic salt solutions inside nanotubes and nanoscrolls are not considered to be contacting electrolytes. Other suitable filling agents for nanotubes and nanoscrolls are fullenenes (especially $C_{60}$) and fullerenes complexed with charge transfer agents (like monovalent, divalent, and trivalent elemental metals). The complexed fullerenes that are included within the volume of the nanotube or nanoscroll can optionally comprise endohedral fullerenes that contain n species Z that are within the $C_m$, which are designated using the symbols $Z_n@C_m$. Typical examples are $Gd@C_{82}$, $La@C_{82}$, $La_2@C_{82}$, $Sm@C_{82}$, $Dy@C_{82}$, $Ti_2C_{80}$, $La_2C_{80}$, and like compositions.

Various methods are particularly useful in invention embodiments for filling or partially filling nanotubes. These methods typically include a first step of opening nanotube ends, which is conveniently accomplished using gas phase oxidants, other oxidants (like oxidizing acids), or mechanical cutting. The opened nanotubes can be filled in various ways, like vapor, liquid phase, melt phase, or supercritical phase transport into the nanotube. Methods for filling nanotubes with metal oxides, metal halides, and related materials can be like those used in the prior art to fill nanotubes with mixtures of $KCl$ and $UCl_4$; $KI$; mixtures of $AgCl$ and either $AgBr$ or $AgI$; $CdCl_2$; $CdI_2$; $ThCl_4$; $LnCl_3$; $ZrCl_3$; $ZrCl_4$, $MoCl_3$, $FeCl_3$, and $Sb_2O_3$. In an optional additional step, the thereby filled (or partially filled) nanotubes can be optionally treated to transform the material inside the nanotube, such as by chemical reduction or thermal pyrolysis of a metal salt to produce a metal, such as Ru, Bi, Au, Pt, Pd, and Ag. M. Monthioux, Carbon 40, 1809-1823 (2002) provides a useful review of these methods for filling and partially filling nanotubes, including the filling of nanotubes during nanotube synthesis. The partial or complete filling of various other materials useful for invention embodiments is described in J. Sloan et al., J. Materials Chemistry 7, 1089-1095 (1997).

Conducting nanofibers need not contain carbon in order to be useful for invention embodiments, and a host of processes are well known in the art for making suitable nanofibers. Some examples are the growth of superconducting $MgB_2$ nanowires by the reaction of single crystal B nanowires with the vapor of Mg (Y. Wu et al., Advanced Materials 13, 1487 (2001)), the growth of superconducting lead nanowires by the thermal decomposition of lead acetate in ethylene glycol (Y. Wu et al., Nano Letters 3, 1163-1166 (2003)), the solution phase growth of selenium nanowires from colloidal particles (B. Gates et al., J. Am. Chem. Soc. 122, 12582-12583 (2000) and B. T. Mayer et al., Chemistry of Materials 15, 3852-3858 (2003)), and the synthesis of lead nanowires by templating lead within channels in porous membranes or steps on silicon substrates. The latter methods and various other methods of producing metal and semiconducting nanowires suitable for the practice of invention embodiments are described in Wu et al., Nano Letters 3, 1163-1166 (2003), and are elaborated in associated references. Y. Li et al. (J. Am. Chem. Soc. 123, 9904-9905 (2001)) has shown how to make bismuth nanotubes. Also, X. Duan and C. M. Lieber (Advanced Materials 12, 298-302 (2000)) have shown that bulk quantities of semiconductor nanofibers having high purity can be made using laser-assisted catalytic growth. These obtained nanofibers are especially useful for invention embodiments and include single crystal nanofibers of binary group III-V materials (GaAs, GaP, InAs, InP), tertiary III-V materials (GaAs/P, InAs/P), binary II-VI compounds (ZnS, ZnSe, CdS, and CdSe), and binary SiGe alloys. Si nanofibers, and doped Si nanofibers, are also useful for invention embodiments. The preparation of Si nanofibers by laser ablation is described by B. Li et al. (Phys. Rev. B 59, 1645-1648 (1999)). Various methods for making nanotubes of a host of useful materials are described by R. Tenne in Angew. Chem. Int. Ed. 42, 5124-5132 (2003). Also, nanotubes of GaN can be usefully made by exitaxial growth of thin GaN layers on ZnO nanowires, followed by the removal of the ZnO (see J. Goldberger et al., Nature 422, 599-602 (2003)). Nanofibers having approximate composition $MoS_{9-x}I_x$, which are commercially available from Mo6 (Teslova 30, 1000 Ljubljana, Slovenia) are included as useful compositions (most especially for x between about 4.5 and 6). Related compositions are also described by D. Vrbanić et al. in Nanotechnology 15, 635-638 (2004). Among other applications embodiments, these latter fibers are useful for electron emission tips and as a tunable superconductor.

Another way to make the high-surface-area materials used in invention embodiments is by templating a self-assembled structure that has high surface area. For example, a periodic template crystal (called an opal) can be obtained by the sedimentation of spheres that are substantially monodispersed in diameter. These spheres typically have an average sphere diameter of between 500 nm and 10 nm. In most cases, these spheres are from either (a) an inorganic oxide, such as $SiO_2$, which can be removed by chemical processes such as exposure to aqueous acid or base, or (b) an organic polymer that can be removed by pyrolysis, chemical reaction, or dissolution. The template crystal, after an optional sintering process to provide inter-sphere necks, is infiltrated with either the electrode material or a material that can be converted to the electrode material. This sintering process in described by Zakhidov et al. in Science 282, 897 (1998) and U.S. Pat. No. 6,261,469 and U.S. Pat. No. 6,517,762. Thereafter, the template material is removed to provide an inverse lattice, which is a structural replica of the original template crystal. As an example, Zakhidov et al. (Science 282, 897 (1998)) used plasma-enhanced CVD to make a very high surface area graphitic carbon. Millimeter thick opal plates based on monodispersed $SiO_2$ spheres were infiltrated with carbon from a hydrogen/methane plasma created by microwave excitation. Extraction of the $SiO_2$ spheres from the carbon infiltrated opal (using aqueous HF) resulted in a very high surface area, nanoporous foam in which carbon layers as thin as 40 Å make the internal surface of the foam. As another suitable method for fabrication conducting sphere arrays having high surface area for use as nanostructured electrodes, conducting spheres that are nearly monodispersed in diameter can be directly assembled from sphere dispersions using conventional methods. These spheres are typically less than about 200 nm in average diameter, more typically less than 100 nm in average sphere diameter, and most typically less than 50 nm in average sphere diameter.

The devices of this invention may comprise more that two current-carrying electrodes that can be operated at different voltages. Advantages of using more than two current carrying electrodes are that additional flexibility is achieved with respect to the degree of charge injection in the individual electrodes, which can be useful for optimizing device performance.

In some processes of the present invention, electrode charging for at least one electrode is predominately non-faradaic, meaning that over 50% of the initially injected charge is injected non-faradaically. It should be emphasized that this definition pertains to the nature of initial charge injection from the electrolyte, since initially non-faradaically injected charge can later transform to charge that is retained faradaically during electrode drying processes. Such is the case if dopant ions that are initially stored in an electrochemical double layer later intercalate into the electrode material. In the non-faradaic process of certain embodiments, the ions from the electrolyte (which compensate the electronic charges injected into the electrodes) are located close to the surface of at least one of these electrode elements. This is in contrast to the faradaic processes where the ions that compensate the injected electronic charges penetrate inside the electrode material and change its structure, usually expanding it. In some invention embodiments, typically over 50% of the stored charge is stored non-faradaically in the charged material, meaning that at least 50% of this stored charge is associated with ions on or near the surface of the material. In some invention embodiments, typically over 75% of the stored charge is stored non-faradaically in the electronically charged material, meaning that at least 75% of this stored charge is associated with ions on or near the surface of the material. Because of this location of charge on material surfaces in the non-faradaic processes of invention embodiments, ions from the electrolyte need not penetrate the electrode material and need not cause phase changes within the electrode material. This use of non-faradaic charge injection is generally most important for device applications where the charge injected electrode material must be repeatedly charged and discharged during device operation, since non-faradaic charge injection generally provides longer device cycle life than does faradaic charge injection. It should be recognized that charge injection processes can be non-faradaic over one potential range, and then become faradaic when this potential range is extended. Consequently the definitions of predominately non-faradaic and predominately non-faradaic indirectly signify the potential range used for hole or electron charging. A device is called a predominately non-faradaic as long as there is a device operation range where a useful device response can be obtained from predominately non-faradaic charging of at least one electrode. While charge that is initially inserted predominately non-faradaically can later produce materials intercalation (i.e., ions insertion into solid material volume), it is advantageous if less than 50% of counter ion charge associated with maximum injected electronic charge is intercalated in a solid material during material use or normal device operation.

The achievement of very high electrode capacitances requires the use of nanostructured materials that have small sizes in at least one dimension, and such small dimensions can affect the properties of the nanostructured material in both charge-injected and non-charge-injected states. Consequently, the use of materials with larger dimensions (sheet thicknesses, fiber diameters, or particle sizes) can in some cases be suitable (with a corresponding decrease in suitable electrode capacitances)—especially for the tuning of highly-scale-sensitive properties, such as ferromagnetism.

The case where only the working electrode operates predominately non-faradaically is also included in invention embodiments. Devices in which ions predominately insert on the internal and external surface of one electrode and in the material volume of the second electrode are included here. This can be a useful embodiment in cases where cycle life limitations are not problematic for the desired application mode or where the potentially higher charge storage densities of faradaic processes provide needed benefits of reduced device size or weight. However, predominately non-faradaic operation of both electrodes is useful when very long device cycle lifetimes are needed, when charge-injection modified properties of both electrodes are utilized, or when dopant intercalation and associated structural changes degrade needed properties.

The device types of some embodiments have at least one electrode (typically the working electrode) that has high gravimetric surface area, since this high surface area is typically required to obtain high degrees of double-layer (non-faradaic) charge injection. In fact, material selection to provide either predominately non-faradaic or predominately faradaic performance is made according to either surface area measurements or structural results (from typically scanning electron microscopy, SEM, electron transmission microscopy, TEM, or atomic probe microscopies). The gravimetric surface area is conveniently taken as the surface area measured in nitrogen gas by the standard Brunauer-Emmett-Teller (BET) method. The gravimetric surface area of the working electrode is advantageously above about 1 $m^2/g$, more advantageously above about 10 $m^2/g$, and most advantageously above about 100 $m^2/g$. In some instances where the electrodes must be repeatedly charged and discharged during device operation and long cycle life is needed, the surface area of both working and counter electrodes is advantageously above 1 $m^2/g$, more advantageously above about 10 $m^2/g$, and most advantageously above about 100 $m^2/g$.

It is advantageous for some device embodiments that either the working electrode or both working and counter electrodes comprise a mixture of electronically conductive materials that serve as electrode components. This mixture of materials in the electrodes can include materials that are non-faradaically charged and faradaically charged.

The working and counter-electrodes can be made of either the same or different materials. Suitable examples of electrode materials include (a) high surface area metallic compositions obtained by the degenerate doping of semiconductors (such as Si, Ge, n-doped or p-doped cubic boron nitride, mixtures of Si and Ge, and GaAs), (b) conducting forms of conjugated organic polymers (such as polyacetylene, poly(p-phenylene), or poly(p-phenylene vinylene) and copolymers thereof), (c) carbonaceous materials obtained by the pyrolysis and surface area enhancement of polymers, (d) graphite, carbon nanotubes, and less ordered forms of carbon formed by pyrolysis, (e) elemental metals and alloys of these metals, and (f) electrically conducting metal oxides and metal chalcogenides (such as CdS and CdSe). Doped diamond is another suitable electrode material, especially hole-doped diamond (which is a conductor and even a superconductor—see E. A. Ekimov et al., Nature 428, 542-545 (2004)). Use of this degeneratively doped diamond as a predominately non-faradaically charge injected material, this diamond should be configured as a high surface area material. Methods for making nanoporous diamond having high surface area are described by A. A. Zakhidov et al. in Science 282, 897 (1998), U.S. Pat. No. 6,261,469, and U.S. Pat. No. 6,517,762.

Organic conducting polymers are among the suitable compositions for use as predominately faradaic electrodes. Very high surface area conducting polymers are included as suitable compositions for predominately non-faradaic electrodes. Various methods can be used to obtain conducting polymer electrodes having high surface areas. For example, known methods can be used for the electrostatic spinning of conducting polymers into nanometer diameter fibers. For these conducting polymers the predominately non-faradaic behavior is obtained as a result of this high surface area and operation of the electrodes in potential ranges where the major faradaic process do not substantially occur. Especially suitable organic conducting polymers are those with planar or nearly planar backbones, such as poly(p-phenylene), poly(p-phenylene vinylene), and polyacetylene. Other suitable conducting polymers are various conducting polypyrroles, polyanilines, polyalkylthiophenes, and polyarylvinylenes.

The synthesis of conducting polymers suitable for such embodiments is well known, and is described, for example, in the Handbook of Conducting Polymers, Second Edition, Eds. T. A. Skotheim et al. (Marcel Dekker, New York, 1998).

The nanostructured conductor (such as a nanotube) used as a charge injected electrode can optionally be coated with another material. If fact, benefits can result even if this overcoated material is a poor electronic conductor. However, if the over-coated material is a poor conductor, provision should be made to insure that charge injection into the nanostructured material can occur. This is accomplished, for example, by either making direct electrical contact to the nanostructured conductor or insuring that the over-coated poorly conducting material is sufficiently thin that tunneling or other electronic transport is possible (on the desired time scale) across this poorly conducting material.

Various benefits can result for over-coating the nanostructured electrode material with a second material. As a first benefit, this over-coated material can serve to protect the charge injected state of this conducting nanostructured material against undesired reaction with redox-active impurities in the environment. This can be the case, for example, when electronic charge injection into a nanostructured material is enabled by ion motion internal to this nanostructured material, such as on the inside of a nanotube or in one of the two possible non-interconnected labyrinths of an inverse lattice photonic crystal. A second achievable benefit is most effectively realized when the ions for the electronically injected charge are on the exterior surface of the over-coated material, so that this over coated material is between the ions and the nanostructured base material. This second benefit is that the enormous electric field generated by charge injection is applied across the over coated material, which can provide useful electronic, magnetic, or optical properties for this material by causing some of the charge to be injected into the over-coated material.

A host of methods can be used for providing this over-coating layer, such a vapor state, liquid state, super-fluid-state coating of the nanostructured electrode material. Also the nanostructured material can be formed inside an insulating over coating material after this over coating material if formed, such as by the filling of insulating boron nitride nanotubes with $C_{60}$ and the subsequent coalescence of arrays of these $C_{60}$ molecules to form carbon nanotubes as the conducting nanostructured electrode material. (See W. Mickelson et al., Science 300, 467-469 (2003) for this process for forming carbon nanotubes inside BN nanotubes.)

Aerogels, and especially carbon aerogels and aerogels based on conducting organic polymers, are included in the list of suitable electrode materials. Resorcinal-formaldehyde-derived carbon aerogels are especially suitable carbon aerogels. These carbon aerogels can be conveniently produced using the sol gel method, supercritical drying using liquid $CO_2$, and pyrolysis in nitrogen at about 1000° C. The synthesis of these carbon aerogels is described by Salinger et al. in Journal of Non-Crystalline Solids 225, 81 (1998) and by Wang et al., in Journal of the Electrochemical Society 148, D75-D77 (2001). Other aerogels that are useful for invention embodiments are described by J. L. Mohanan et al. in Science 307, 397-399 (2005).

Various methods are well known in the literature for assembling nanostructured fibers and particles into forms well suited for the practice of the present invention. For example, sheet shaped electrodes of single-wall nanotubes can be conveniently formed by filtering an aqueous suspension of such purified carbon tubes through poly(tetrafluoroethylene) filter paper, as described by Lui et al., in Science 280, 1253 (1998). Peeling the resulting paper-like sheet from the filter results in a free standing sheet of carbon nanotube bundles. This sheet, which can conveniently range in thickness from 0.1-100 microns, possesses mechanical strength, which is derived from the micro-scale entanglement of the nanotube bundles. In order to increase the mechanical properties of these sheets for the applications, it is advantageous for the nanotube sheets to be annealed at a temperature of at least 400° C. for 0.5 hour or longer prior to use. More advantageously, these nanotube sheets should be annealed at a temperature of at least 1000° C. for 0.5 hour or longer in either an inert atmosphere or a hydrogen-containing atmosphere. In order to preserve the nanotube structure, this anneal temperature is preferably below 2000° C. Alternatively, carbon nanotubes can be deposited on a surface by deposition from a dispersion of nanotubes in a liquid, such as dichloroethane or water, which contains a surfactant (such as Triton X-100 from Aldrich, Milwaukee, Wis.).

The relative and absolute sizes of working and counter-electrodes are important for determining optimal device design. Consider first the case where both working and counter electrodes operate predominately non-faradaically. In order to obtain rapid switching of the properties of the working electrode (without the necessity of faradaic processes in the electrolyte that can degrade cycle life), the total surface area of the counter electrode should generally be at least about twice as large as the working electrode. If a more rapid device response is required, the total surface area of the counter electrode can be at least about ten times larger than that of the working electrode. For microdevices having extremely fast switching rates, it is most advantageous that the total surface area of the counter electrode is at least about a hundred times larger than that of the working electrode. The conditions for high rate switching of the properties of the properties of the working electrode can also be expressed in terms of electrode capacitance, where the ratio of counter-electrode to working-electrode capacitances is advantageously at least about 2, more advantageously at least about ten times, and most advantageously (for certain high rate devices) about at least a hundred times larger than that of the working electrode.

In addition to optimizing rate performance, these relative surface areas and relative electrode capacitances determine the fraction of total applied inter-electrode potential that is applied across each individual electrode. Since the total potential that can be applied is typically determined by the stability of the electrolyte, the selection of increasingly large values for these ratios is also desirable for increasing the fraction of the applied potential that is applied across the working electrode, and therefore increasing the amount of charge injection in this electrode and the corresponding degree of properties change for this electrode. On the other hand, the selection of relative working and counter-electrode capacitances and surface areas close to unity can be desirable if substantial properties switching is needed for both electrodes or if there is a need to minimize device size or weight. Device response rate decreases with increasing size and increasing thickness electrodes, and the lowest capacitance electrode typically determines response rate. Hence, for applications were high charge and discharge rates are needed, the thickness of the lowest capacity electrode should be advantageously below about five millimeters (5000 microns), more advantageously below about 1000 microns, even more advantageously below about 100 microns, and most advantageously below 50 microns. However, it should be understood from the present teachings that much thinner electrodes can be desirably used when very fast rate response is not a performance issue and much thinner electrodes can be used in microscopic devices where very small sizes and very high charge/discharge rates are required. Charge injected materials that are larger than a micron in the smallest external dimension are useful for applications where the substantial material volumes are required. In order to achieve large degrees of charge injection, such materials should ideally contain at least about 50% void volume.

With further regard to the rate of device response, the rate response (as a fraction of the maximum achievable response) increases with increasing values of $(R_S C_S)^{-1}$, where $R_S$ is the effective resistance of the electrochemical system and $C_S$ is the effective capacitance of this system. Key contributions to $R_S$ can come from the resistivities of the working and counter electrodes and the resistivity of the electrolyte for ionic conduction. Consequently, it is advantageous that the device contains at least one electrode having an electronic conductivity at room temperature that is above 1 S/cm. More advantageously at least one electrode has an electronic conductivity at room temperature that is above 100 S/cm. Even more advantageously at least one electrode has an electronic conductivity at room temperature that is above 1000 S/cm. Most advantageously, the device contains at least two electrodes that each has an electronic conductivity at room temperature that is above 1000 S/cm. In general, the electrical conductivities of nanotube assemblies will be anisotropic and depend upon the degree of charge injection. In such cases, the conductivities referred to above correspond to the highest conductivity direction of the conducting material in the most conducting state obtained by charge injection.

From a viewpoint of having fast charge and discharge rates, the ionic conductivity of the electrolyte is advantageously above $10^{-4}$ S/cm, more advantageously above about $10^{-3}$ S/cm, and most advantageously above about $10^{-1}$ S/cm. In addition, device response rates are enhanced for the more poorly conducting electrolytes by minimizing the average thickness of electrolyte that separates the at least two typically required device electrodes. The maximum electrolyte thickness that separates the two typically required electrodes is preferably less than 1 millimeter when these electrolytes are solid-state inorganic or organic electrolytes. More preferably this average electrolyte thickness is less than 0.1 millimeters for solid-state electrolytes. However, for highly conducting ionic fluids (such as aqueous salts like aqueous NaCl, aqueous bases like aqueous KOH, and aqueous acids like aqueous sulfuric acid) much larger inter-electrode separations can be used without adversely effecting charge and discharge rates.

Various inorganic and organic liquid, gel, and solid electrolytes can be used for preferred invention embodiments. Generally, liquid electrolytes are ideally suitable for the processes of this invention in which charge is electrochemically induced non-faradaically in a material, and the charge and associated properties changes are retained when the electrode material is disconnected from the power source and the electrolyte is removed from the electrode material. The reason for this suitability is that the convenient means are available for removal of liquid electrolytes from the charge-injected material without eliminating the charge injection (such as simple evaporation of the solvent component of the electrolyte). On the other hand, solid-state electrolytes are suitable for devices that retain the used electrolyte, since the use of solid-state electrolytes eliminates the problems of liquid electrolyte containment and incompatibility with the generic strategies conventionally used for device fabrication. There are tradeoffs between these different electrolyte types with respect to the allowable temperature and voltage operating ranges and the obtainable electrical conductivities. An electrolyte that is suitable (because of its low cost and high ionic conductivity) is water containing simple salts, like 1 M NaCl or 1 M KCl. Other very high ionic conductivity electrolytes (like concentrated aqueous KOH and sulfuric acid) are also suitable for providing rapid charging and discharge. Aqueous electrolytes comprising at least about 4 M aqueous $H_2SO_4$, or 4 M aqueous KOH, are especially suitable for application embodiments where the electrolyte is used only for materials processing by charge injection. Aqueous electrolytes comprising about 38 weight percent $H_2SO_4$ and electrolytes comprising above 5 M aqueous KOH are most especially suitable. For applications where a large degree of charge injection is needed, electrolytes with large redox windows are suitable. Especially suitable organic electrolytes include propylene carbonate, ethylene carbonate, butylene carbonate, diethyl carbonate, dimethylene carbonate, and mixtures thereof with salts such as $LiClO_4$, $LiAsF_6$, $LiPF_6$, $LiBF_4$, $LiCF_3SO_3$, $Li(CF_3SO_2)_2N$, and $Li(CF_3SO_2)_3C$. Ionic liquid electrolytes (like 1-butyl-3-methyl imidazolium tetrafluoroborate) and ionic liquids in polymer matrices are especially suitable because of the achievable wide redox stability range and the cycle life that they provide for redox cycling Solid-state electrolytes can also be used advantageously, since such electrolytes enable all-solid-state devices. Suitable organic-based solid-state electrolytes are polyacrylonitrile-based solid polymer electrolytes (with salts such as potassium, lithium, magnesium, or copper perchlorate, $LiAsF_6$, and $LiN(CF_3SO_2)_2$). Suitable organic solvents for these solid-state and gel electrolytes include propylene carbonate, ethylene carbonate, γ-butyrolactone, and mixtures thereof. Suitable gel or elastomeric solid electrolytes include lithium salt-containing copolymers of polyethylene oxide (because of high redox stability windows, high electrical conductivities, and achievable elastomeric properties), electrolytes based on the random copolymer poly(epichloridrin-co-ethylene oxide), phosphoric acid containing nylons (such as nylon 6,10 or nylon 6), and hydrated poly(vinyl alcohol)/$H_3PO_4$. Other suitable gel electrolytes include polyethylene oxide and polyacrylonitrile-based electrolytes with lithium salts (like $LiClO_4$) and ethylene and propylene carbonate plasticizers. The so called "polymer in salt" elastomers (S. S. Zhang and C. A. Angell, J. Electrochem. Soc. 143, 4047 (1996)) are also suitable for lithium-ion-based devices, since they provide very high lithium ion conductivities, elastomeric properties, and a wide redox stability window (4.5-5.5 V versus $Li^+/Li$). Suitable electrolytes for high temperature device applications include ionic glasses based on lithium ion conducting ceramics (superionic glasses), ion exchanged β-alumina (up to 1,000° C.), $CaF_2$, $La_2Mo_2O_9$ (above about 580° C.) and $ZrO_2/Y_2O_3$ (up to 2,000° C.). Other suitable inorganic solid-state electrolytes are AgI, AgBr, and $Ag_4RbI_5$. Suitable inorganic molten salt electrolytes for high temperature devices include alkali metal halides (such as NaCl, KCl, and mixtures of these salts) and divalent metal halides (such as $PbCl_2$). Some of the proton-conducting electrolytes that are useful in invention embodiments as the solid-state electrolyte include, among other possibilities, Nafion, S-PEEK-1.6 (a sulfonated polyether ether ketone), S-PBI (a sulfonated polybenzimidazole), and phosphoric acid complexes of nylon, polyvinyl alcohol, polyacryamide, and a polybenzimidazole (such as poly[2,2'-(m-phenylene)-5,5'-bibenzimidazole].

The devices of some embodiments can use either one electrolyte or more than one electrolyte. For example, the electrolyte that contacts part of a porous nanostructured electrode can be different from the electrolyte that further provides an ion conducting path between electrodes. Also, different electrolytes can be used as contacting materials for different electrodes. Employing more than one electrolyte can be used to optimize device operation. For instance, a particular electrolyte (or electrolytes) can be chosen for optimizing either double-layer formation or electrode ionic conductivity. While the electrolyte that separates electrodes is substantially electronically insulating, the ion conductor that contacts an individual electrode can have a significant degree of electronic conductivity. In fact, conducting polymers are used as the electrode conducting element for certain described invention embodiments. Like electrolytes, these conducting polymers can provide ion conduction and serve as an ion source. However, unlike electrolytes, these conducting polymers are electronically conducting. Hence, it is advantageous that these conducting polymers do not provide an uninterrupted electronic path between opposite electrodes. For this reason, conducting polymers (or other ion-intercalated electronic conductors) are advantageously used in combination with one or more electronically insulating electrolyte to form a interelectrode pathway that is largely interrupted for inter-electrode electronic transport, but maintained for inter-electrode ion transport.

The following examples are provided to demonstrate particular embodiments of the present invention. It should be appreciated by those of skill in the art that the methods disclosed in the examples which follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLE 1

This example shows that the electrical conductivity of carbon nanotube electrode sheets can be continuously varied by about an order of magnitude using predominately non-faradaic electrochemical charge injection in 1 M NaCl electrolyte These nanotube sheets are fabricated analogously to a previously described method (A. G. Rinzler et al., Appl. Phys. A 67, 29 (1998)) by dispersing the carbon nanotubes in surfactant-containing aqueous solution and filtering this nanotube dispersion though through a 47 mm diameter poly(tetrafluoroethylene) filter sheet (Millipore LS) under house vacuum. A sheet of nanotubes collected on the filter paper, which was washed using water and methanol, dried, and then lifted from the filter paper substrate to provide a free-standing SWNT sheet. The density of these nanotube sheets is about 0.3 g/cm$^3$, versus the density of about 1.3 g/cm$^3$ for densely packed nanotubes having close to the observed average nanotube diameter. Hence the void volume in these nanotube sheets is about 76.9 volume percent. This high void volume, and the correspondingly high accessible surface area, is generally important for achieving high degrees of non-faradaic charge injection. Supporting this conclusion, the measured BET surface area determined from nitrogen gas adsorption for these nanotube sheets is approximately 300 m$^2$/g.

Two carbon nanotube electrodes (one small: ~10 mm wide and ~30 mm long, and the other large: ~1 mm wide and ~30 mm long) were cut from free-standing carbon nanotube sheets made by the above described method. For the purpose of making four-probe electrical conductivity measurement, four in-series electrical contacts were made to the small carbon nanotube electrode. Gold wire (0.0127 mm diameter) was attached using heat cured conductive epoxy (H20E, Epoxy Technology), which was cured at 70° C. for four hours. The area of electrical contact was covered by chemically resistive epoxy (Eccobond A 316, Emerson & Cuming) in order to protect the electrical contact from exposure to subsequently used electrolytes. One electrical contact was similarly made to the large carbon electrode.

The small carbon nanotube electrode with four-probe contacts, the large carbon nanotube electrode having one electrical contact, and the Ag/AgCl reference electrode were immersed in 1M aqueous NaCl. This selected configuration (with the larger electrode about ten times smaller than the larger electrode) keeps the potential of the bigger electrode almost constant as a potential difference is applied between the small electrode (working electrode) and the large electrode (working electrode), to thereby change the potential of the of the small electrode relative to reference electrode. The four-point electrical conductivity of the small electrode was measured as a function of the potential of this electrode with respect to the Ag/AgCl reference electrode.

Multiple experiments using the above-described method provided the following results. When the potential of the carbon nanotube paper electrode (versus Ag/AgCl) was in the range of about −0.35 to about −0.50V, the conductivity showed the minimum of 60-100 S/cm. This conductivity for an uncharged carbon nanotube sheet monotonically increased up to about 1000 S/cm when the applied potential was increased to above +0.9V, and it monotonically increased up to about 250 S/cm when the potential was decreased to below −0.9V. The dependence of conductivity change upon potential (versus Ag/AgCl) was quite symmetric with respect to the potential at which the conductivity minimum occurs (at between about −0.35 about −0.50V).

Cyclic voltammetry in this potential range shows that there are no noticeable peaks due to Faradaic processes in the utilized potential range, indicating that the major electrical conductivity increases (up to an order of magnitude) are the result of predominately non-faradaic charging.

EXAMPLE 2

This example demonstrates that tuning the electrical conductivity of single-wall nanotube sheets over an order-of-magnitude range can also be accomplished using an organic electrolyte, instead of the aqueous electrolyte of Example 1.

The experimental procedure was exactly the same as for Example 1, except that the 1M NaCl aqueous electrolyte was replaced with either 0.1M TBAPF$_6$ (tetrabutyl ammonium hexafluorophosphate) or 0.1M TBABF$_4$ (tetrabutyl ammonium tetrafluoroborate) dissolved in acetonitrile and the Ag/AgCl reference electrode was replaced with the Ag/Ag$^+$ reference electrode. There were no significant differences noted between charge-injection tuning of the nanotube sheet conductivity in 0.1M TBAPF$_6$/acetonitrile and in 0.1 M TBABF$_4$/acetonitrile.

Because the potential window of non-faradaic reaction in non-aqueous electrolyte is much wider than for aqueous electrolytes, the potential can be changed up to +1.0V (versus Ag/Ag$^+$) in the positive potential direction, resulting in a maximum electrical conductivity of above 1000 S/cm at these positive potentials. In the negative potential direction, non-faradaic charging was possible down to −1.5V (versus Ag/Ag$^+$), resulting in a maximum electrical conductivity of about 600-700 S/cm at these negative potentials (where electrons are being injected into the nanotubes). The minimum value was ~100 S/cm near −0.3V (versus Ag/Ag$^+$).

FIG. 1 shows the presently observed continuous tunability of four-point electrical conductivity as a function of applied potential (versus Ag/Ag$^+$) for a sheet of single-wall carbon nanotubes immersed in one of these organic electrolytes (0.1M tetrabutylammonium hexafluorophosphate in acetonitrile). These results show that the electrical conductivity can be increased by over an order of magnitude by electrochemical charge injection. There is slight hysteresis evident for the curves in FIG. 1, with the conductivity σ on the extreme left side of the potential minimum slightly higher for hole injection (increasingly positive applied potential) and the conductivity slightly lower on the extreme right side of the minimum for electron injection (increasingly negative applied potentials). The different curves are for three successive cycles (using squares (101), circles (102), and triangles (103) for successive cycles).

FIG. 3 shows measured cyclic voltammetry during charge injection for the above SWNT sheet when immersed in the above tetrabutylammonium hexafluorophosphate electrolyte. The absence of major peaks in this cyclic voltammetry curve (measured versus Ag/Ag$^+$) indicates that charging is predominately non-faradaic for this electrolyte and potential range.

EXAMPLE 3

This example shows that the hysteresis in properties tuning can be significantly reduced if electrical conductivity is varied by charging the amount of injected charge, as opposed to being controlled by changing applied voltage. This point is illustrated for the 0.1M tetrabutylammonium hexafluorophosphate/acetonitrile electrolyte by comparing the hysteresis in the electrical conductivity versus potential (FIG. 1 and Example 1) with those in FIG. 2, where electrical conductivity is plotted versus charge per carbon in the nanotube working electrode. The decrease that is obtained in hysteresis in going from voltage control of conductivity to charge control is even larger for the aqueous 1 M NaCl electrolyte of Example 1. The data in FIG. 2 also shows the dependence of four-point electrical conductivity upon the amount of injected charge (per carbon) for the nanotube sheet is nearly identical for the 1 M NaCl electrolyte of Example 1 and the 0.1M tetrabutylammonium hexafluorophosphate/acetonitrile electrolyte of Example 2. For the results in FIG. 2, the black data points are for experiments using 0.1M tetrabutylammonium hexafluorophosphate/acetonitrile electrolyte and near-white data points are for measurements using 1 M aqueous NaCl electrolyte. The origin of the charge/carbon scale in FIG. 2 is arbitrary.

EXAMPLE 4

The unexpected results described in this example show that charge non-faradaically injected into carbon nanotube sheets is retained to a large extent when the carbon nanotube sheet is disconnected from the power source, and then dried in either air or in flowing nitrogen gas. This retention of injected charge is indicated by substantial retention of the electrical conductivity enhancement caused by charge injection.

The nanotube sheet preparation and the method of charge injection and conductivity measurement is the same as in the above examples. The electrolyte used is the 0.1M tetrabutylammonium hexafluorophosphate/acetonitrile of Examples 2 and 3.

FIG. 4 shows that the dramatic hole-injection-induced increase in electrical conductivity of the nanotube sheet in FIGS. 1 and 2 is largely retained when the hole-injected electrode is dried in flowing dry nitrogen atmosphere to remove the electrolyte. The insert to this figure shows results over a four-hour period on an expanded time scale. FIG. 5 shows the retention of conductivity enhancement when the nanotube sheet is removed from the electrolyte and held in air for the investigated five day period.

EXAMPLE 5

This example demonstrates the generality of non-faradaically injecting charge in a nanostructured material in accordance with embodiments of the present invention, and maintaining this injected charge and associated properties changes when the charge injected material is removed from the electrolyte and dried. More specifically, it is shown that charge non-faradaically injected into platinum nanoparticle pellets is substantially maintained even after disconnecting the platinum pellets from the power source, their removal from the electrolyte, and exposure of these pellets to a dynamically pumped vacuum for a week.

The platinum nanoparticle pellets investigated here were made at room temperature by compaction of 30 nm platinum nanoparticles. This method used for making the investigated pellets is like that described by J. Weissmüller et al. in Science 300, 312 (2003). The method used for attaching electrodes to the platinum pellets is the same as that described in Example 1 for the carbon nanotube sheets.

The density of these Pt pellets were low (2.74 to 2.96 g/cm$^3$ for an applied compaction pressure of about 0.6 to 1 MPa and 3.71 to 3.75 g/cm$^3$ for an applied compactions pressure of about 2.1 MPa), as compared with the density of solid Pt (21.45 g/cm$^3$). These densities correspond to a volume void space in the Pt pellets of between 81.6 and 87.2 volume percent. This high volume fraction of void space and the corresponding high gravimetric surface area explains the high degree of non-faradaic charge injection that results for modest applied potential for the Pt electrode.

Figure 6:
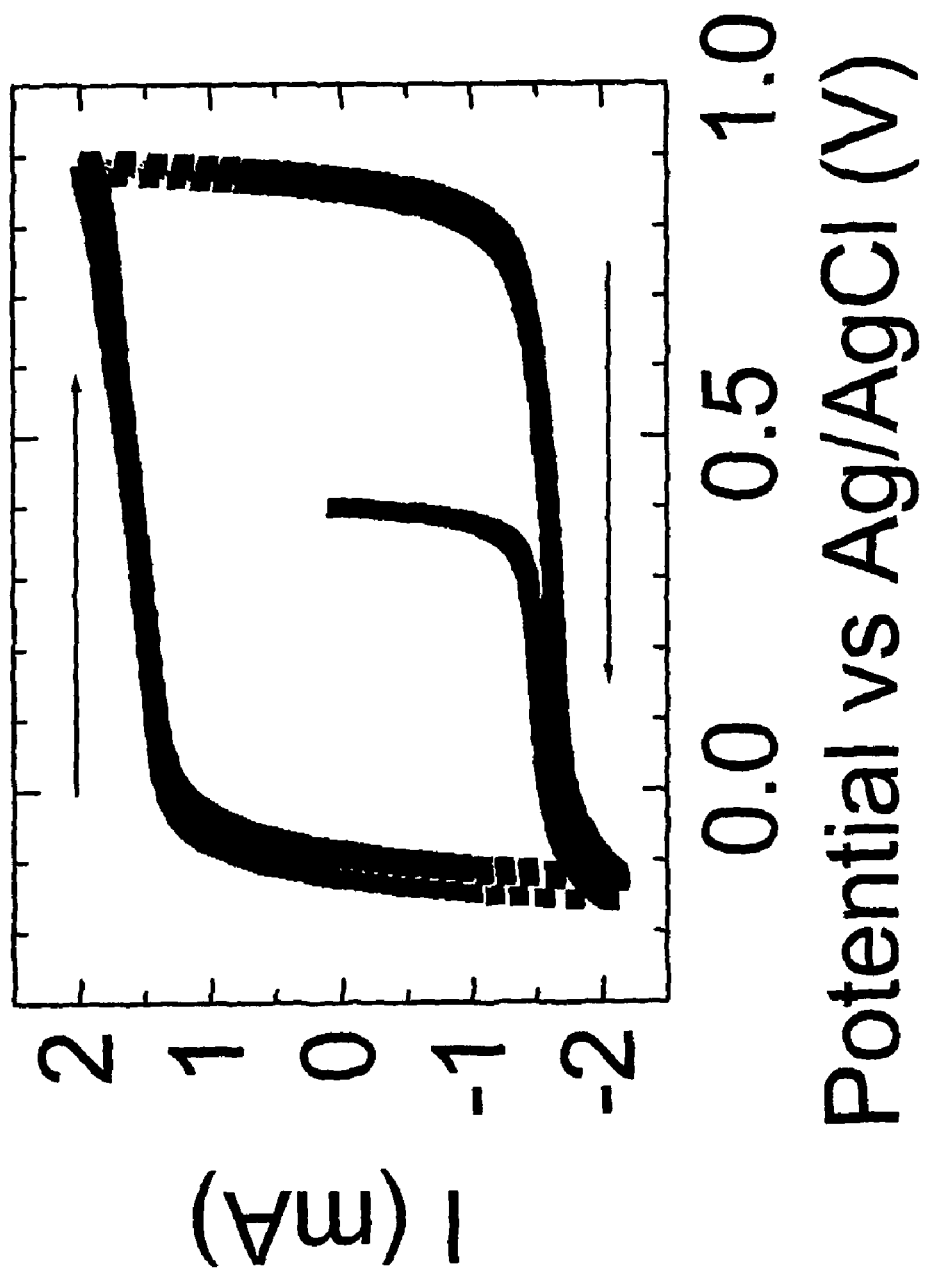
FIG. 6 depicts cyclic voltammetry measurements (20 mV/sec using 1 M aqueous NaCl electrolyte) for nanostructured platinum electrodes, showing that charging is non-faradaic by double-layer charge injection.

FIG. 6 provides cyclic voltammetry measurements (20 mV/sec using 1 M aqueous NaCl electrolyte) for nanostructured platinum electrodes, showing that charging is predominately by double-layer charge injection, which is a non-faradaic process. There are no current peaks due to Faradaic processes and the current at constant voltage scan rate (20 mV/sec) varies little with potential. From plots of current versus potential scan rate in 1 M aqueous NaCl electrolyte), the electrode capacitance is about 14.5 F/g.

Most importantly, it is found that the nanoporous Pt electrode remains charged when disconnected from the power source, removed from the electrolyte, and dried. Indication of this retained charge is provided by reimmersion of the nanoporous Pt electrode in the 1 M NaCl electrolyte, and finding that the electrode potential is substantially unchanged. Initial results indicating this stability are shown in FIG. 7. Just like the case for the carbon nanotube electrode, the potential of the negatively charged electrode is less stable than for the positively charged electrode, as indicated by the results shown in the lower part of this figure.

Since it is possible that some electrolyte is still retained inside the pores of the Pt electrode during the experiment of FIG. 7, this experiment was repeated using much longer time periods after the pellet electrodes have been disconnected from the power source and the electrolyte was removed from the electrochemical cell. The electrode potentials (versus Ag/AgCl) before after this two days exposure of the electrodes to dynamic vacuum pumping were +0.58 V and +0.45 V for the hole-injected electrode and −0.04 V and +0.02 for the electron-injected electrode. The potential between the two electrodes changed from the initial 0.62 V to a final 0.43 V after removal of the electrodes from the electrolyte and applying a dynamic vacuum on these electrodes for two days.

To further evaluate the stability of charge storage, the time period in which the platinum pellets were exposed to dynamic vacuum was extended to a week. After this, the Pt electrodes were reimmersed in the 1 M NaCl electrolyte to determine their charge state by electrochemical potential measurements (naturally, without applying any external potential). High charge storage is again indicated for the positively charged Pt electrode (indicated by retention of a 0.28 V potential, versus Ag/AgCl, compared with the potential immediately before electrolyte removal of 0.33 V). The negatively charged electrode had lower stability, as indicated by a potential change from the initial −0.68 V (before removal of the electrolyte and the week-long process of drying the electrode in dynamic vacuum) to a final potential on initial reimmersion into the electrolyte of −0.32 V.

All patents and publications referenced herein are hereby incorporated by reference. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:

1. A process to provide, retain and employ electronic charge injection to substantially change the properties of an article, the process comprising the steps of:
   (a) providing an article A, wherein the article A is selected from the group consisting of a largely electrolyte-free porous electrode region, at least one particle, and combinations thereof;
   (b) immersing article A into an electrolyte E;
   (c) providing an ion conducting and substantially electronically insulating continuous path between article A and a counter-electrode B;
   (d) applying a potential between article A and the counter electrode B for sufficient time that substantial electronic charge is predominately non-faradaically injected into article A to form a charge-injected article A; and
   (e) substantially removing the electrolyte E from contact with charge-injected article A; wherein
      (i) both the article A and the counter electrode B have an electronically conducting state selected from the group consisting of charged, uncharged, and combinations thereof,
      (ii) the article A has an achievable capacitance for non-faradaic charging of at least about 0.1 F/g, and
      (iii) the article A comprises a substance selected from the group consisting of nanofibers, an aggregate of electronically conducting particles, a direct-lattice photonic crystal that is electronically conducting, an inverse-lattice photonic crystal that is electronically conducting, and combinations thereof.

2. The process of claim 1, wherein the article A comprises nanotubes.

3. The process of claim 2, wherein said nanotubes are overcoated with a second material having an electrical property selected from the group consisting of insulating, semiconducting, conducting, and combinations thereof.

4. The process of claim 2, wherein said nanotubes are at least partially filled with a material selected from the group consisting of a metal, a semiconductor, an insulator, and combinations thereof.

5. The process of claim 2, wherein said nanotubes are configured as a porous sheet or a porous fiber.

6. The process of claim 2, wherein said nanotubes comprise carbon nanotubes.

* * * * *